US012267165B2

(12) United States Patent
Ye et al.

(10) Patent No.: US 12,267,165 B2
(45) Date of Patent: Apr. 1, 2025

(54) POLAR CODING SYSTEMS, PROCEDURES, AND SIGNALING

(71) Applicant: InterDigital Patent Holdings, Inc., Wilmington, DE (US)

(72) Inventors: Chunxuan Ye, San Diego, CA (US); Fengjun Xi, San Diego, CA (US); Sungkwon Hong, Seoul (KR); Kyle Jung-Lin Pan, Saint James, NY (US); Robert L. Olesen, Huntington, NY (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 18/645,817

(22) Filed: Apr. 25, 2024

(65) Prior Publication Data

US 2024/0291591 A1    Aug. 29, 2024

Related U.S. Application Data

(63) Continuation of application No. 18/143,394, filed on May 4, 2023, now Pat. No. 12,028,159, which is a
(Continued)

(51) Int. Cl.
*H04L 1/00* (2006.01)
*H03M 13/00* (2006.01)
(Continued)

(52) U.S. Cl.
CPC .......... *H04L 1/0071* (2013.01); *H03M 13/05* (2013.01); *H03M 13/13* (2013.01); *H03M 13/27* (2013.01);
(Continued)

(58) Field of Classification Search
CPC ... H04L 1/0071; H04L 1/0041; H04L 1/0067; H04L 1/0057; H03M 13/05;
(Continued)

(56) References Cited

U.S. PATENT DOCUMENTS 8,559,552 B2   10/2013  Wang et al.
8,799,735 B2    8/2014  Wu et al.
(Continued)

FOREIGN PATENT DOCUMENTS

CN    102007747 A    4/2011
CN    102122966 A    7/2011
(Continued)

OTHER PUBLICATIONS

Meng, et al., "A Novel Interleaving Scheme for Polar Codes", IEEE 84th Vehicular Technology Conference (VTC-Fall), arXiv:1603.00644v2, Mar. 20, 2016, 5 pages.
(Continued)

*Primary Examiner* — John J Tabone, Jr.
(74) *Attorney, Agent, or Firm* — Flaster Greenberg, P.C.

(57) ABSTRACT

Systems, methods, and instrumentalities are disclosed for interleaving coded bits. A wireless transmit/receive unit (WTRU) may generate a plurality of polar encoded bits using polar encoding. The WTRU may divide the plurality of polar encoded bits into sub-blocks of equal size in a sequential manner. The WTRU may apply sub-block wise interleaving to the sub-blocks using an interleaver pattern. The sub-blocks associated with a subset of the sub-blocks may be interleaved, and sub-blocks associated with another subset of the sub-blocks may not be interleaved. The sub-block wise interleaving may include applying interleaving across the sub-blocks without interleaving bits associated with each of the sub-blocks. The WTRU may concatenate bits from each of the interleaved sub-blocks to generate
(Continued)

interleaved bits, and store the interleaved bits associated with the interleaved sub-blocks in a circular buffer. The WTRU may select a plurality of bits for transmission from the interleaved bits.

18 Claims, 43 Drawing Sheets

Related U.S. Application Data continuation of application No. 17/746,795, filed on May 17, 2022, now Pat. No. 11,683,125, which is a continuation of application No. 17/350,054, filed on Jun. 17, 2021, now abandoned, which is a continuation of application No. 16/494,666, filed as application No. PCT/US2018/023530 on Mar. 21, 2018, now Pat. No. 11,070,317.

(60) Provisional application No. 62/556,104, filed on Sep. 8, 2017, provisional application No. 62/545,615, filed on Aug. 15, 2017, provisional application No. 62/519,700, filed on Jun. 14, 2017, provisional application No. 62/500,887, filed on May 3, 2017, provisional application No. 62/474,875, filed on Mar. 22, 2017.

(51) Int. Cl.
*H03M 13/05* (2006.01)
*H03M 13/13* (2006.01)
*H03M 13/27* (2006.01)
*H03M 13/29* (2006.01)

(52) U.S. Cl.
CPC ... *H03M 13/2778* (2013.01); *H03M 13/2792* (2013.01); *H03M 13/2906* (2013.01); *H03M 13/618* (2013.01); *H03M 13/6306* (2013.01); *H03M 13/6356* (2013.01); *H03M 13/6362* (2013.01); *H03M 13/6368* (2013.01); *H04L 1/0041* (2013.01); *H04L 1/0057* (2013.01); *H04L 1/0067* (2013.01)

(58) Field of Classification Search
CPC .. H03M 13/13; H03M 13/27; H03M 13/2778; H03M 13/2792; H03M 13/2906; H03M 13/618; H03M 13/6306; H03M 13/6356; H03M 13/6362; H03M 13/6368
USPC .......................................... 714/755, 756, 758
See application file for complete search history.

(56) References Cited

U.S. PATENT DOCUMENTS

| | | | |
|---|---|---|---|
| 10,057,098 B2 | 8/2018 | Baek et al. | |
| 10,128,983 B2* | 11/2018 | Robert Safavi | H04B 1/707 |
| 10,171,204 B2* | 1/2019 | Wu | H03M 13/6362 |
| 10,425,111 B2* | 9/2019 | Wu | H03M 13/6362 |
| 10,432,234 B2* | 10/2019 | Wu | H03M 13/618 |
| 10,979,081 B2* | 4/2021 | Wu | H04L 1/0057 |
| 11,012,096 B2 | 5/2021 | Kim et al. | |
| 11,070,317 B2* | 7/2021 | Ye | H03M 13/2906 |
| 11,223,443 B2 | 1/2022 | Jang et al. | |
| 11,683,125 B2* | 6/2023 | Ye | H03M 13/27 714/755 |
| 2008/0301536 A1 | 12/2008 | Shin et al. | |
| 2009/0086849 A1 | 4/2009 | Tsai et al. | |
| 2010/0169722 A1 | 7/2010 | Wu et al. | |
| 2011/0033004 A1 | 2/2011 | Wang et al. | |
| 2015/0003538 A1 | 1/2015 | Baek et al. | |
| 2015/0089321 A1 | 3/2015 | Myung et al. | |
| 2015/0333769 A1 | 11/2015 | Jeong et al. | |
| 2015/0358035 A1* | 12/2015 | Scarpa | H04B 7/1858 714/776 |
| 2016/0079999 A1 | 3/2016 | Shen et al. | |
| 2016/0105201 A1 | 4/2016 | Lee et al. | |
| 2016/0182187 A1 | 6/2016 | Kim et al. | |
| 2017/0005753 A1 | 1/2017 | Shen et al. | |
| 2017/0047947 A1 | 2/2017 | Hong et al. | |
| 2017/0093529 A1* | 3/2017 | Robert Safavi | H04L 1/0071 |
| 2017/0331590 A1* | 11/2017 | Wu | H03M 13/2792 |
| 2018/0026663 A1* | 1/2018 | Wu | H03M 13/618 714/776 |
| 2018/0199317 A1* | 7/2018 | Hwang | H04L 1/0061 |
| 2018/0226995 A1* | 8/2018 | Wu | H03M 13/6356 |
| 2019/0158226 A1* | 5/2019 | Hui | H03M 13/13 |
| 2019/0181983 A1* | 6/2019 | Ye | H04L 1/0058 |
| 2019/0393987 A1* | 12/2019 | Hong | H04L 1/0061 |
| 2020/0014405 A1* | 1/2020 | Wu | H03M 13/13 |
| 2020/0099471 A1* | 3/2020 | Ye | H04L 1/0071 |
| 2021/0242887 A1 | 8/2021 | Kim et al. | |
| 2021/0385016 A1* | 12/2021 | Ye | H03M 13/6356 |
| 2022/0030532 A1* | 1/2022 | Hajir | H04B 7/18513 |

FOREIGN PATENT DOCUMENTS

| | | |
|---|---|---|
| CN | 102187593 A | 9/2011 |
| CN | 104811266 A | 7/2015 |
| CN | 104869087 A | 8/2015 |
| CN | 106165303 A | 11/2016 |
| CN | 106464425 A | 2/2017 |
| EP | 2206262 A1 | 7/2010 |
| EP | 3799314 A1 | 3/2021 |
| JP | 2020524464 A | 8/2020 |
| KR | 20160018804 A | 2/2016 |
| KR | 20170016003 A | 2/2017 |
| WO | WO 2014116041 A1 | 7/2014 |
| WO | WO 2015123842 A1 | 8/2015 |
| WO | WO 2017176309 A1 | 10/2017 |
| WO | WO 2018236114 A1 | 12/2018 |

OTHER PUBLICATIONS

3rd Generation Partnership Project (3GPP), "Rani Chairman's Notes", 3GPP TSG RAN WG1 Meeting #88, Athens, Greece, Feb. 13-17, 2017, 109 pages.

3rd Generation Partnership Project (3GPP), "Rani Chairman's Notes", 3GPP TSG RAN WG1 Meeting NR Ad-Hoc, Spokane, USA, Jan. 16-20, 2017, 60 pages.

3rd Generation Partnership Project (3GPP), "Rani Chairman's Notes", 3GPP TSG RAN WG1 Meeting #90, Prague, Czech Republic, Aug. 21-25, 2017, 143 pages.

3rd Generation Partnership Project (3GPP), R1-1608862, "Polar Code Construction for NR", Huawei, HiSilicon, 3GPP TSG RAN WG1 Meeting #86bis, Lisbon, Portugal, Oct. 10-14, 2016, 8 pages.

3rd Generation Partnership Project (3GPP), R1-1611254, "Details of the Polar Code Design", Huawei, HiSilicon, 3GPP TSG RAN WG1 Meeting #87, Reno, USA, Nov. 10-14, 2016, 15 pages.

3rd Generation Partnership Project (3GPP), R1-1701702, "Construction Schemes for Polar Codes", Huawei, HiSilicon, 3GPP TSG RAN WG1 Meeting #88, Athens, Greece, Feb. 13-17, 2017, 7 pages.

3rd Generation Partnership Project (3GPP), R1-1702646, "Polar Code Information Bit Allocation and Nested Extension Construction", Qualcomm Incorporated, 3GPP TSG-RAN WG1 Meeting #88, Athens, Greece, Feb. 13-17, 2017, pp. 1-13.

3rd Generation Partnership Project (3GPP), R1-1702735, "Polar Code Size and Rate-Matching Design for NR Control Channels", MediaTek Inc., 3GPP TSG RAN WG1 Ran 1 #88 Meeting, Athens, Greece, Feb. 13-17, 2017, 8 pages.

3rd Generation Partnership Project (3GPP), R1-1710750, "Design of Unified Rate-Matching for Polar Codes", Samsung, 3GPP TSG RAN WG1 NR Ad-Hoc#2, Qingdao, P.R. China, Jun. 27-30, 2017, pp. 1-6.

3rd Generation Partnership Project (3GPP), R1-1710752, "Design of Channel Interleaver for Polar Codes", Samsung, 3GPP TSG RAN WG1 NR Ad-Hoc#2, Qingdao, P.R. China, Jun. 27-30, 2017, pp. 1-3.

(56) References Cited

OTHER PUBLICATIONS

3rd Generation Partnership Project (3GPP), R1-1713474, "Design and Evaluation of Interleaver for Polar Codes", Qualcomm Incorporated, 3GPP TSG-RAN RAN1#90, Prague, CZ, Aug. 21-25, 2017, pp. 1-10.

3rd Generation Partnership Project (3GPP), R1-1715000, "Way Forward on Rate-Matching for Polar Code", MediaTek, Qualcomm, Samsung ZTE, 3GPP TSG RAN WG1 Meeting #90, Prague, Czech Republic, Aug. 21-25, 2017, 24 pages.

"The Vienna 5G Link Level Simulator V1.0", Jun. 12, 2017.

Ari Kan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Bai, et al., "Sub-Block Recovery Scheme for Iterative Decoding of Turbo Codes", IEEE, 2005, pp. 1970-1974.

Bioglio, et al., Low-Complexity Puncturing and Shortening of Polar Codes, 2017, IEEE, pp. 1-6. (Year: 2017).

El-Khamy, et al., "Circular Buffer Rate-Matched Polar Codes", arViv: 1702.04080v1, IEEE Transactions on Communications, Feb. 14, 2017, pp. 1-30.

Niu, et al., "CRC-Aided Decoding of Polar Codes", IEEE Communications Letters, vol. 16, No. 10, Oct. 2012, pp. 1668-1671.

Tal, et al., "How to Construct Polar Codes", IEEE Transactions on Information Theory, vol. 59, No. 10, Oct. 2013, pp. 6562-6582.

Tal, et al., "List Decoding of Polar Codes", arXiv:1206.0050v1, May 31, 2012, pp. 1-11.

Trifonov, Peter, "Efficient Design and Decoding of Polar Codes", IEEE Transactions on Communications, vol. 60, No. 11, Nov. 2012, pp. 3221-3227.

Verizon, TS VSG.212 V1 .2, " Verizon SG TF, Air Interface Working Group, Verizon 5th Generation Radio Access, Multiplexing and Channel Coding (Release 1)", Cisco, Ericsson, Intel Corp., LG Electronics, Nokia, Qualcomm Technologies Inc., Samsung Electronics & Verizon, Jun. 2016, pp. 1-59.

Wang, et al., "A Novel Puncturing Scheme for Polar Codes", IEEE Communications Letters, vol. 18, No. 12, Dec. 2014, pp. 2081-2084.

Wang, et al., "Interleaved Concatenations of Polar Codes with BCH and Convolutional Codes", IEEE Journal on Selected Areas in Communications, vol. 34, No. 2, Feb. 2016, pp. 267-277.

El-Khamy, Mostafa, et al., "HARQ Rate-Compatible Polar Codes for Wireless Channels", Institute of Electrical and Electronics Engineers (IEEE), 2015, 6 pages.

* cited by examiner

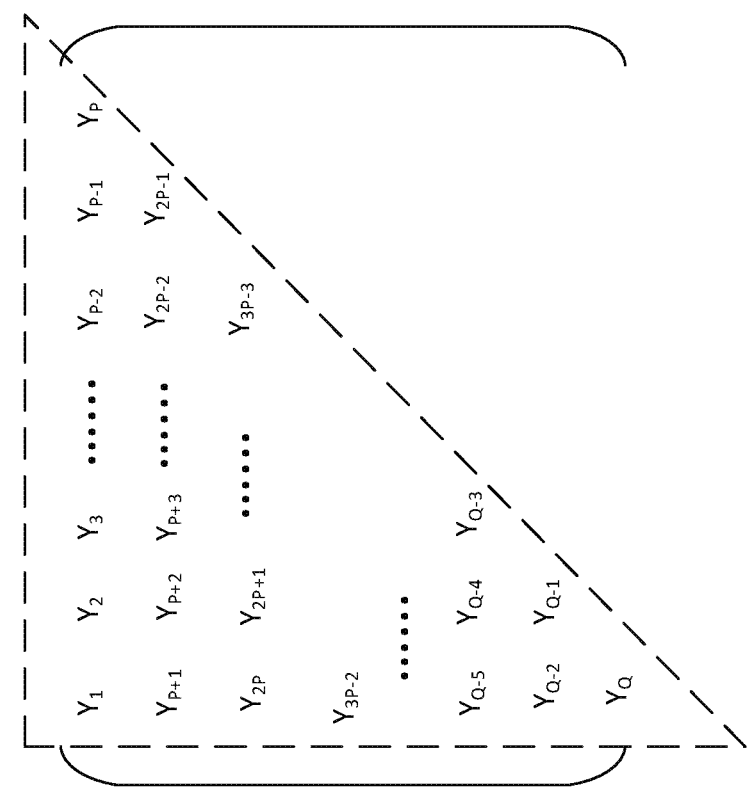

POLAR CODING SYSTEMS, PROCEDURES, AND SIGNALING

CROSS-REFERENCE TO RELATED APPLICATIONS

This application is a continuation of U.S. Non-Provisional application Ser. No. 18/143,394, filed May 4, 2023, which is a continuation of U.S. Non-Provisional application Ser. No. 17/746,795, filed May 17, 2022, which issued as U.S. Pat. No. 11,683,125 on Jun. 20, 2023, which is a continuation of U.S. Non-Provisional application Ser. No. 17/350,054, filed Jun. 17, 2021, now abandoned, which is a continuation of U.S. Non-Provisional application Ser. No. 16/494,666, filed Sep. 16, 2019, which issued as U.S. Pat. No. 11,070,317 on Jul. 20, 2021, which is the National Stage entry under 35 U.S.C. § 371 of Patent Cooperation Treaty Application PCT/US2018/023530, filed Mar. 21, 2018, which claims the benefit of U.S. Provisional Patent Application Nos. 62/474,875, filed Mar. 22, 2017, 62/500,887 filed May 3, 2017, 62/519,700 filed Jun. 14, 2017, 62/545,615 filed Aug. 15, 2017, and 62/556,104 filed Sep. 8, 2017, the entire contents of which are incorporated by reference.

BACKGROUND

Mobile communications continue to evolve. A fifth generation of mobile communications technologies may be referred to as 5G. A 5G mobile wireless communication system may implement a variety of radio access technologies (RATs), including New Radio (NR). Use cases for NR may include, for example, extreme Mobile Broadband (eMBB), Ultra High Reliability and Low Latency Communications (URLLC), and massive Machine Type Communications (mMTC). Existing coding schemes and processing of encoded bits used for transmission of control information and/or data may be supplemented by new coding schemes and processing mechanisms of coded bits.

SUMMARY

Systems, methods, and instrumentalities are disclosed for interleaving polar encoded bits as part of rate matching. A wireless transmit/receive unit (WTRU) may generate a plurality of polar encoded bits using polar encoding. The plurality of polar encoded bits may be generated using a mother code length. The WTRU may divide the plurality of polar encoded bits into sub-blocks of equal size. The polar encoded bits may be divided into sub-blocks in a sequential manner. The size of each of the sub-blocks may be a ratio of the mother code length and a number of the sub-blocks. The WTRU may apply sub-block wise interleaving to the sub-blocks using an interleaver pattern. The interleaver pattern may be given by $d_1( )$ in the following equation:

$$I_s(i) = B \cdot d_1\left(\frac{i}{B}\right) + d_2(\mathrm{mod}(i, B)).$$

Sub-blocks associated with a subset of the sub-blocks may be interleaved, and sub-blocks associated with another subset of the sub-blocks may not be interleaved. The sub-block wise interleaving may include applying interleaving across the sub-blocks without interleaving bits associated with each of the sub-blocks. For example, the groups of bits or sub-blocks may be interleaved, while the bits within a sub-block may not be interleaved. The subset of sub-blocks that are interleaved and the subset of sub-blocks that are not interleaved may be consecutive and non-overlapping.

The WTRU may concatenate bits from each of the interleaved sub-blocks to generate interleaved bits. For example, the concatenated bits may be formed from the sub-blocks that are interleaved, while the bits within each of the sub-blocks are not interleaved. The bits associated with each of the interleaved sub-blocks may be sequentially concatenated. The WTRU may store the interleaved bits associated with the interleaved sub-blocks in a circular buffer. The WTRU may select a plurality of bits (e.g., a contiguous plurality of bits) for transmission from the interleaved bits. The plurality of bits may be may be contiguously stored in the circular buffer. The plurality of bits may be selected based on a rate matching scheme. The rate matching scheme may be determined based on a mother code length, a rate matching output size, and a code rate. The rate matching scheme may be one of a repetition scheme, a puncturing scheme, or a shortening scheme. For example, the rate matching scheme may be a repetition scheme, e.g., when rate matching output size is greater than the mother code length. The rate matching scheme may be a shortening scheme or a puncturing scheme, when rate matching output size is less than the mother code length. Selection between the shortening scheme and the puncturing scheme may be based on a code rate.

A first subset of sub-blocks that are interleaved may include the middle sub-blocks of the number of sub-blocks, and wherein a second subset of sub-blocks that are not interleaved may be an even number of sub-blocks. The second subset of sub-blocks comprises an equal number of sub-blocks on each side of the first subset of sub-blocks. A third subset of sub-blocks that is interleaved may be adjacent to the second subset of sub-blocks. A fourth subset of sub-blocks that is not interleaved may include sub-blocks other than the first subset of sub-blocks, the second subset of sub-blocks, and the third subset of sub-blocks. The fourth subset of sub-blocks may be adjacent to the third subset of sub-blocks.

BRIEF DESCRIPTION OF THE DRAWINGS

FIG. 49 illustrates an exemplary triangular interleaver.

FIG. 50 illustrates an exemplary triangular interleaver.

DETAILED DESCRIPTION

A detailed description of illustrative examples will now be described with reference to the various figures. Although this description provides a detailed example of possible implementations, it should be noted that the details are intended to be exemplary and in no way limit the scope of the application.

Figure 1A:
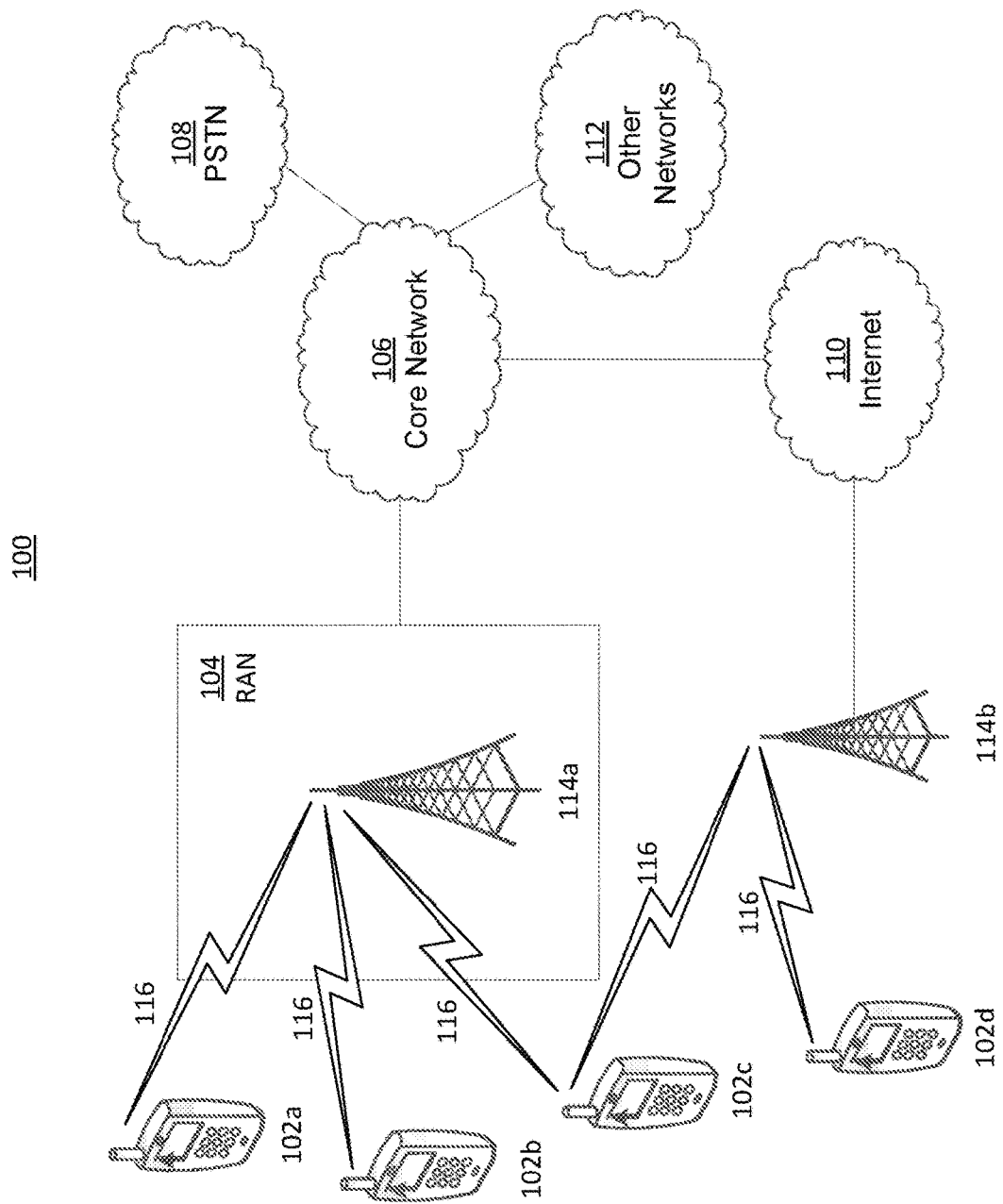
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX), CDMA2000, CDMA2000 1X, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QOS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
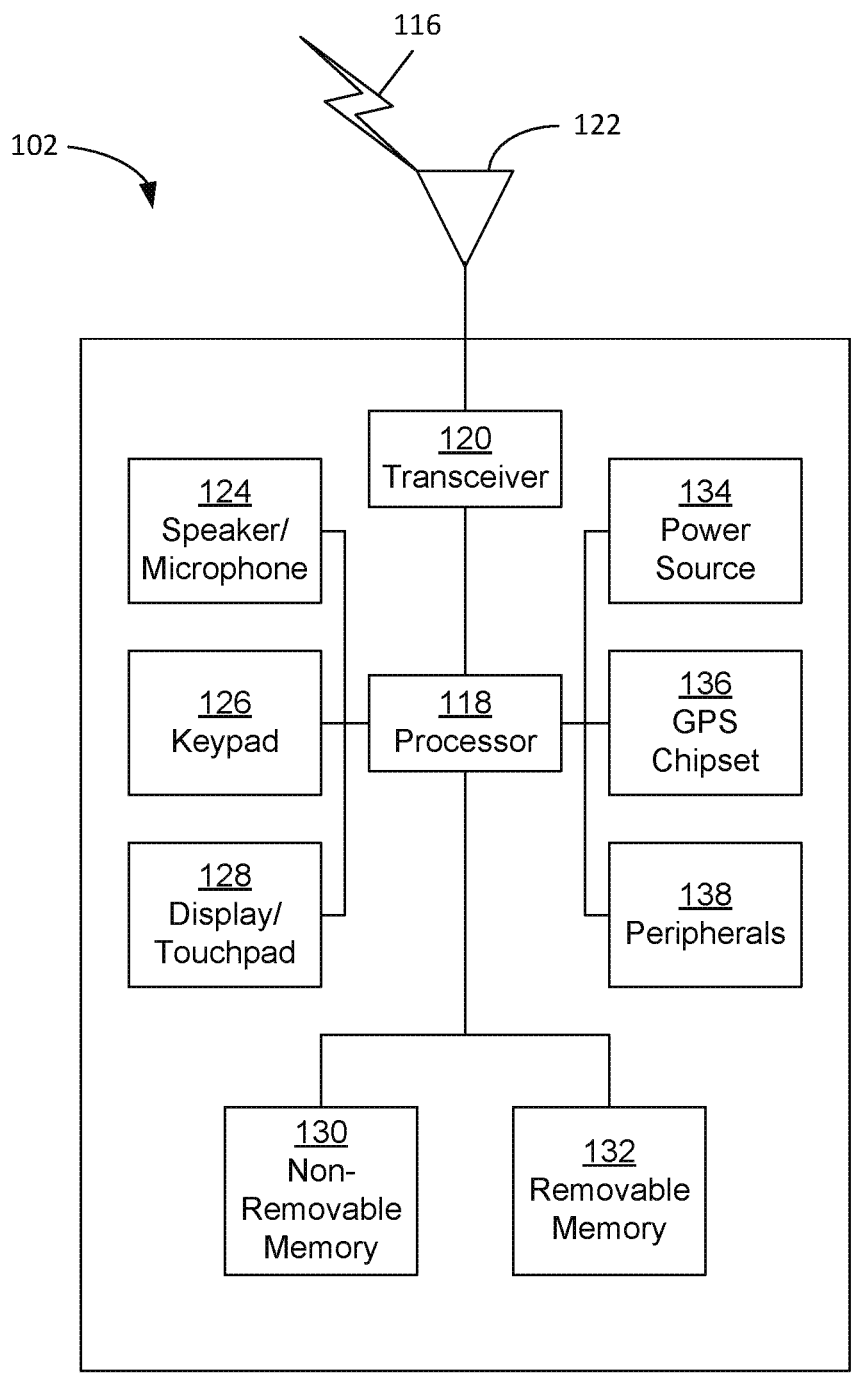
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all signals (e.g., associated with subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
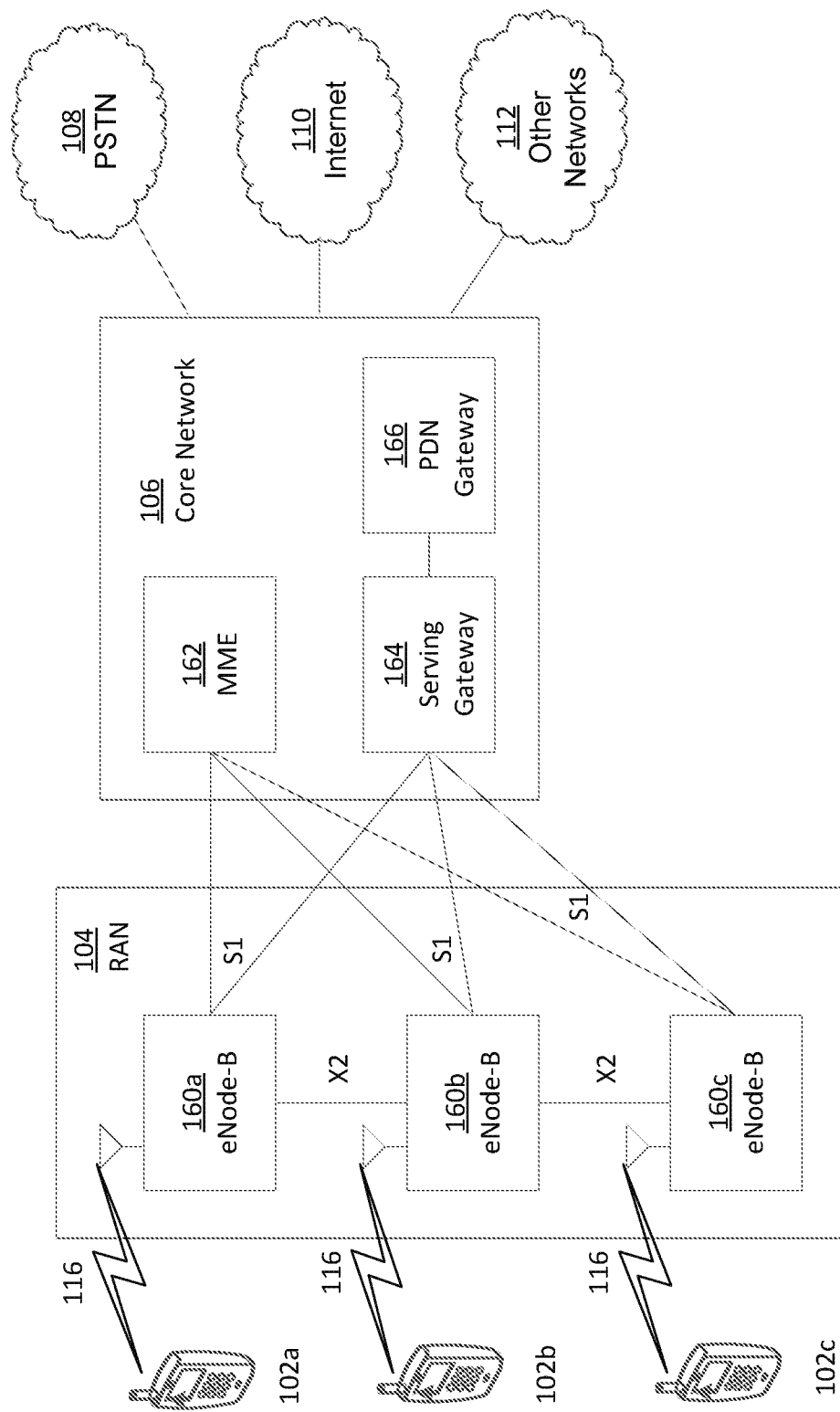
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHZ, and/or 160 MHz wide channels. The 40 MHZ, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHZ, 10 MHz and 20 MHz bandwidths in the TV White Space (TVWS) spectrum, and 802.11ah supports 1 MHZ, 2 MHZ, 4 MHZ, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHZ, 4 MHZ, 8 MHZ, 16 MHZ, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
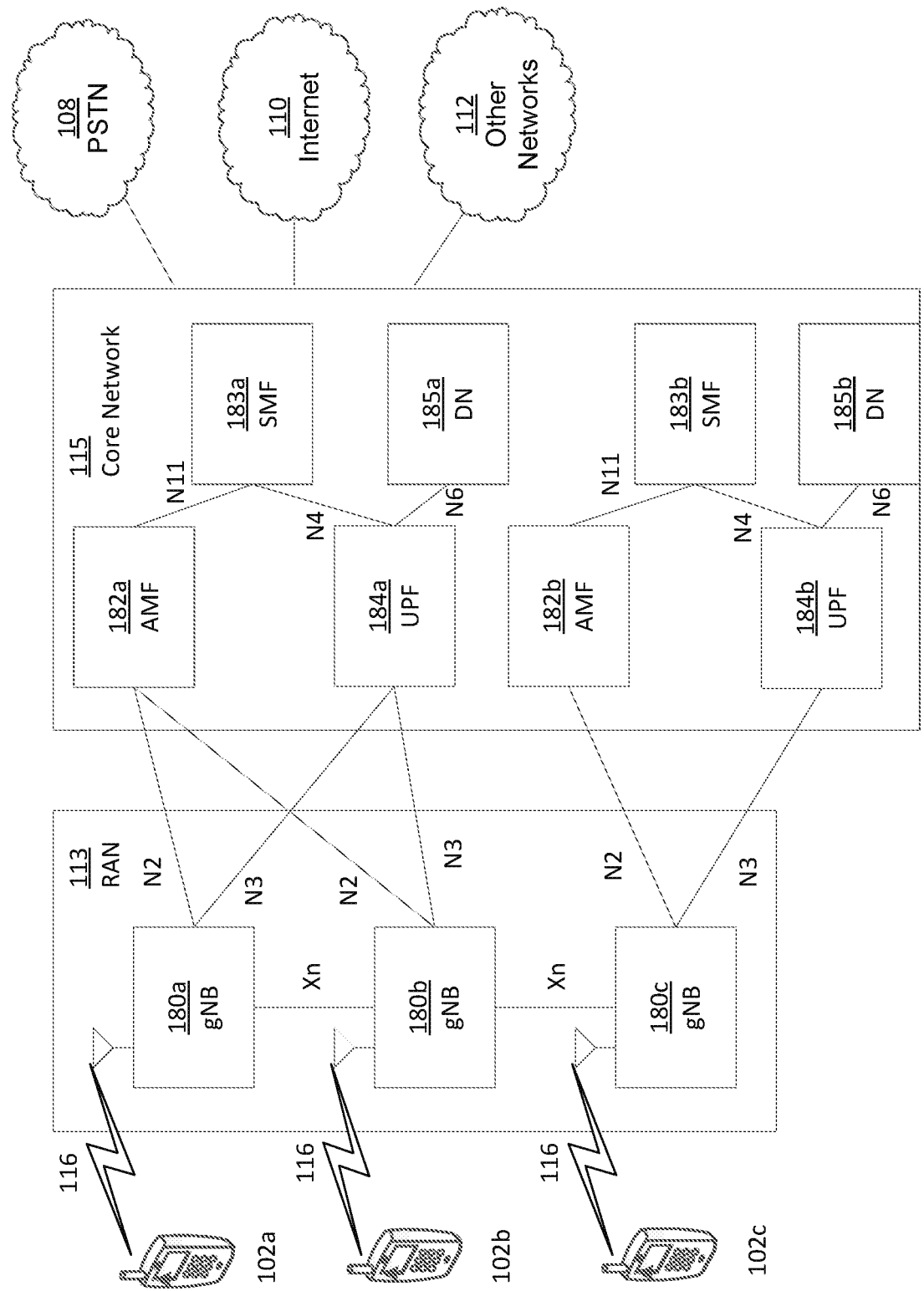
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a, 184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

One or more of the features disclosed herein may be implemented using one or more of the devices, methods, and/or systems described in FIGS. 1A-1D.

Capacity achieving codes other than Turbo codes and/or low-density parity check (LDPC) codes may include polar codes. Polar codes may be linear block codes with attributes including one or more of the following: low encoding and/or decoding complexity, a low error floor (e.g., very low error floor), or explicit construction schemes.

Polar code (N, K) may be based on an information block length K, and a coded block length N. The value N may be set as a power of 2, e.g., $N=2^n$ for an integer n. The generator matrix of a polar code may be expressed by $G_N=B_N F^{\otimes n}$, where $B_N$ is the bit-reversal permutation matrix, $(.)^{\otimes n}$ denotes the n-th Kronecker power and $$F = \begin{bmatrix} 1 & 0 \\ 1 & 1 \end{bmatrix}.$$

Figure 2:
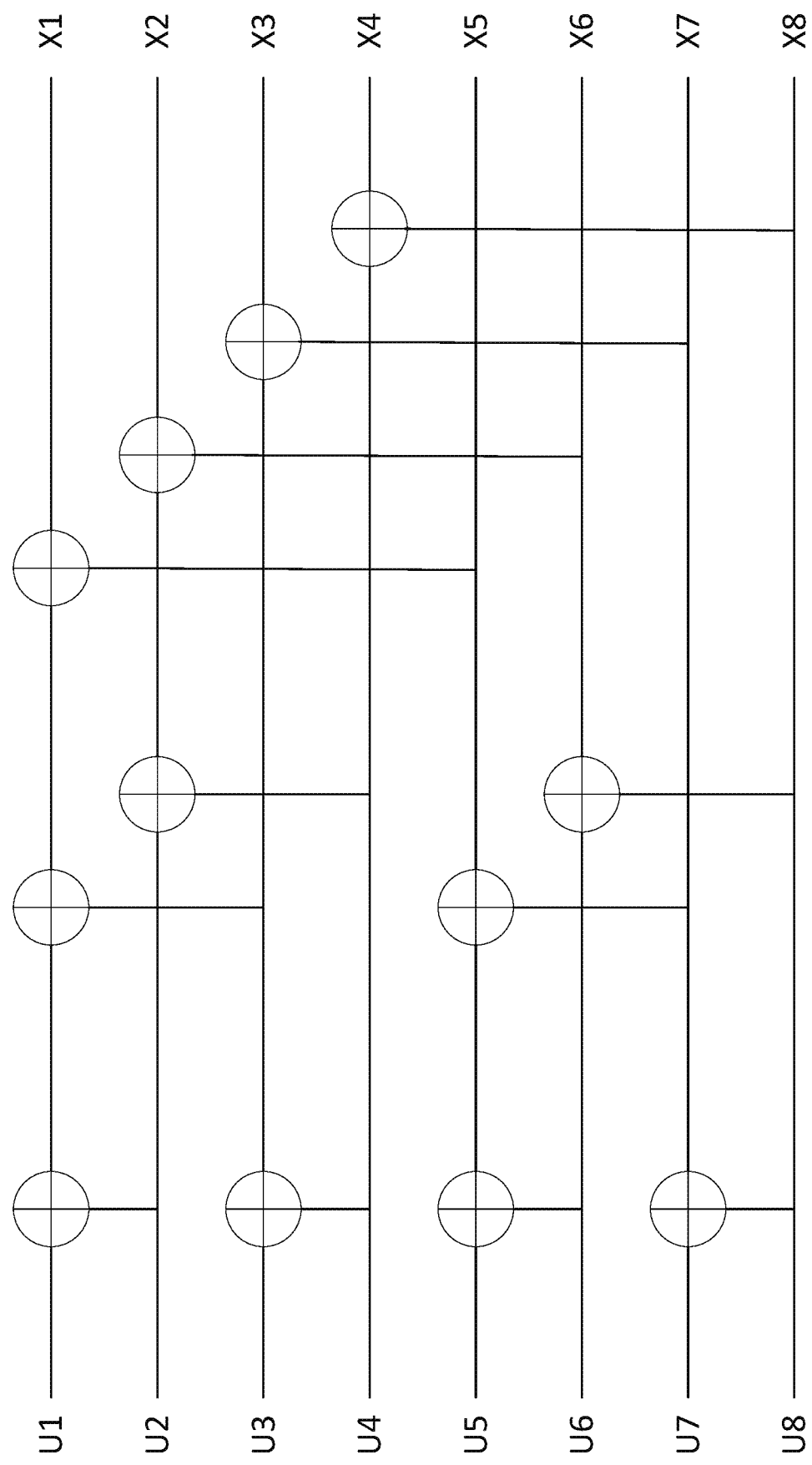
FIG. 2 illustrates an exemplary polar encoder.

In example implementations of polar codes, the bit-reversal permutation matrix $B_N$ may be ignored at the encoder side for simplicity and the bit-reversal operation may be performed at the decoder side. FIG. 2 is an example of polar encoder with N=8. FIG. 2 shows an example implementation of $F^{\otimes 3}$. The codeword of polar code may be given by $x_1^N = u_1^N G_N$.

With respect to decoding of polar encoded bits, successive cancellation (SC) decoding may be used. Advanced decoding schemes may also be used based on SC decoding, e.g., successive cancellation list (SCL) decoding or CRC-Aided SCL (CA-SCL) decoding.

A CRC-Aided (CA) polar code may be a polar code with CRC-Aided Successive Cancellation List (SCL) decoder. In CRC-aided decoding, the CRC bits may be used to select the final codeword from a list of candidate codewords. The final codeword may be selected at the end of the decoding. The CRC bits may be designed and used for error correction purpose, e.g., instead of error detection purpose. The CRC bits may be used for partial error detection.

Code construction(s) for polar codes may be provided. Polar codes may be structured in terms of encoding and decoding. The design of a polar code may depend on the mapping of the K information bits to the N input bits of the polar encoder $u_1^N$. The K information bits may be put on K bit channels, e.g., the K best bit channels. The remaining N−K input bits that are not mapped to the information bits may be called frozen bits. The frozen bits may have a fixed value, e.g., the frozen bits may be set to a value 0. The set of the positions for frozen bits may be called frozen set $\mathcal{F}$. The decision on the best bit channels may vary, and may depend on the channel conditions. In determining the set of frozen channels, the bit channels may be ranked based on their reliabilities. The reliable bit channels may be categorized as good bit channels and the less reliable bit channels may be categorized as bad bit channels.

The reliability of a bit channel may be calculated. For instance, one or more of the following may be used to calculate the reliabilities of bit channels: the Bhattacharyya bounds, the Monte-Carlo estimation, the full transition probability matrices estimation, or the Gaussian approximation. These schemes may have different computation complexity and may apply to different channel conditions. A parameter design signal-to noise ratio (SNR) may be selected. For example, a design SNR may be selected before performing the calculation of reliabilities.

Figure 3:
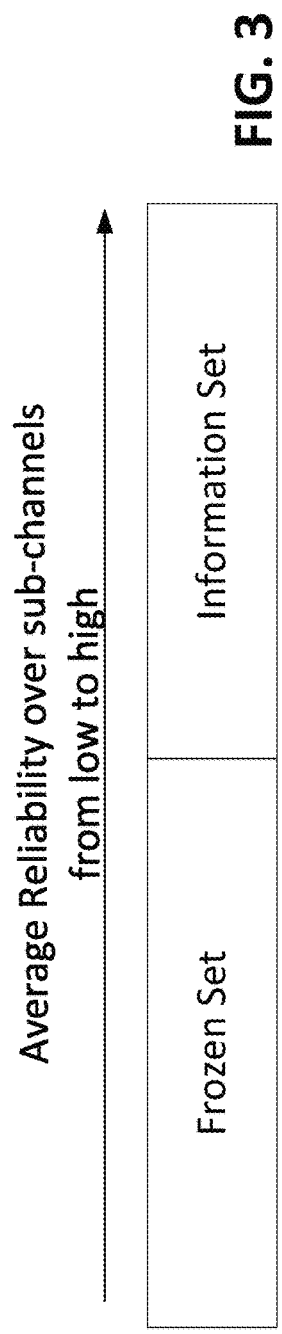
FIG. 3 illustrates an exemplary polar coding.

The rank of a bit channel may be calculated. The rank of a bit channel may be calculated without using the design SNR parameter. For example, the rank sequence generated from a formula or expanded from a small sequence. Once the rank of the bit channels is determined, the information bits may be mapped to bit channels with high reliability. The frozen bits may be mapped to the bit channels with low reliability, as illustrated in FIG. 3.

Figure 4:
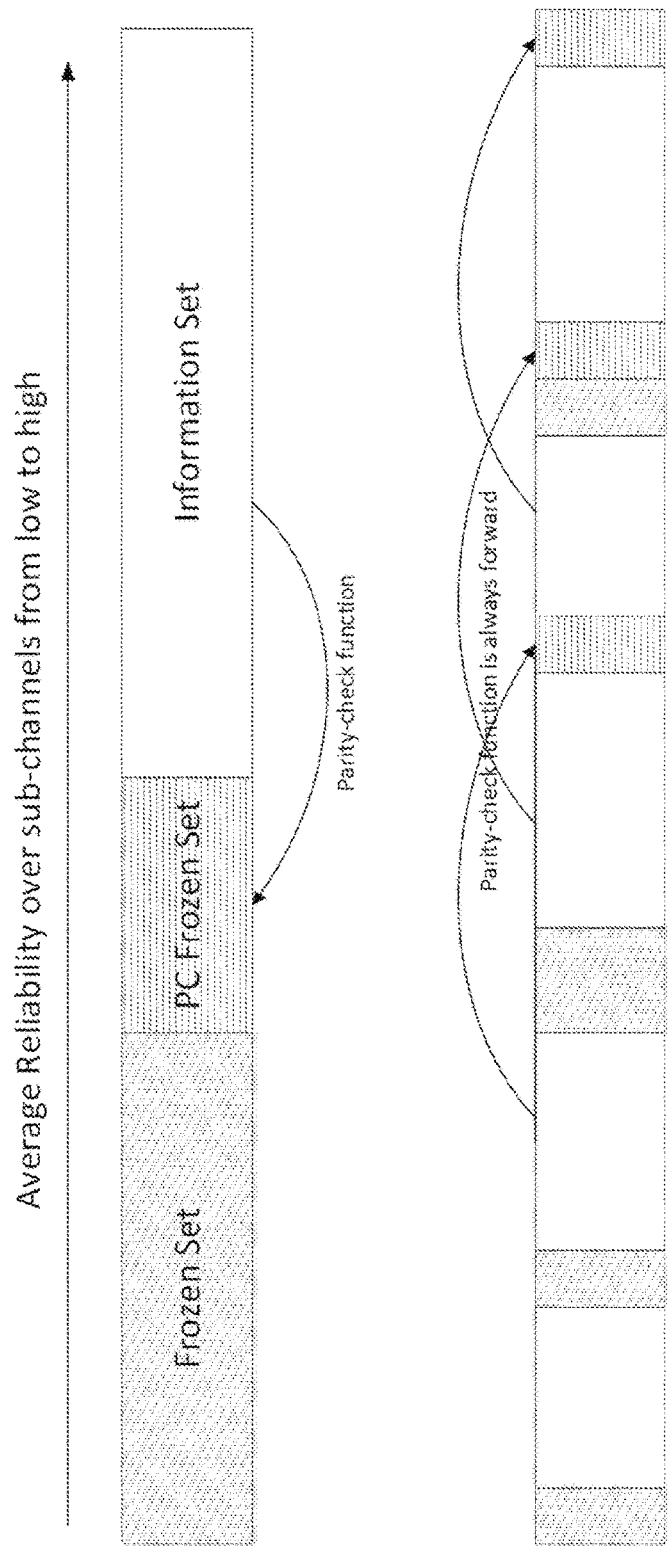
FIG. 4 illustrates an exemplary of a parity check (PC) polar coding.

FIG. 4 illustrates an exemplary parity check (PC) polar coding. A difference between a PC-polar code and a non-PC polar code may be selection of a subset of a frozen sub-channel as PC-frozen sub-channels. A PC function may be established for error correction over sub-channels. In an example (e.g., at each parity check sub-channel position), each of the decoded bits involved in a PC function over a PC-frozen sub-channel may help prune a list decoding tree. In an example, paths that meet a PC-function may survive; the rest may be eliminated on the fly. A PC function may be established as forward-only, for example, to be consistent with a successive cancellation-based decoder. FIG. 4 illustrates an example of mapping information bits to the inputs of the PC polar code.

The introduction of the PC polar code may allow removal of the CRC bits of CA polar codes. The PC polar code may be used for error correction purpose in CRC-aided Successive Cancellation List (SCL) decoding. This may reduce the overhead of polar code, and may result in more coding gains.

Polar codes may be used as channel codes for uplink (UL) and/or downlink (DL) control information. The CRC bits may be used for a control message to reduce a false alarm rate. Polar codes for physical channels may support one of CRC+basic polar codes or J bits error detection CRC+ concatenated polar codes. The CRC+basic polar codes (e.g., CA polar) may be used with longer CRC, e.g., (J+J') bits CRC and/or distributed CRC, e.g., J bits CRC. Concatenated polar codes may be one or more of the following: J' bits CRC+basic polar, J' bits distributed CRC+basic polar, PC polar, or hashed sequence PC polar. A coding scheme may be implemented that may achieve benefit(s) of both mechanisms.

A polar coding design for control and/or data information may be provided. Unlike tail-biting convolutional code (TBCC), polar code, which is a block code, may have a fixed block length. Rate matching for polar code may be designed to improve performance. A rate matching selection may be performed using one or more of repetition, puncturing, and/or shortening mechanisms. Selection of the rate matching mechanism may be performed based on one or more parameters as described herein.

Polar code designs may include a code construction selection (e.g., CRC-aided (CA) polar coding or parity check (PC) polar coding) and/or a code sequence selection. A flexible polar coding scheme that supports multiple polar codes may be provided.

Figure 5:
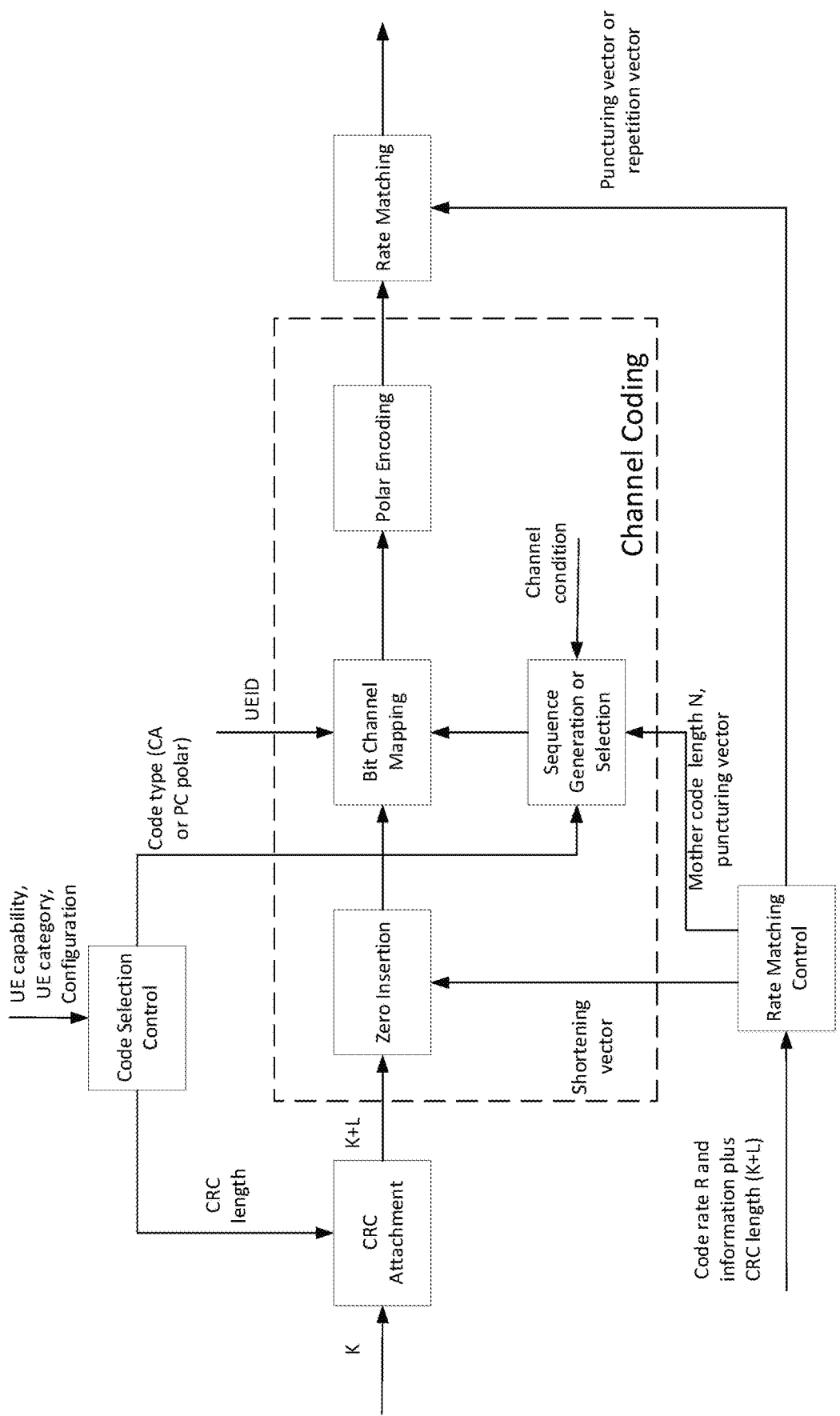
FIG. 5 illustrates an example of processing for control information using polar coding.

Polar encoding for control channels may be provided. FIG. 5 illustrates an exemplary processing of control information (e.g., downlink control information (DCI) or uplink control information (UCI)), using polar codes. Control blocks in the polar encoding sub-system may include a code selection control block and a rate matching control block.

The code selection control block may determine the type of polar code to use. The code selection control block may determine the associated CRC length. Example polar code types may include the polar code types described herein and/or their variations such as advanced PC polar code with CA list selection. A determination of the polar code types may be based on one or more of a WTRU category, a WTRU capability, or configurations. In examples, a WTRU category may correspond to a polar code. In examples, the polar code type may be configured via a radio resource control (RRC) connection establishment message or an RRC connection reconfiguration message. In examples, the polar code type may be pre-defined. The corresponding CRC length may be determined. For example, the CRC length may be determined based on the determined polar code type. For example, for PC polar code, a 16-bits CRC may be used; for CA polar code with a long CRC, a 19-bits CRC may be used, for example, if the length of the list is equal to 8. The code selection control block may send the CRC length information to the CRC attachment block. The CRC attachment block may pass the polar code type to the channel coding block.

The rate matching control block of FIG. 5 may perform one or more of the following: calculate the desired codeword length (e.g., the number of coded bits for transmission) as $$\frac{K+J}{R}$$

bits; calculate the mother code length N (e.g., after calculating the desired codeword length); determine the rate matching scheme(s) to be used; or determine the detailed rate matching scheme(s). The rate matching control block may perform the calculation or make the determination based on one or more of the following uplink control information (UCI) or downlink control information (DCI) block size K, CRC length J, or code rate R.

In an example, for calculating the mother code length N, the mother code length N may be assumed to be a power of 2 due to the polar code nature. The mother code length N may be greater or smaller than the desired codeword length $$\frac{K+J}{R}.$$

For example, if the desired codeword length is slightly larger than $2^n$ bits, for some integer n, then the mother code length may be $2^n$, rather than $2^{n+1}$. The selection of mother code length may be based on one or more formulas. In an example, $$N = 2^n, \text{ if } 2^n \leq \frac{K+J}{R} \leq 2^n(1+\tau);$$

-continued $$N = 2^{n+1}, \text{ if } 2^n(1+\tau) < \frac{K+J}{R} \le 2^{n+1},$$

for some constant fraction number τ, say ⅛.
In an example, $$N = 2^n, \text{ if } 2^n \le \frac{K+J}{R} \le 2^n + \tau;$$

$$N = 2^{n+1}, \text{ if } 2^n + \tau < \frac{K+J}{R} \le 2^{n+1},$$

for some constant integer τ, such as 10. Other example formulas may be similar as above, with the value τ being a function of n. For example, for $$n \le 5, \tau = 0; \text{ else } \tau = \frac{9}{8} \cdot 2^n,$$

and for $$n \le 6, \tau = 0; \text{ else } \tau = \frac{9}{8} \cdot 2^n.$$

The mother code length formulas may or may not depend on code rate. The formula and its parameter t may be different for different code rates or code rate ranges.

The selection of mother code length may be based on one or more look-up tables. Table 1 illustrates an example of a look-up table (LUT) for selecting a the desired codeword length for a corresponding mother code length N. The first row of Table 1 represents a range of desired codeword length, and the second row represents the corresponding mother code length. For example, if the desired codeword length is 50 bits, which is in the range of [33, 70], the mother code length may be selected as 64 bits. If the desired codeword length is 275 bits, which is in the range of [141, 280], the selected mother code length may be 256 bits. In exemplary Table 1, the maximum mother code length is fixed as 1024 bits.

TABLE 1

| $\frac{K+J}{R}$ | [20, 32] | [33, 70] | [71, 140] | [141, 280] | [281, 550] | >550 |
|---|---|---|---|---|---|---|
| N | 32 | 64 | 128 | 256 | 512 | 1024 |

Table 2 illustrates another example of a LUT where the maximum mother code length may be of 512 bits.

TABLE 2

| $\frac{K+J}{R}$ | [20, 32] | [33, 70] | [71, 140] | [141, 280] | >281 |
|---|---|---|---|---|---|
| N | 32 | 64 | 128 | 256 | 512 |

A determination of a mother code length may depend on a code rate. In an example, where a coding rate may be high (e.g., >½), a desired codeword length may be small (or slightly larger than) a length of information bits. A mother code length may be selected to be relatively larger so that use of such mother code length may include more information than what may be included, for example, at rate=½.

The exemplary Table 1 and Table 2 may be applicable to certain code rates, for example, when a mother code length depends on a code rate. For example, if a code rate is larger than a threshold (e.g., ½), a mother code length N may be a power of 2. The mother code length may be greater than a desired codeword length. If a code rate is less than a threshold, a mother code length N may be determined based on one or more look-up tables, such as the Table 1 and/or Table 2. IA mother code length selection may depend on a modulation order. For example, Table 1 and Table 2 might be used for low order modulations (e.g., QPSK). A different set of tables might be defined for high order modulations (e.g., 64 QAM).

FIG. 37, FIG. 38, FIG. 39, and FIG. 40 illustrate a minimum SNR that may be needed to achieve a target BLER level of $10^{-3}$ for code rates ⅕, ⅓, ⅖ and ½, respectively. These exemplary simulation results illustrate that where a code rate may be less than or equal to ⅖ and a coded block length may be between $2^n$ and $2^n (1+⅛)$, a repetition scheme may be selected. For example, if $$\frac{K+J}{R}$$

is between $2^n$ and $2^n (1+⅛)$ and a code rate is less than ⅖, then a mother code length N may be selected as $2^n$, e.g., rather than $2^{n+1}$.

Other performance simulations of a split-natural puncturing example, a split-natural shortening example, and a bit-reversal shortening example may provide results as set forth herein. In such simulations, QPSK modulation and AWGN channel may be assumed. In such simulations, a polar code with PW sequence and a CA-SCL (L=8) decoding algorithm may be used. A 19-bit CRC may be appended to source data. Such CRC bits may be considered as part of the information bits.

The rate matching control block may determine the rate matching scheme that may be used. Rate matching schemes may include one or more of the following: repetition, shortening, or puncturing. Selection of a rate matching scheme of repetition may depend on the relation between the mother code length and the desired codeword length. For example, if the mother code length is smaller than the desired codeword length, the repetition scheme may be selected. Otherwise, the shortening scheme or the puncturing scheme may be selected. The selection between shortening scheme and puncturing scheme may depend on at least one of the code rate, R or the mother code rate, $$R_m = \frac{K}{N}.$$

Puncturing schemes may perform well, and therefore may be used, at a low code rate or a low mother code rate. Shortening schemes may perform well, and therefore may be used, at a high code rate or a high mother code rate. A function of $f(R_m, R)$ may be used. If $f(R_m, R)<Thr$, then puncturing scheme may be selected, otherwise, shortening scheme may be selected.

Figure 41:
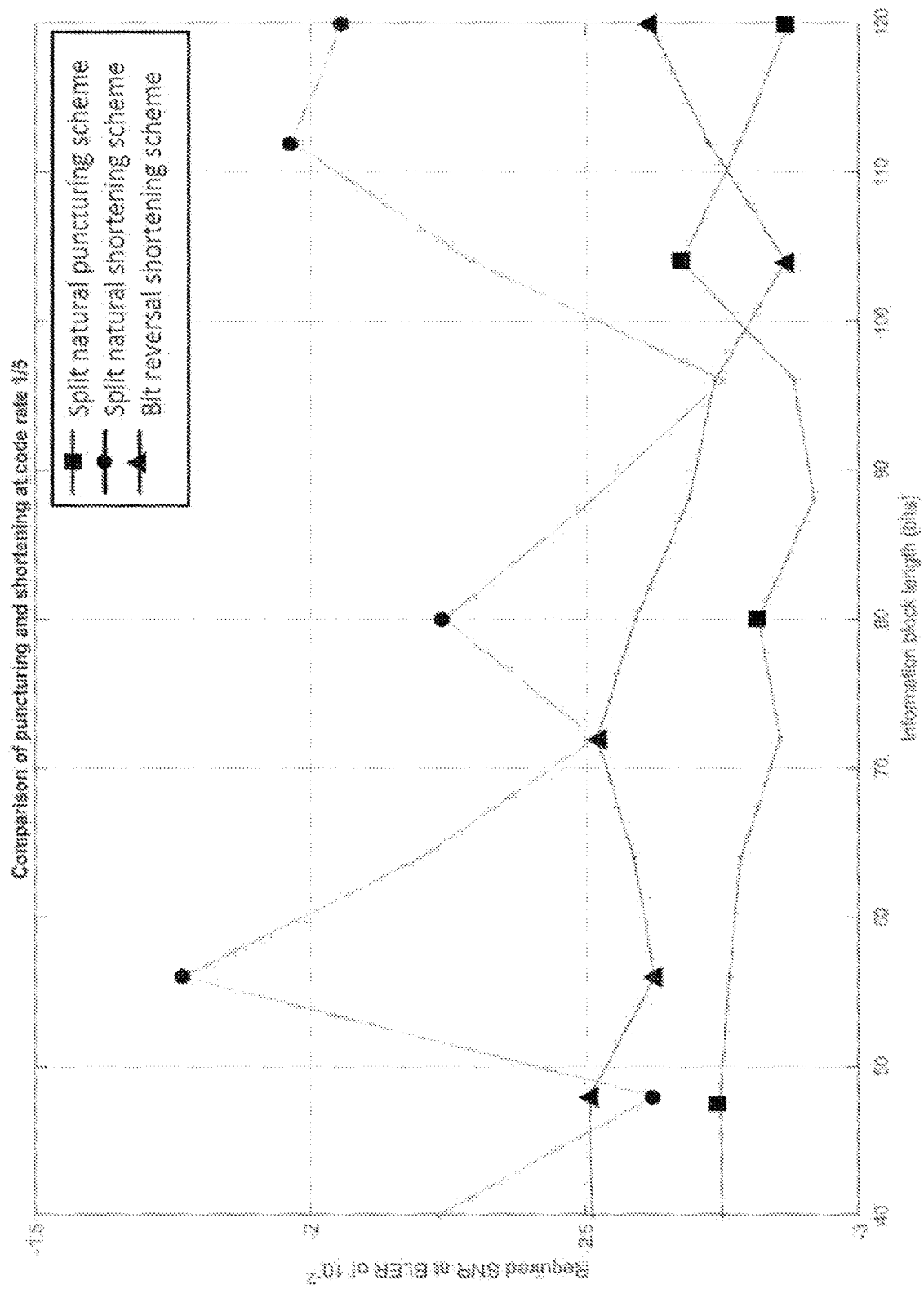
Figure 42:
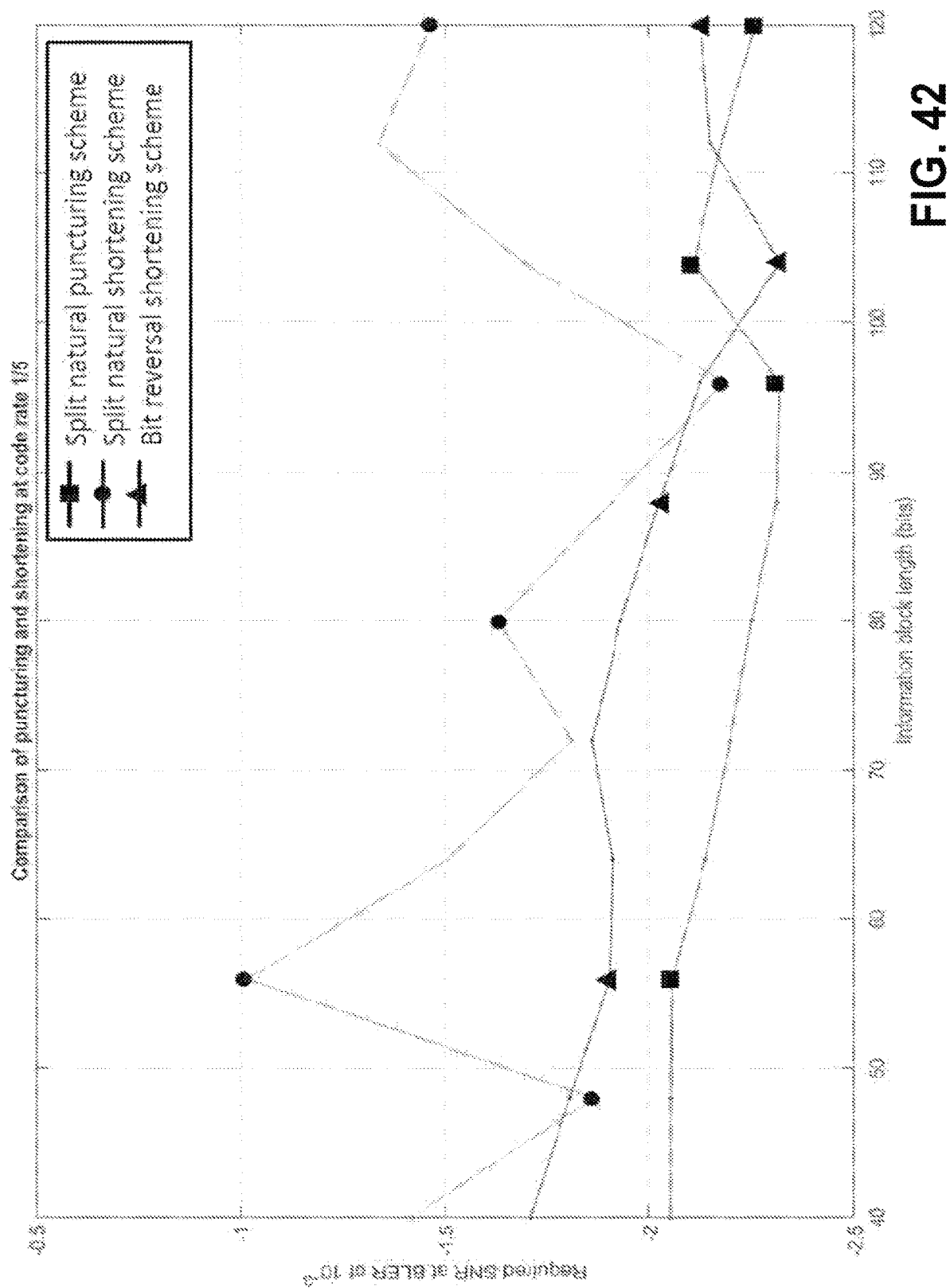
Figure 43:
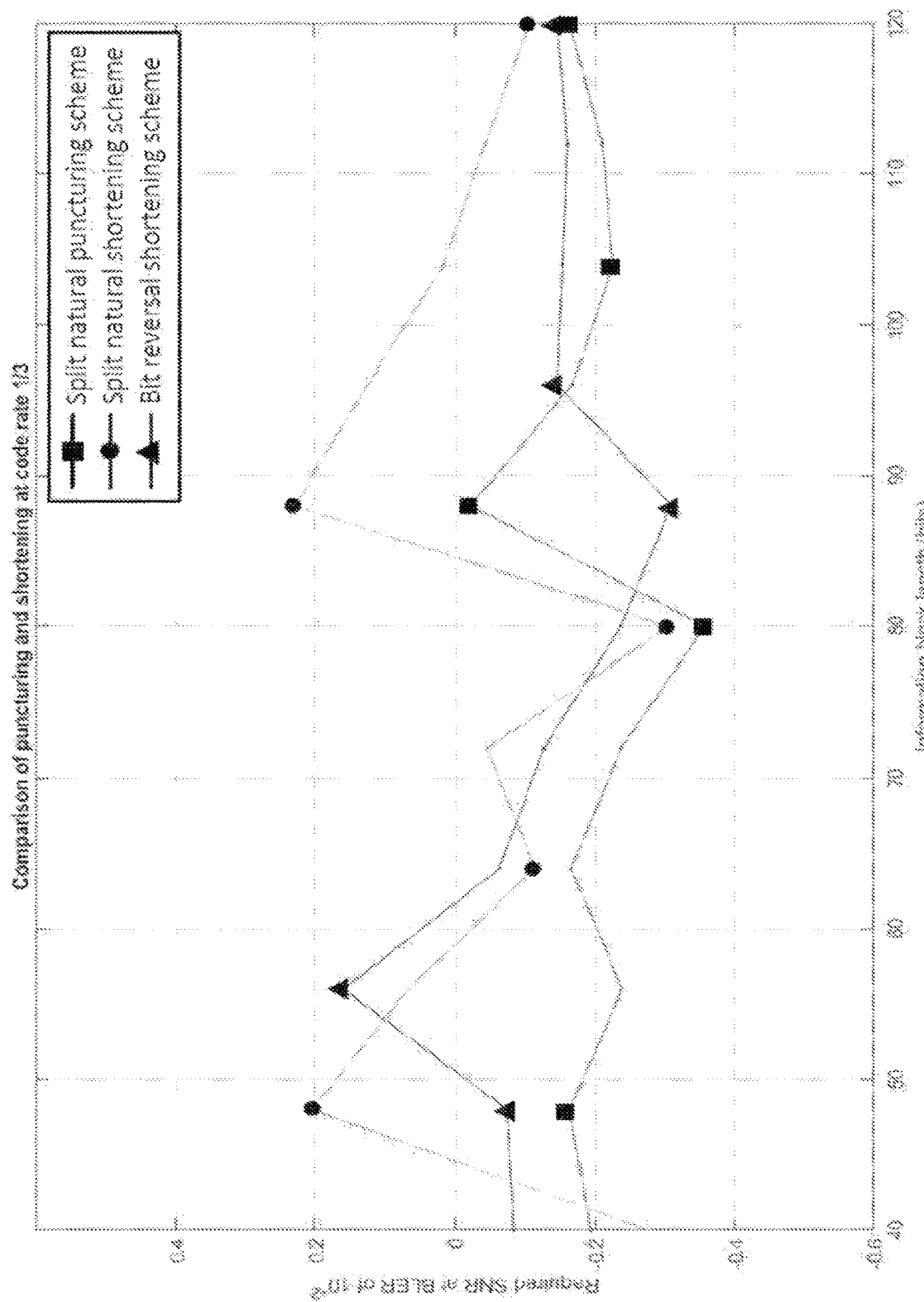
Figure 44:
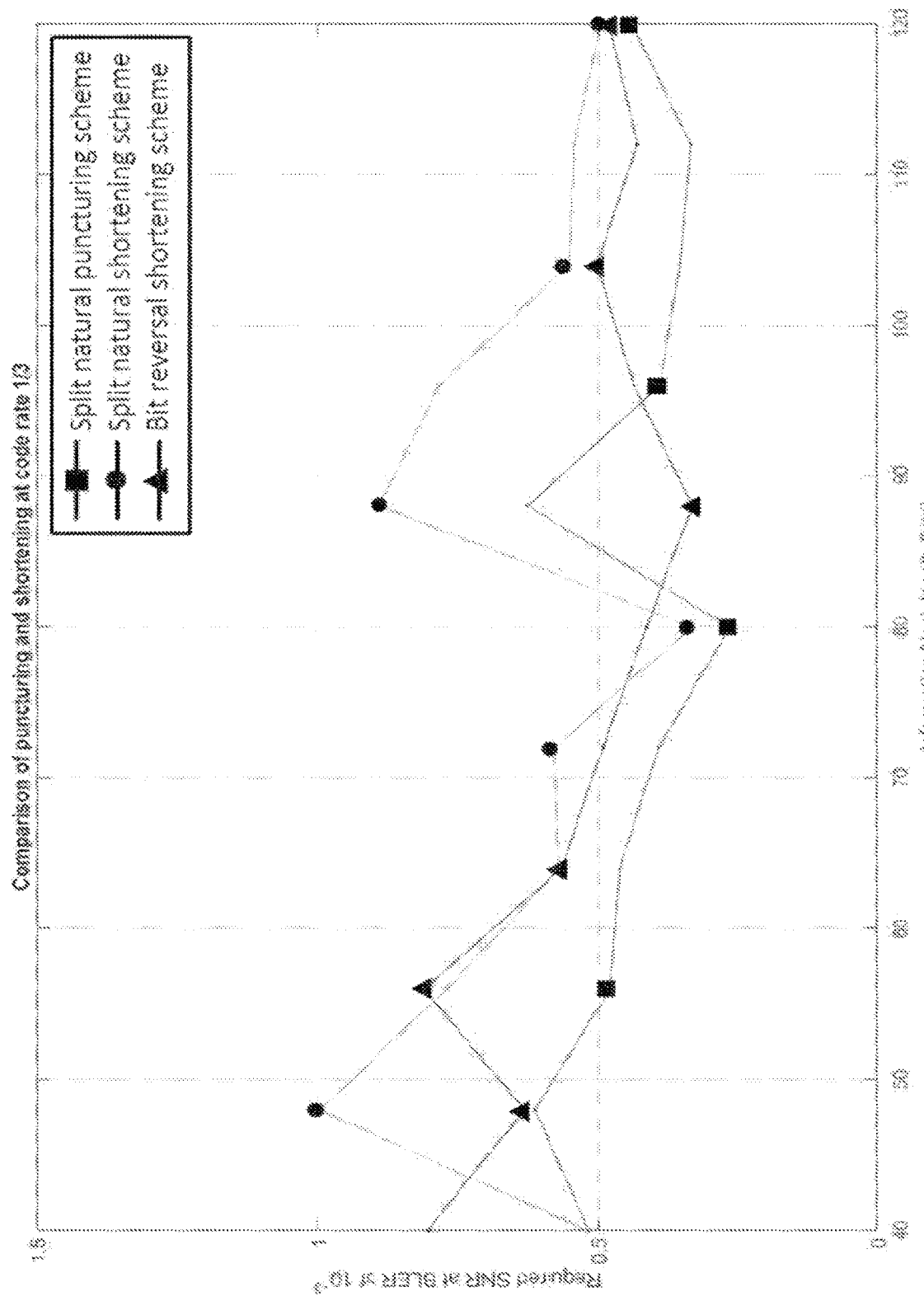
Figure 45:
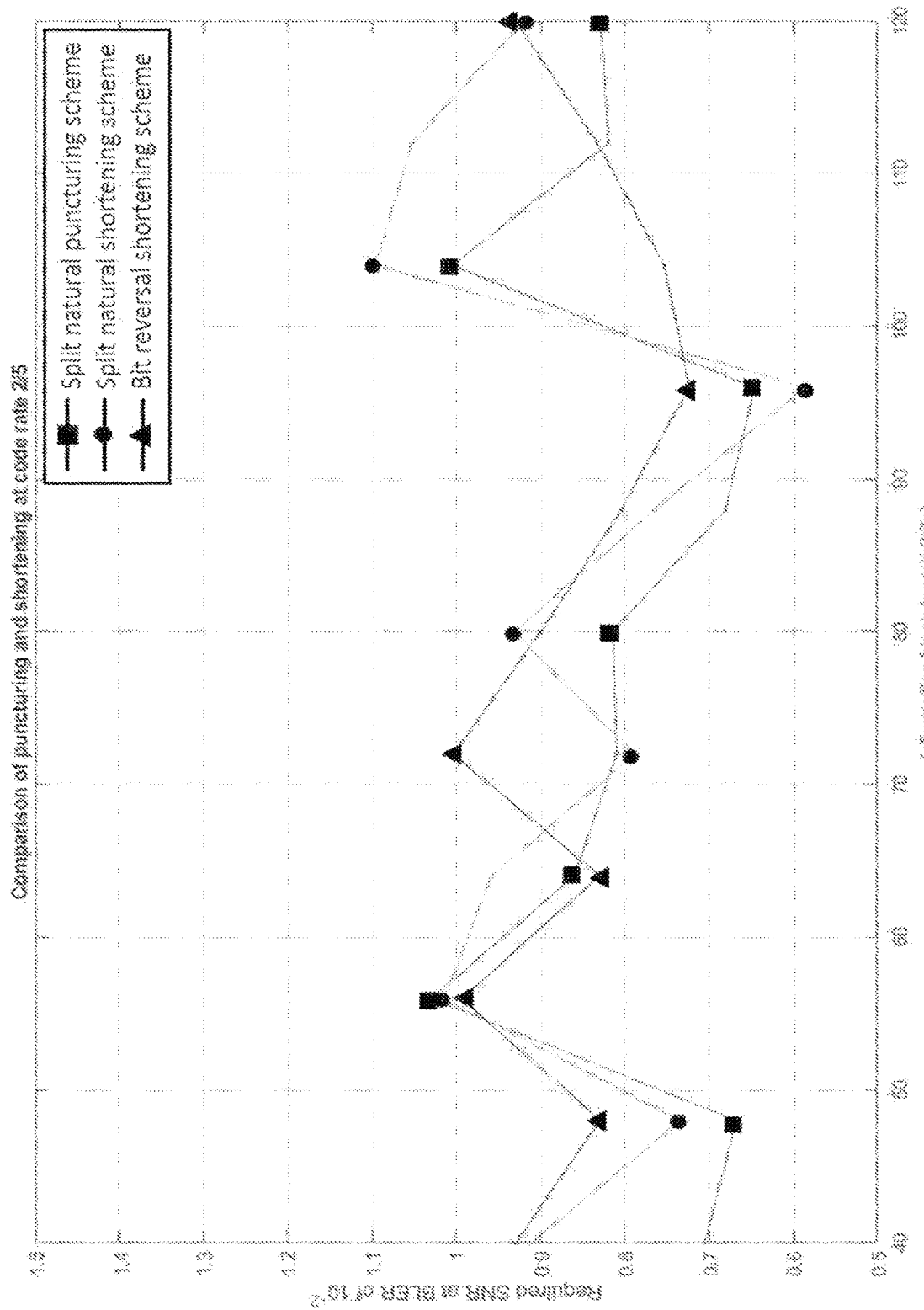
Figure 46:
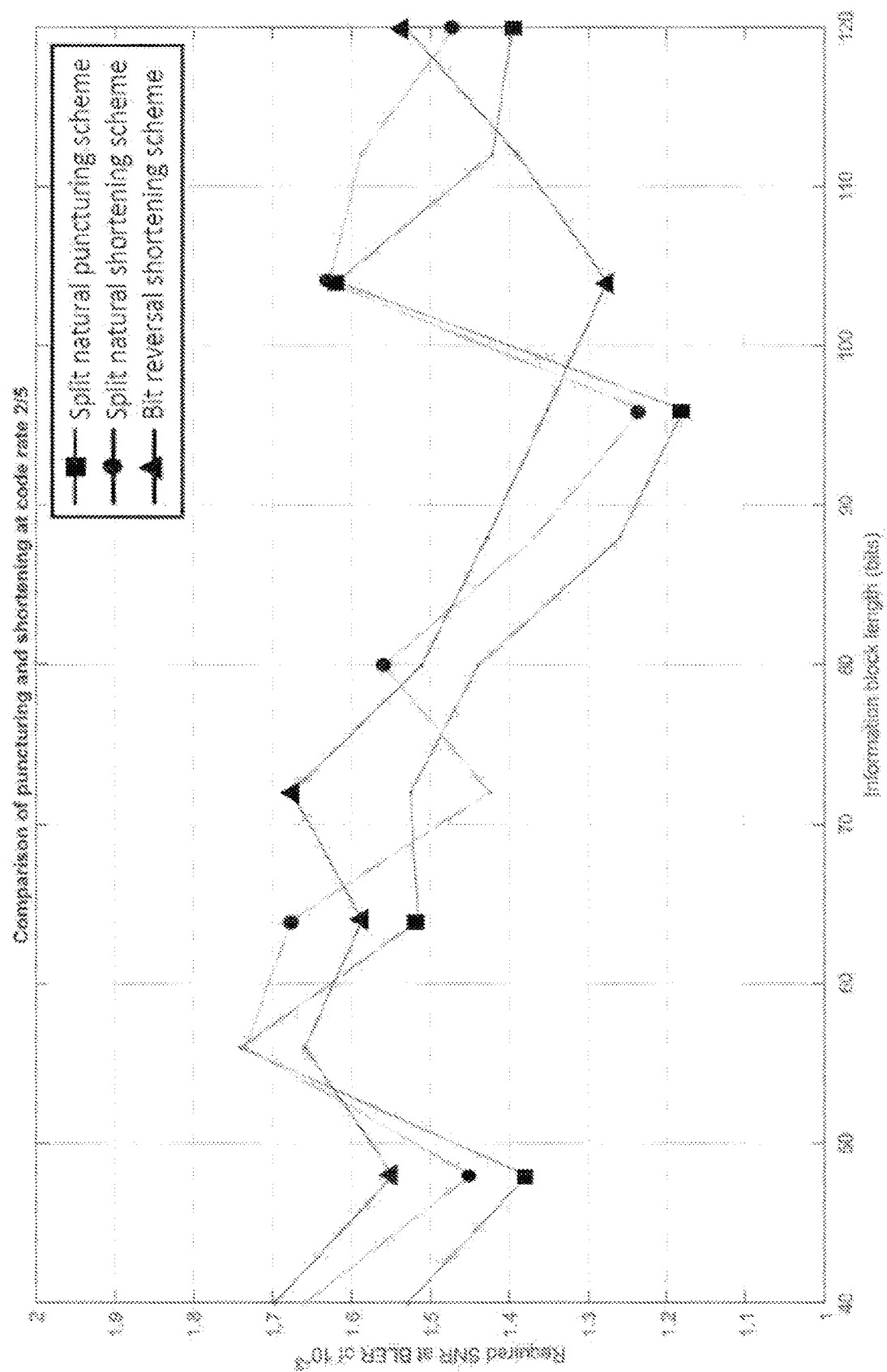
Figure 47:
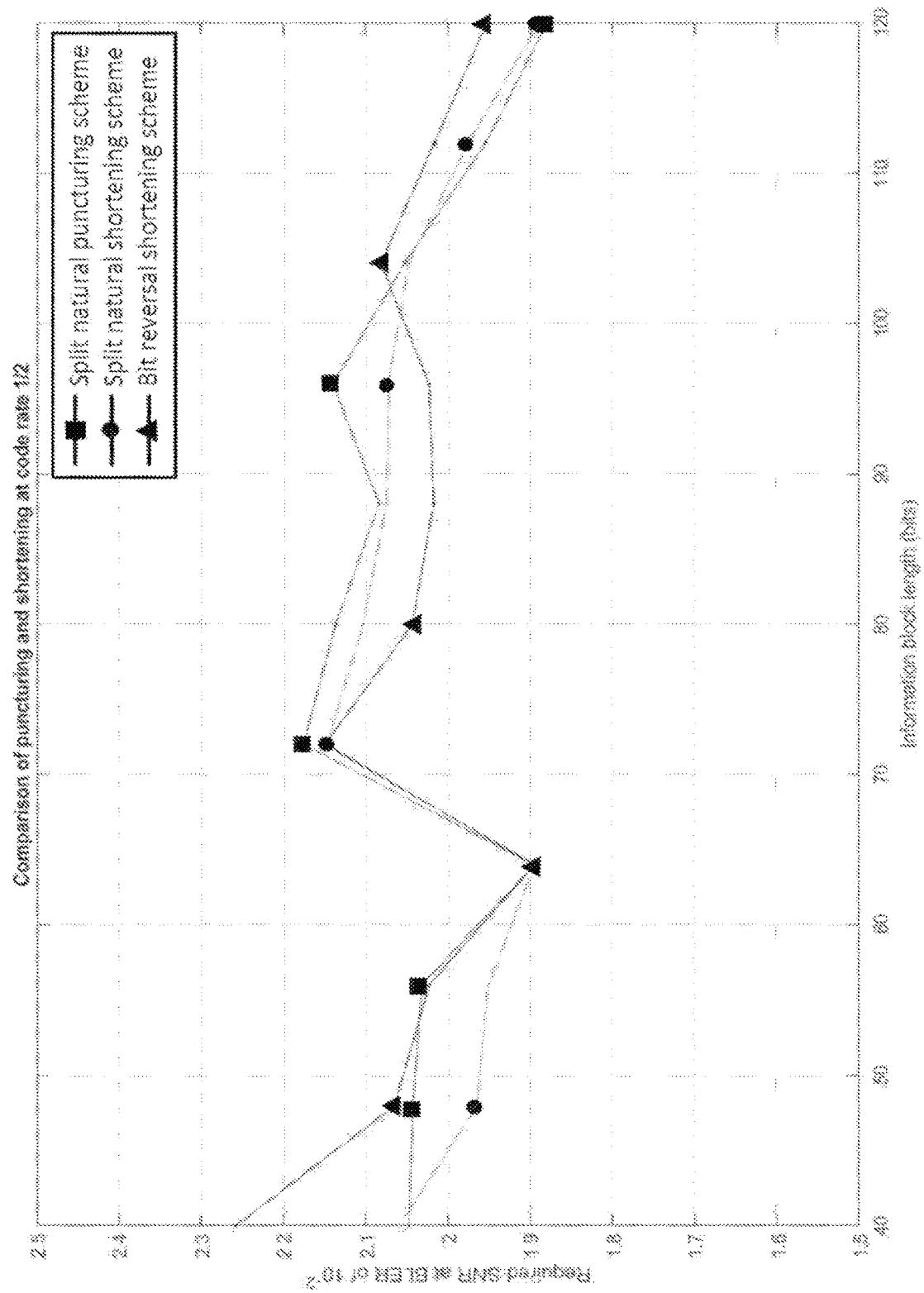
Figure 48:
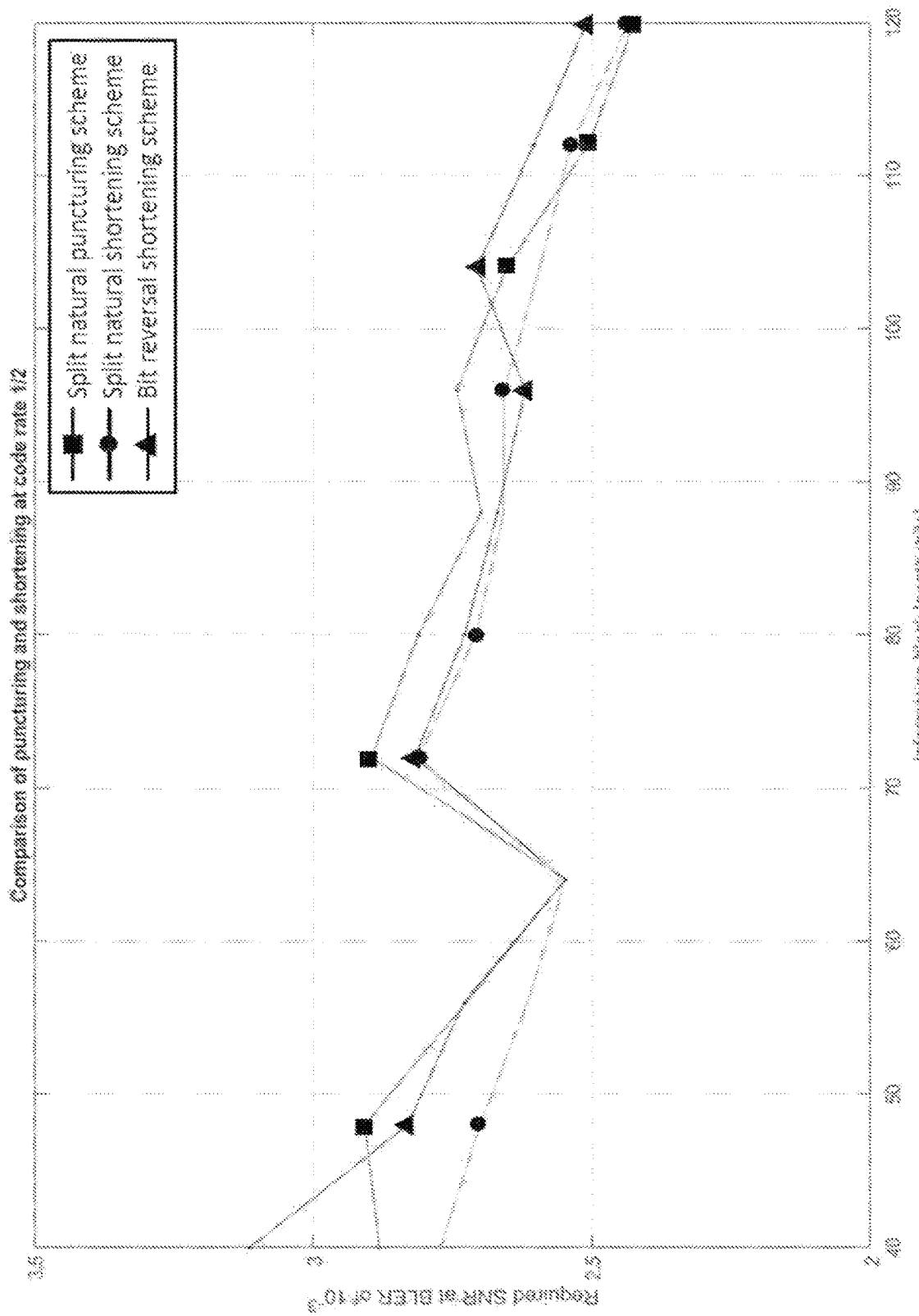

FIG. 41 and FIG. 42 illustrate a minimum SNR that may be used to achieve a target BLER level of $10^{-2}$ and $10^{-3}$ respectively for a code rate ⅕. FIG. 43 and FIG. 44, respectively, illustrate a minimum SNR that may be used to achieve a target BLER level of $10^{-2}$ and $10^{-3}$ for a code rate ⅓. FIG. 45 and FIG. 46, respectively, illustrate a minimum SNR that may be used to achieve a target BLER level of $10^{-2}$ and $10^{-3}$ for a code rate ⅖. FIG. 47 and FIG. 48, respectively, illustrate a minimum SNR that may be used to achieve a target BLER level of $10^{-2}$ and $10^{-3}$ for a code rate ½.

Based on these simulation results, it may be established that where a code rate is greater than ⅖, a shortening scheme may be selected. Where a code rate is less than or equal to ⅖, a puncturing scheme may be selected. In an example, a code rate threshold for selecting a puncturing scheme or a shortening scheme may be ⅖.

Rate matching may be implemented using concatenated polar codes (e.g., in addition to repetition, shortening, and/or puncturing schemes). For example, for a desired codeword length of 288 bits, 224 bits may be punctured or shortened from a mother code length of 512 bits. One way may be to repeat 32 bits from a mother code length of 256 bits. Another way may be to partition the 288 bits to 256 bits and 32 bits. A polar code may be used with mother code length of 256 bits and another polar code with mother code length of 32 bits. This scheme may be used if the desired codeword length is close to a summation of a few numbers which are powers of 2. The repetition, shortening, or puncturing schemes may be applied to each component of a concatenated polar code.

Figure 6:
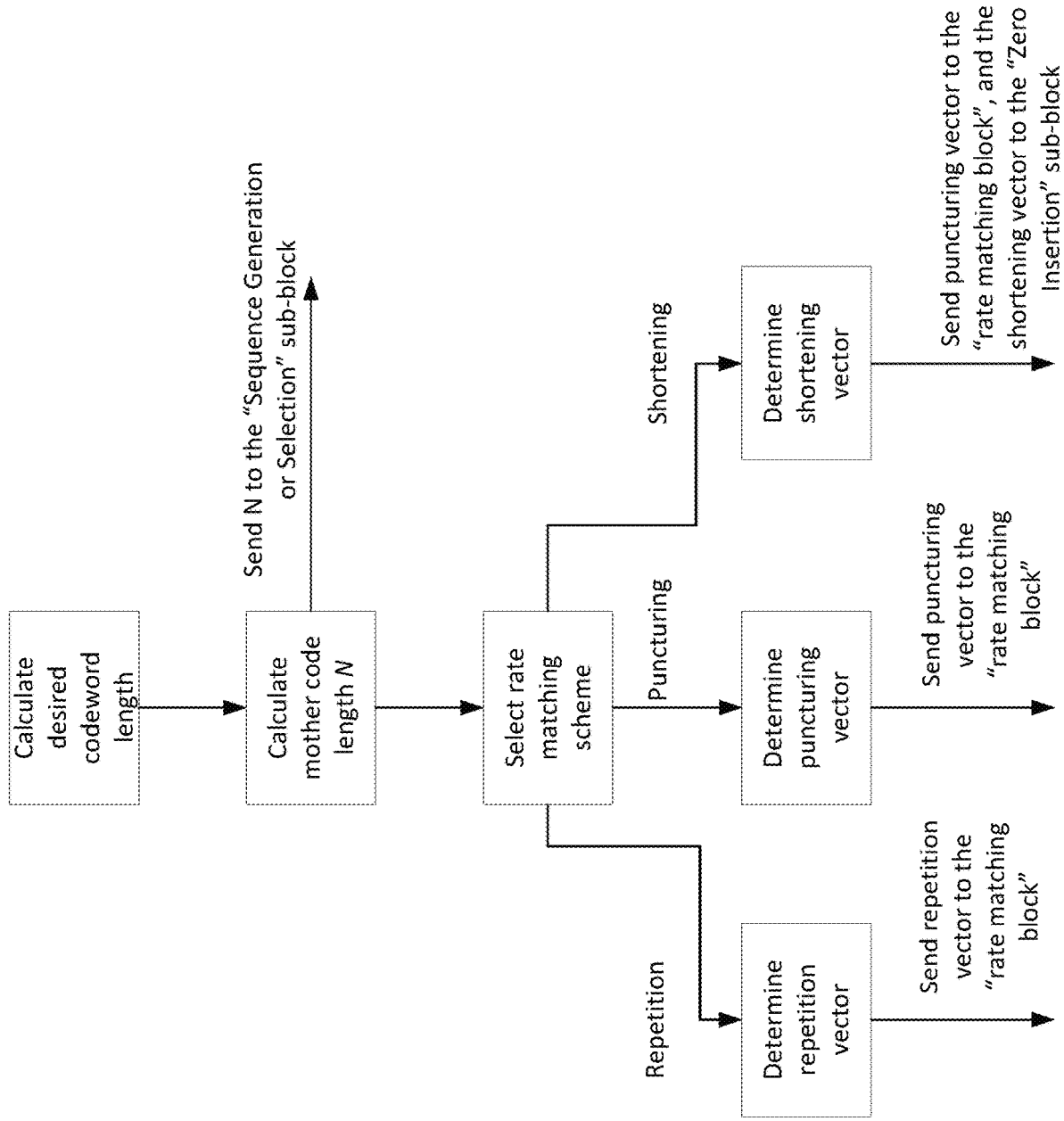
FIG. 6 illustrates an exemplary implementation of rate matching control.

FIG. 6 illustrates an exemplary rate matching control processing. In determining a detailed rate matching scheme(s), one or more of the following may apply.

If a repetition scheme is selected as a rate matching scheme, the rate matching control block of FIG. 5 may select a detailed repetition scheme. The repetition schemes may include one or more of the following: repeat from top of circular buffer (e.g., natural repetition), repeat from bottom of circular buffer, repeat from top of circular buffer with bit reversal, repeat from bottom of circular buffer with bit reversal, random pick, uniformly/distributed repeat, repeat from the configured starting point in a continuous fashion, or repeat from the configured starting point in an interleaving fashion. Assuming $e_0, \ldots, e_{N-1}$ to be the polar encoded bits, and N+L to be the number of transmitted bits. The transmitted bits for repeat from top of circular buffer may be represented as: $e_0, \ldots, e_{N-1}, e_0, \ldots, e_{L-1}$. The transmitted bits for repeat from bottom of circular buffer may be represented as: $e_{N-1}, \ldots, e_0, e_{N-1}, \ldots, e_{N-L}$. The transmitted bits for repeat from top of circular buffer with bit reversal may be represented as: $e_{BR(0)}, \ldots, e_{BR(N-1)}, e_{BR(0)}, \ldots, e_{BR(L-1)}$. The transmitted bits for repeat from bottom of circular buffer with bit reversal may be represented as: $e_{BR(N-1)}, \ldots, e_{BR(0)}, e_{BR(N-1)}, \ldots, e_{BR(N-L)}$. A selection of a repetition scheme may depend on one or more of the following: the number of repetition bits, the mother code length, or the code rate. Based on the determined repetition scheme, a repetition vector may be calculated. The repetition vector length may be equal to the desired codeword length $$\frac{K+J}{R}$$

minus the mother code length N, where each value of the repetition vector is an index with values between 1 and N (or between 0 and N−1). Based on the desired codeword length and the mother code length, the rate matching block may determine the N output bits of a polar encoder that may be repeated. For example, for the case of $$N = 256, \frac{K+J}{R} = 260,$$

a repetition vector may be (1, 2, 3, 4), which may imply that the first 4 bits of the polar encoder output are repeated. As illustrated in FIG. 6, the repetition vector may be sent to a rate matching block of FIG. 5.

If a puncturing scheme is selected, the rate matching block may select the detailed puncturing scheme. The puncturing schemes may include one or more of the following: puncturing from top of circular buffer, puncturing from bottom of circular buffer, puncturing from top of circular buffer with bit reversal, puncturing from bottom of circular buffer with bit reversal, distributed puncturing (e.g., split natural puncturing), puncturing from the configured starting point in a continuous fashion, or puncturing from the configured starting point in an interleaving fashion. Assuming $e_0, \ldots, e_{N-1}$ to be the polar encoded bits, L be the number of punctured bits. The punctured bits for puncturing from top of circular buffer may be represented as: $e_0, \ldots, e_{L-1}$. The punctured bits for puncturing from bottom of circular buffer may be represented as: $e_{N-L}, \ldots, e_{N-1}$. The punctured bits for puncturing from top of circular buffer with bit reversal may be represented as: $e_{BR(0)}, \ldots, e_{BR(L-1)}$. The punctured bits for puncturing from bottom of circular buffer with bit reversal may be represented as: $e_{BR(N-L)}, \ldots, e_{BR(N-1)}$. The distributed puncturing may be from 0, N/4, and/or N/2. The puncturing may be performed sequentially. A selection of a puncturing scheme may depend on one or more of the following: the number of punctured bits, the mother code length, the code rate, etc. Based on the selected puncturing scheme and the number of bits to be punctured, a puncturing vector may be calculated. As illustrated in FIG. 6, the puncturing vector may be sent to a rate matching block.

Where a shortening scheme is selected, the rate matching block may select the detailed shortening scheme. The shortening schemes may include one or more of the following: shortening from bottom of circular buffer, shortening from bottom of circular buffer with bit reversal (e.g., referred to as bit reversal shortening), or split natural shortening. The selection of the shortening scheme may depend on one or more of the following: the number of punctured bits, the mother code length, the code rate, etc. Based on a selected shortening scheme and a number of bits to be shortened, a puncturing vector may be calculated that may be sent to the rate matching block. A shortening vector may be calculated that may correspond to the puncturing vector. For a polar encoder without bit reversal operations, the shortening vector may be equal to the puncturing vector. For a polar encoder with bit reversal operations, the shortening vector may be equal to the bit reversal of the puncturing vector. The shortening vector may be sent to a zero insertion sub-block in the channel coding block.

Figure 13:
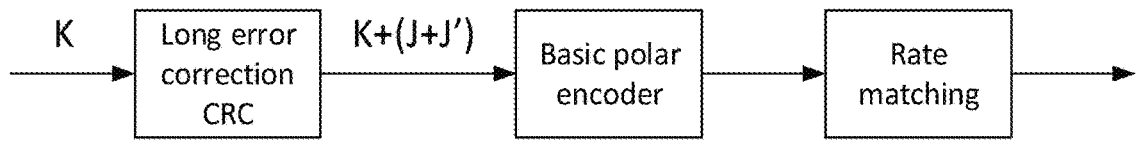
FIG. 13 illustrates an exemplary encoding of cyclic redundancy check (CRC)-aided (CA) polar code with a long CRC.
Figure 17:
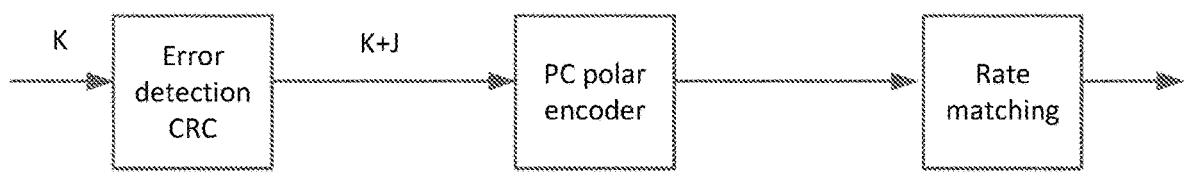
FIG. 17 illustrates an exemplary encoding of PC polar code.

In an example, K bits source information of downlink control information (DCI) or uplink control information (UCI) may be passed through a CRC attachment block. The length J of CRC bits may be determined by the code selection control block of FIG. 5. This block may support possible CRC cases, a single long CRC, two separate CRCs, a normal CRC, etc. A difference of a CA polar encoding process with a single CRC (as illustrated in FIG. 13), and a PC polar encoding process (as illustrated in FIG. 17) may be a CRC length. A CRC may be set as J+J' for CA polar codes and as/for PC polar codes.

Source bits (e.g., after CRC is attached to the source bits) may be sent to a channel coding block of FIG. 5. The channel coding block may perform the polar encoding operation(s). As illustrated in FIG. 5, the channel coding block may include one or more of the following sub-blocks: a zero insertion sub-block, a bit channel mapping sub-block, a sequence generation or selection sub-block, or a polar encoding sub-block. The zero insertion sub-block may insert zeros to the sequence of (K+J) (combined source and CRC bits). The positions to insert zeros may depend on the shortening vector input from rate matching control block. The sequence generation or selection sub-block may generate a ranked sequence (or selects from a list of pre-generated ranked sequence), e.g., based on one or more of the given mother code length N input from the rate matching control block, the code type input from the code Selection Control block, and/or as well as other factors like channel conditions (e.g., SNR). For example, for a CA polar code with mother code length 64 and SNR of 5 dB, we may select or generate a ranked sequence, or select a ranked sequence from a list of pre-generated sequences. The bit mapping sub-block may map the information and/or CRC bits to the proper bit channels for a polar code. This operation may depend on the code type and input ranked sequence. For example, for PC polar code, the bit mapping sub-block may determine the information set, PC frozen set, and/or frozen set, e.g., based on the given ranked sequence. For CA polar code, the bit mapping sub-block may determine the information set and frozen set, e.g., based on the given ranked sequence. The bit mapping sub-block may embed a WTRU ID with CRC bits using an operation, for example, an XOR operation. WTRU ID may be embedded by XORing WTRU ID with PC frozen bits for PC polar code. In an example, WTRU ID may be included in a frozen set. In polar coding, the frozen set may correspond to a number of constant bits (e.g., 0). In this case, the constant bits may be replaced by the WTRU ID. The insertion of the WTRU ID in frozen set may lead to the undesired UEs to have decoding errors. The polar encoding sub-block may perform the polar encoding operations (e.g., regular polar encoding operations), such as the generator matrix of $G_N = B_N F^{\otimes n}$ or $G_N = F^{\otimes n}$.

Figure 7:
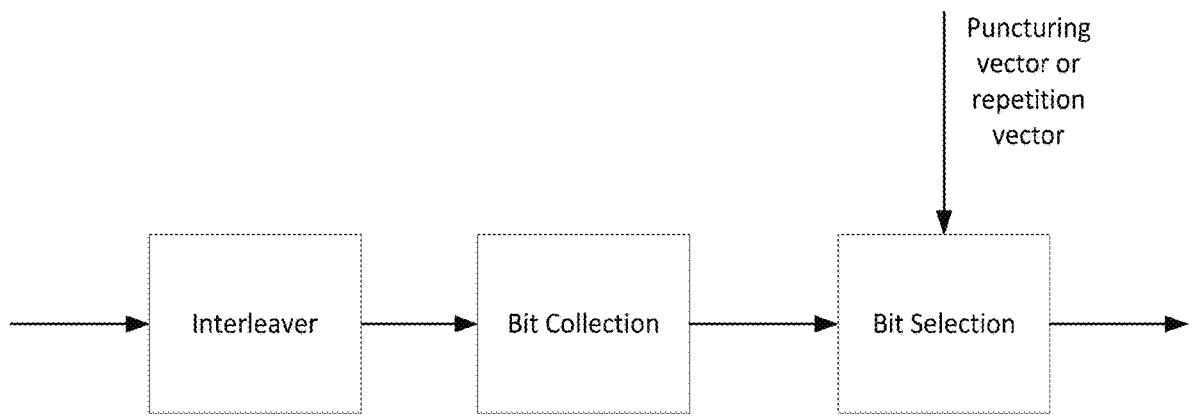
FIG. 7 illustrates an exemplary rate matching.

As illustrated in FIG. 5, the polar encoded bits may be sent to a rate matching block. The rate matching block may perform the puncturing or repetition operations. A selection of the puncturing vector or the repetition vector may be received from the rate matching control block. FIG. 7 illustrates an example of rate matching for polar coded bits. As illustrated in FIG. 7, $N=2^n$ bits from a polar encoding block (not shown in the FIG) may be sent to an interleaver sub-block of a rate matching block. The interleaver sub-block in an example may re-order the sub-blocks and the N polar encoded bits contained therein. Operations of an interleaver sub-block may be associated with the rate matching scheme that may be used. In an example, if a puncturing from top of circular buffer and/or a puncturing from bottom of circular buffer scheme is used, the interleaver sub-block may be transparent, i.e., such that a specific operation may not be needed. In an example, if a puncturing from top with bit reversal and/or a puncturing from bottom of circular buffer with bit reversal scheme is used, the interleaver sub-block may perform bit reversal operations on the N coded bits. In an example, if a distributed puncturing scheme is used, the interleaver sub-block may perform interlacing operations on the middle of the N coded bits. Similar operations may be used with one or more shortening schemes and/or repetition schemes.

Interleaved bits may be saved to a circular buffer or a virtual circular buffer. As illustrated in FIG. 7, the operation of saving bits to a circular buffer may be performed by a bit collection sub-block. As further illustrated in FIG. 7, depending on a puncturing vector or a repetition vector that may be generated by a rate matching control block, the bit selection sub-block may select bits from the circular buffer. A puncturing vector or a repetition vector may be interpreted to determine a pair of parameters (e.g., a starting point, a duration) associated with a circular buffer.

Figure 8:
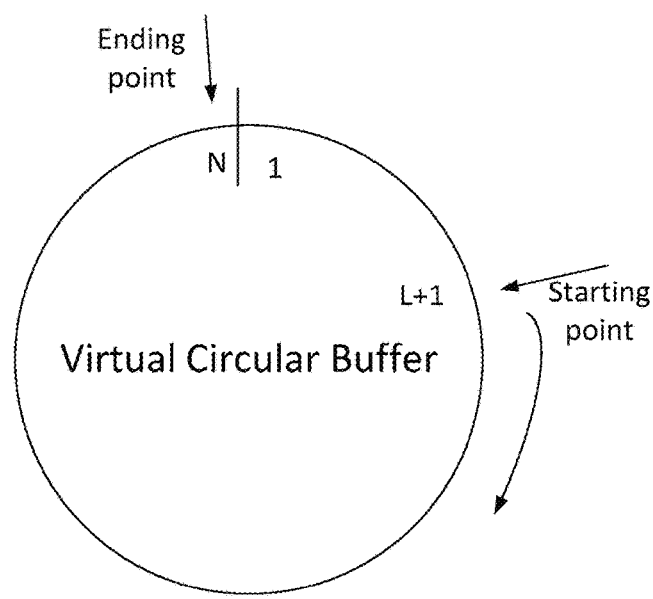
FIG. 8 illustrates an exemplary bit selection.

In an example, where a puncturing from top of circular buffer scheme may be applied, where a puncturing vector may be (0, . . . , 0, 1, 1, . . . , 1), and where the first L bits are 0's and the last N−L bits are 1's, a pair of parameters may be determined (e.g., L+1, N−L). An exemplary bit selection is illustrated in FIG. 8. As illustrated in FIG. 8, the bits to be used may begin at an L+1 position of a circular buffer, with a bit sequence length that may be N−L. A similar operation may be applied to a puncturing from top of circular buffer with bit reversal scheme. In such a scheme, bits may be saved to a circular buffer after bit reversal operations. A similar operation may be applied to a distributed puncturing scheme. In such a scheme, bits may be saved to a circular buffer after interlacing or interleaving operations on the middle of N coded bits.

Figure 9:
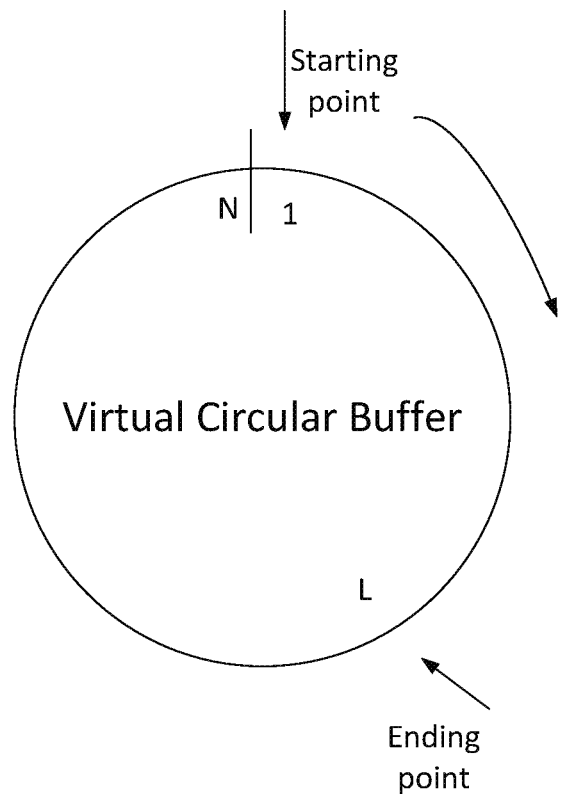
FIG. 9 illustrates an exemplary bit selection.

In an example, where a puncturing from bottom of circular buffer scheme may be applied, where a puncturing vector may be (1, . . . , 1, 0, . . . , 0), and where the first L bits are 1's and the last N−L bits are 0's, a pair of parameters (e.g., 1, L) may be determined. An exemplary bit selection is illustrated in FIG. 9. As illustrated in FIG. 9, bits to be used may start at a first position of a circular buffer, with the bit sequence length being L.

A similar operation may be applied to a "puncturing from bottom of circular buffer with bit reversal" scheme. In such a scheme, bits may be saved to a circular buffer after bit reversal operations.

Figure 10:
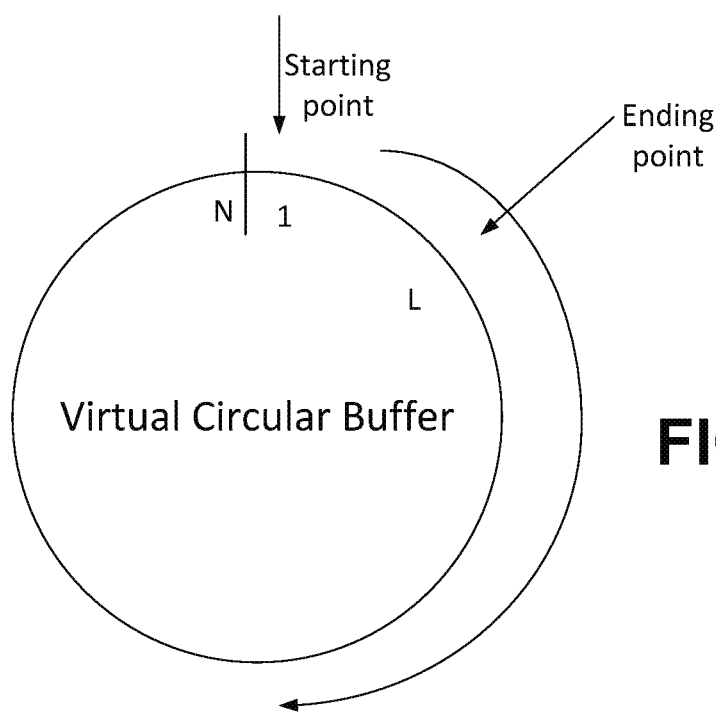
FIG. 10 illustrates an exemplary bit selection.

In an example where a repeat from top of circular buffer scheme may be applied, where a repetition vector may be (1, . . . , 1, 0, . . . , 0), and where the first L bits are 1's and the last N−L bits are 0's, a pair of parameters (e.g., 1, N+L) may be determined. An exemplary bit selection is illustrated FIG. 10. As illustrated in FIG. 10, bits to be used may start from a first position of a circular buffer, with the bit sequence length being N+L.

Figure 11:
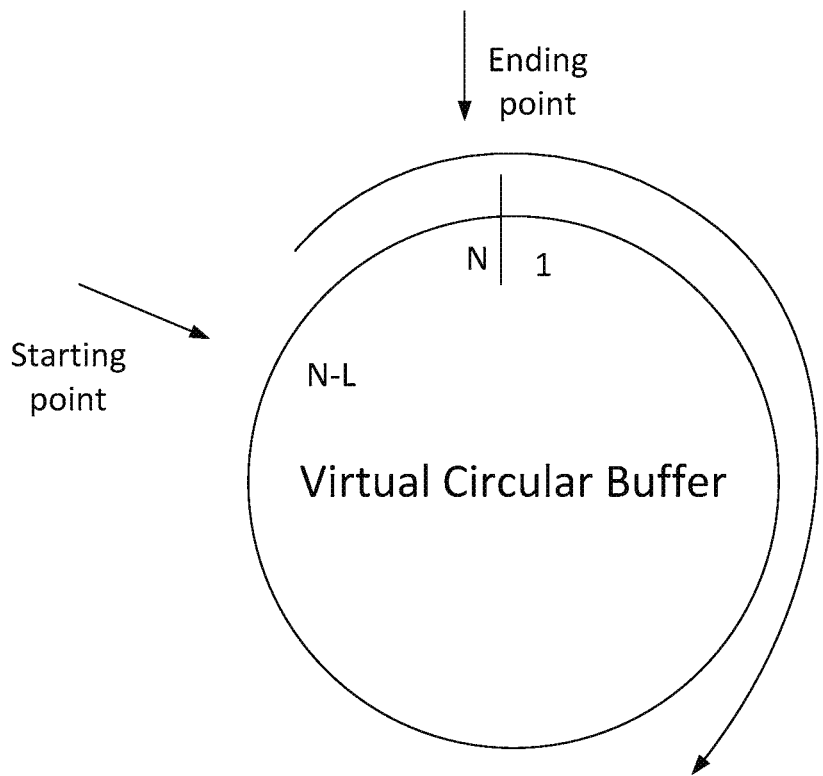
FIG. 11 illustrates an exemplary bit selection.

In an example where a repeat from bottom of circular buffer scheme may be applied, where a repetition vector may be (0, . . . , 0, 1, . . . , 1), and where the first N−L bits are 0's and the last L bits are 1's, a pair of parameters (e.g., N−L, N+L) may be determined. An exemplary bit selection is illustrated in FIG. 11. As illustrated in FIG. 11, bits to be used may start from the first position of a circular buffer, with the bit sequence length being N+L.

Figure 12:
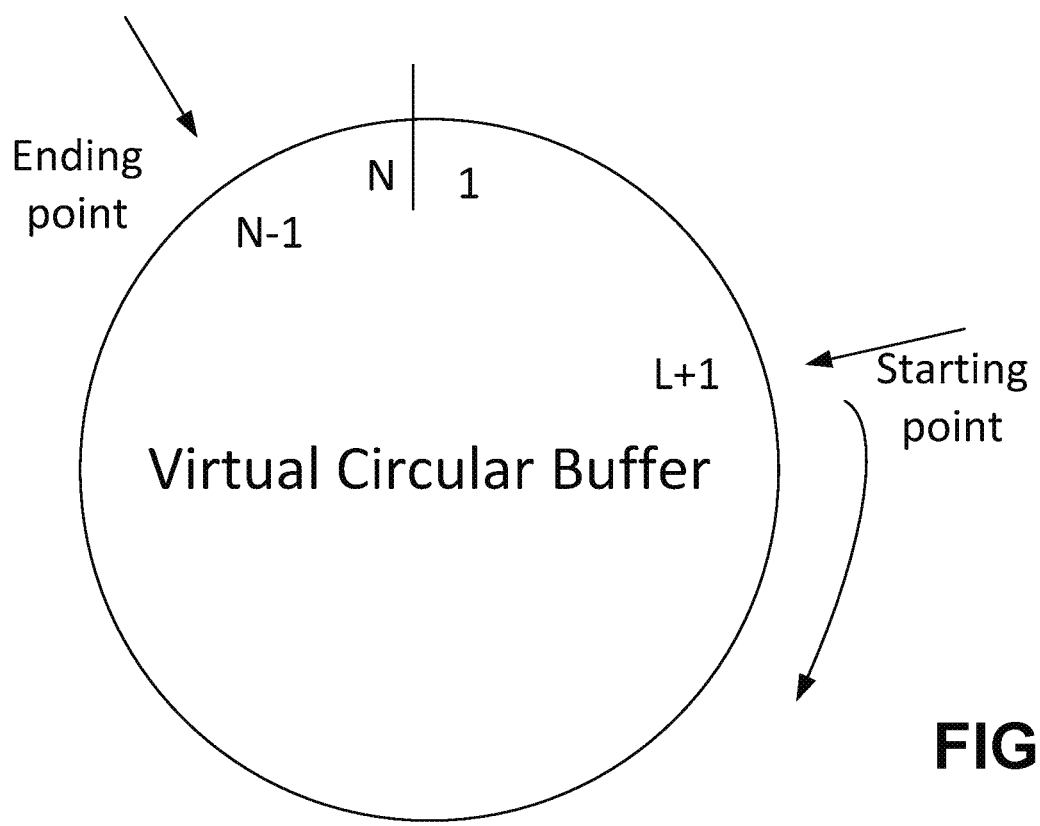
FIG. 12 illustrates an exemplary bit selection.

A starting point and/or an ending point may be on a first or a last encoded bit. In some examples, neither a starting point nor an ending point may be on a first or a last encoded bit. Where a mixture of a puncturing from the top and a puncturing from the bottom schemes may be used, a starting point and an ending point may be in the middle of encoded bits. In an example, where 1-bit shortening with puncturing from the top may be used, a puncturing vector may be (0, . . . , 0, 1, . . . , 1, 0), where the first L bits are 0's and the following N−L−1 bits are 1's and the last bit is 0. A pair of parameters (e.g., L+1, N−1) may be determined. An exemplary bit selection is illustrated FIG. 12.

Figure 14:
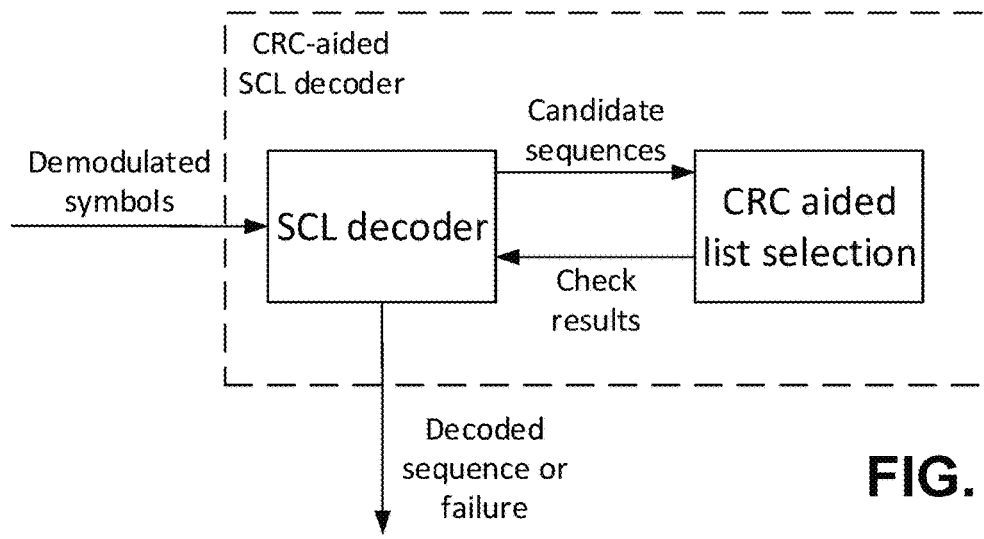
FIG. 14 illustrates an exemplary distribution of decoding for CA polar code with a long CRC.

Advanced PC polar code with CA list selection may be provided. For example, a polar code that is a mixture of PC polar code with CRC-aided list selection capability may be provided. FIGS. 13 and 14 illustrate exemplary encoding and decoding of CA polar code respectively with a long CRC scenario (e.g., as described herein). FIG. 13 illustrates an exemplary encoding for CA polar code with a long CRC. FIG. 14 illustrates an exemplary decoding for CA polar code with a long CRC.

As illustrated in FIG. 13, at an encoding side, long CRC bits (J+J') may be appended to the information bits. J of the order of 16 bits may be used as the CRC length, e.g., as specified for an LTE control channel. Other values of/may be used, e.g., as specified for other communication systems. The value J' may depend on list size L in a cyclic redundancy check (CRC) aided successive cancellation list (CA-SCL) decoder. In an example, $J'=\log_2 L$. The K+(J+J') bits may be encoded utilizing a basic polar code, and rate matching may be applied.

As illustrated in FIG. 14, at the decoder side, the demodulated symbols may be sent to the CA-SCL decoder. The SCL decoder block may output a list of L candidate sequences to the CRC aided (CA)-list selection block. The CA-list selection block may feedback the selected sequence based on the CRC check results and/or priority of the candidate sequences. In case the L candidate sequences fail CRC check (e.g., all the L candidate sequences fail CRC check), a detection error may be declared.

(J+J') bits may be used in the CRC aided list selection process, e.g., the error correction process. The error detection check may follow from the error correction, as the selected sequence may have passed CRC check.

Figure 15:
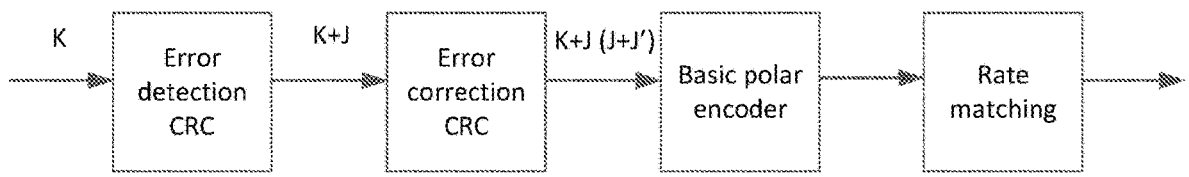
FIG. 15 illustrates an exemplary encoding of CA polar code with two separate CRCs.
Figure 16:
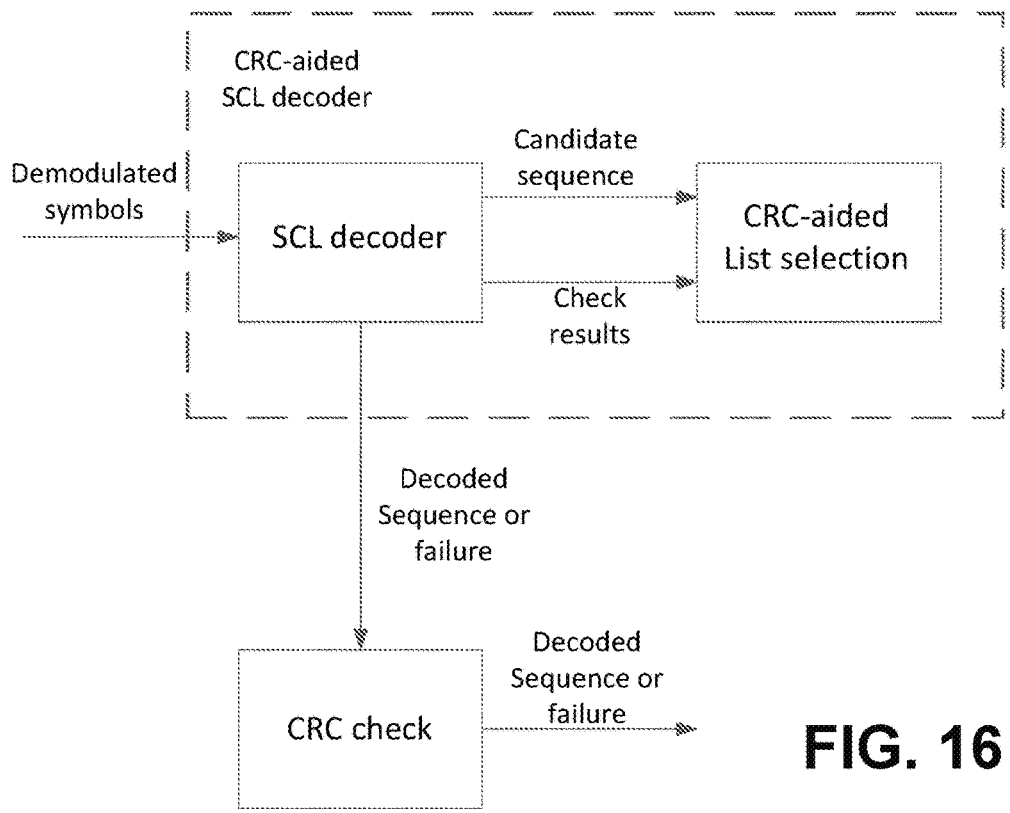
FIG. 16 illustrates an exemplary decoding of CA polar code with two separate CRCs.

FIGS. 15 and 16 illustrate exemplary encoding and decoding of CA polar code respectively with two separate CRCs scenario (e.g., as described herein). FIG. 15 illustrates an exemplary encoding for CA polar code with two separate CRCs. FIG. 16 illustrates an exemplary decoding for CA polar code with two separate CRCs.

As illustrated in FIG. 15, at an encoding side, the/CRC bits may be appended to the K information bits. These CRC bits may be utilized for error detection. An additional J' CRC bits may be appended to the information bits with error detection CRCs. These J' CRC bits may be utilized for error correction. As illustrated in FIG. 15, the resulting (K+J+J') bits may be encoded by a PC polar coder. Rate matching may be applied on the polar encoded bits.

As illustrated in FIG. 16, at the decoder side, the demodulated symbols may be sent to the CA-SCL decoder, where the SCL decoder block may provide a list of L candidate sequences to the CA-list selection block. The CA-list selection block may feedback the selected sequence to the SCL decoder. The CA-list selection block may select a sequence based on the J'-bit CRC check results and/or priority of the candidate sequences. In case the L candidate sequences fail CRC check (e.g., all these L candidate sequences fail CRC check), a detection error may be declared, as indicated by the downward arrow in FIG. 16. The decoded sequence or error declaration may be passed to the CRC check block. The CRC check block may use J bits CRC for error detection. If the CRC check passes, the sequence may be sent to the output. Otherwise, an error may be detected and/or decoding failure may be declared.

Figure 18:
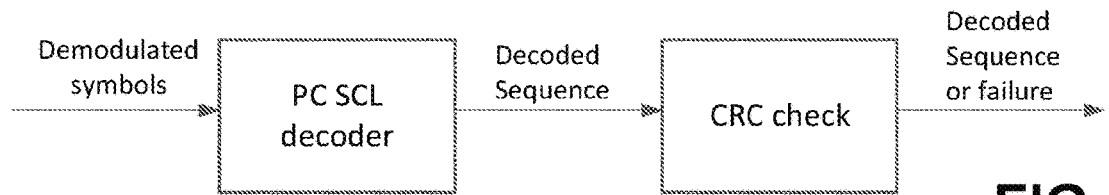
FIG. 18 illustrates an exemplary decoding of PC polar code.

FIGS. 17 and 18 illustrate exemplary encoding and decoding of PC polar code respectively with CRC (e.g., as described herein). FIG. 17 illustrates an exemplary encoding using a PC polar encoder. FIG. 18 illustrates an exemplary decoding for a PC polar code.

As illustrated in FIG. 17, at the encoding side, the J CRC bits may be appended to the K information bits. These CRC bits may be utilized for error detection. The (K+J) bits may be encoded using a PC polar code. The PC polar encoded bits may be rate matched. In PC polar code, several frozen bits may be selected as PC frozen bits. The PC frozen bits may be utilized for error correction, e.g., in the candidate sequence selection.

As illustrated in FIG. 18, at the decoder side, the demodulated symbols may be sent to the PC-SCL decoder, where the PC-SCL decoder block may output a single sequence. This sequence may be passed to the CRC check. If the CRC check passes, the sequence may be sent to the output, otherwise an error may be detected and/or decoding failure may be declared.

A PC polar code is disclosed that may be a combination of PC polar code and CRC-aided list selection capability. Such an encoding may be similar to an exemplary PC polar coding case, for example, as described in regard to FIG. 17.

Figure 19:
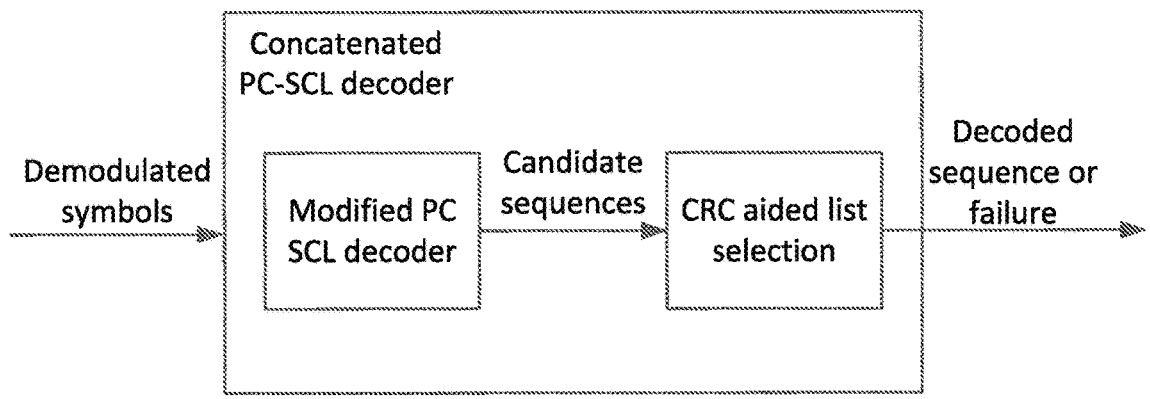
FIG. 19 illustrates an exemplary decoding of PC polar code with CA list selection.

FIG. 19 illustrates an exemplary decoder for a PC polar code with CRC-aided list selection. As illustrated in FIG. 19, at the decoder side, the demodulated symbols may be sent to the concatenated PC-SCL decoder. The concatenated PC-SCL decoder block may include a modified PC-SCL decoder sub-block block and a CRC aided list selection sub-block. The modified PC SCL decoder may generate a list of L candidate sequences to the CA list selection, e.g., instead of a single sequence (e.g., as illustrated in FIG. 18). Each of the L candidate sequences may pass the internal PC check in the decoder. The modified PC SCL decoder may output L candidate sequences, as SCL decoder, e.g., unlike the PC SCL decoder which may output a single codeword. These L candidate sequences may be associated with one or more ranks. The candidate sequences may pass the CRC check, e.g., based on the/CRC bits. If a high rank sequence passes the CRC check, the sequence may be identified as the decoded sequence. If no sequences pass the CRC check, a detection/decoding failure may be declared.

The selection of the polar code type may depend on one or more of the following: a WTRU capability, WTRU category, or a WTRU configuration. For example, for WTRUs with high capabilities, the advanced PC polar code may be utilized. For WTRUs with low capabilities, the basic polar code may be utilized. The selection of polar codes may be determined based on a WTRU category. For example, for a WTRU category of 1, 2, 3 may correspond to basic polar code, while WTRU category of 4, 5, 6 may correspond to advanced PC polar code. The performance of CA polar code and PC polar code may depend on a list size utilized in SCL decoding. PC polar code may outperform CA polar code at a larger list size, while CA polar code may outperform PC polar code at a smaller list size. The selection of a polar code to be utilized may depend on the list size, a WTRU may support. This list size may be part of the WTRU capabilities.

Puncturing vector generation for shortening and/or puncturing may be provided. A puncturing and/or a shortening scheme may be utilized to exclude some bits out of the output coded bits. There may be no impact on the code construction. A shortening scheme may puncture output coded bits, and may set the corresponding input bits to zero. These input bits may be included in the frozen bits set. These input bits may be different from the other frozen bits that may be set to a pre-defined value (e.g., a non-zero value). Because some input bits are pre-set as frozen bits due to shortening, the frozen bit set may need to be adjusted accordingly.

The corresponding input bits may depend on the inclusion of bit reversal (BR) operation in polar encoding. When the BR operation is included in polar encoding ($G_N=B_N F^{\otimes n}$), an input bit index corresponding to an output bit may be the BR of the output bit index. When the BR operation is not included in polar encoding ($G_N=F^{\otimes n}$), an input bit may correspond to an output bit if they have the same index.

A difference between puncturing and shortening may be the way decoding is performed. When a log-likelihood ratio (LLR) value or probability for each output bit is calculated from the received signal, an LLR value or probability for each punctured (shortened) output bit may be defined. For puncturing scheme, the LLR value may be set to be log(1)=0, e.g., as it is equally likely that the punctured bit is 0 or 1. For shortening scheme, the LLR value may be set to log(0)=−∞, e.g., which may imply that the punctured bits are equal to 0 (e.g., always equal to 0).

The puncturing scheme and shortening scheme may result in a puncturing vector to be used at the rate matching block, as illustrated in FIG. 5. The puncturing scheme and/or shortening scheme may be provided that may generate a common puncturing vector for puncturing and/or shortening.

In an example, let there be M bits to be punctured or shortened from a mother code with length $N=2^n$. Let P(i) be the position of the $i^{th}$ punctured bits, $0 \le i < M$. Let $I_s(1)$ be the input bit position corresponding to the punctured bit P(i). In case of shortening, the $I_s(i)$ bits may be shortened and set as frozen bits.

In an example, $I_s(i)$ may be selected as $$I_s(i) = N - 1 - i, \text{ if } i < N/4,$$

$$I_s(i) = \frac{3}{4} \times N - 1 - \left\lfloor \frac{i - \frac{N}{4}}{2} \right\rfloor, \text{ if } i \ge N/4 \text{ and } \mathrm{mod}\left(\left(i - \frac{N}{4}\right), 2\right) = 0,$$

$$I_s(i) = \frac{1}{2} \times N - 1 - \left\lfloor \frac{i - \frac{N}{4}}{2} \right\rfloor, \text{ if } i \ge N/4 \text{ and } \mathrm{mod}\left(\left(i - \frac{N}{4}\right), 2\right) = 1,$$

where $\lfloor x \rfloor$ may be the largest integer less than x. mod (a, b) is the remainder of a/b.

This puncturing/shortening may be expanded as $$I_s(i) = N - 1 - i, \text{ if } i < N/2^G,$$

$$I_s(i) = N - 1 - \frac{N}{2^G} \times 2^g - \left\lfloor \frac{i - \frac{N}{2^G}}{G} \right\rfloor,$$

$$\text{if } i \ge N/2^G \text{ and } \mathrm{mod}\left(\left(i - \frac{N}{2^G}\right), G\right) = g.$$

In an example, $I_s(i)$ may be selected as $$I_s(i) = N - 1 - \left\lfloor \frac{i}{G} \right\rfloor, \text{ if } \mathrm{mod}(i, G) = 0$$

$$I_s(i) = N - 1 - \frac{N}{2^G} \times 2^{g-1} - \left\lfloor \frac{i}{G} \right\rfloor, \text{ if } \mathrm{mod}(i, G) = g \ne 0$$

In an example, sub-block based puncturing may be utilized. For a mother code length N, the N bits (e.g., N polar encoded bits) may be partitioned (e.g., equally partitioned) into b sub-blocks. The b sub-blocks may be partitioned in a sequential manner. The number of sub-blocks b may be assumed to be a power of 2. Each sub-block may have $$B = \frac{N}{b}$$

bits. The $I_s(i)$ may be selected as follows:

$$I_s(i) = N - 1 - B \times d_1\left[\left\lfloor \frac{i}{B} \right\rfloor\right] - d_2[\mathrm{mod}(i, B)] \quad (1)$$

where the functions $d_1$ and $d_2$ may be independently pre-defined, or $d_1$ may be a function of $d_2$. The function $d_1()$ is a mapping function that may determine the location of the sub-blocks within the set of sub-blocks. The function $d_2()$ is a mapping function that may determine the location of the bits within the sub-block.

In an example, $d_2()$ may be defined in a way where $d_2[i]=i$. $d_1$ may depend on the reliability distributions of bit channels of polar codes. $d_1[0]$ may correspond to the least reliable block of bit channels, $d_1[1]$ may correspond to the second least reliable block of bit channels, and so on. For example, for the case of b=2, we have $d_1[0]=0$, $d_1[1]=1$; for the case of b=4, we have $d_1[0]=0$, $d_1[1]=1$; $d_1[2]=2$, $d_1[1]=3$; for the case of b=8, we have $$d_1[0] = 0, d_1[1] = 1, d_1[2] = 2, d_1[3] = 4, \quad \text{(Pattern 1)}$$
$$d_1[4] = 3, d_1[5] = 5, d_1[6] = 6, d_1[7] = 7;$$

or $$d_1[0] = 0, d_1[1] = 1, d_1[2] = 4, d_1[3] = 2,$$
$$d_1[4] = 3, d_1[5] = 5, d_1[6] = 6, d_1[7] = 7$$

Pattern 1 may be considered as $$\frac{b}{4}(=2)$$

interleaver pattern $$+\frac{b}{2}(=4)$$

interlaced pattern $$+\frac{b}{4}(=2)$$

symmetric interleaver pattern from the ending index when b=8. The interleave pattern for $$b' = \frac{b}{4} = 2$$

is $d_1[0]=0$, $d_1[1]=1$ and Pattern 1 may be generated. The Pattern 1 may be expressed in a table format as indicated in Table 3. Other patterns may also be expressed in a table form.

TABLE 3

| i | $d_1$ (i) | i | $d_1$ (i) |
|---|---|---|---|
| 0 | 0 | 4 | 3 |
| 1 | 1 | 5 | 5 |
| 2 | 2 | 6 | 6 |
| 3 | 4 | 7 | 7 |

For the case of b=16, we have $d_1[0] = 0, d_1[1] = 1, d_1[2] = 2, d_1[3] = 4,$ (Pattern 2)

$d_1[4] = 8, d_1[5] = 3, d_1[6] = 5, d_1[7] = 6,$ $d_1[8] = 9, d_1[9] = 10, d_1[10] = 12, d_1[11] = 7,$ $d_1[12] = 11, d_1[13] = 13, d_1[14] = 14, d_1[15] = 15;$ or $d_1[0] = 0, d_1[1] = 1, d_1[2] = 2, d_1[3] = 3,$ $d_1[4] = 4, d_1[5] = 8, d_1[6] = 5, d_1[7] = 6,$ $d_1[8] = 9, d_1[9] = 10, d_1[10] = 12, d_1[11] = 7,$ $d_1[12] = 11, d_1[13] = 13, d_1[14] = 14, d_1[15] = 15;$ or $d_1[0] = 0, d_1[1] = 1, d_1[2] = 2, d_1[3] = 4,$ $d_1[4] = 3, d_1[5] = 8, d_1[6] = 5, d_1[7] = 6,$ $d_1[8] = 9, d_1[9] = 10, d_1[10] = 12, d_1[11] = 7,$ $d_1[12] = 11, d_1[13] = 13, d_1[14] = 14, d_1[15] = 15;$

The Pattern 2 could be expressed in a table format as given in Table 4.

TABLE 4

| i | $d_1(i)$ |
|---|---|
| 0 | 0 |
| 1 | 1 |
| 2 | 2 |
| 3 | 4 |
| 4 | 8 |
| 5 | 3 |
| 6 | 5 |
| 7 | 6 |
| 8 | 9 |
| 9 | 10 |
| 10 | 12 |
| 11 | 7 |
| 12 | 11 |
| 13 | 13 |
| 14 | 14 |
| 15 | 15 | for the case of b=32, we have $d_1[0] = 0, d_1[1] = 1, d_1[2] = 2, d_1[3] = 4,$ $d_1[4] = 8, d_1[5] = 16, d_1[6] = 3, d_1[7] = 5,$ $d_1[8] = 6, d_1[9] = 9, d_1[10] = 10, d_1[11] = 17, d_1[12] = 12,$ $d_1[13] = 18, d_1[14] = 20, d_1[15] = 7, d_1[16] = 24, d_1[17] = 11,$ $d_1[18] = 13, d_1[19] = 19, d_1[20] = 14, d_1[21] = 21, d_1[22] = 22,$ -continued $d_1[23] = 25, d_1[24] = 26, d_1[25] = 28, d_1[26] = 15, d_1[27] = 23,$ $d_1[28] = 27, d_1[29] = 29, d_1[30] = 30, d_1[31] = 31.$ The expression (1) may also be expressed as:

$$I_s(i) = B\left[d_1'\left[\left\lfloor \frac{i}{B} \right\rfloor\right]\right] + d_2'[\mathrm{mod}(i, B)] \qquad (2)$$

where $d'_1[i]=b-1-d_1[i]$, $d'_2[i]=B-1-d_2[i]$, and/or where $d'_1[i]=d_1[i]$, $d_2[i]=d_2[i]$. In an example, $d_1(\ )$ may be represented as in pattern (1) or pattern (2) or other patterns as described herein. In an example, $d_2(\ )$ may be represented as $d_2(i)=i$.

The values of $d_1[i]$ may be derived by sorting the value representing for each block i. If i indicates a block of input bit index from $B \times (i-1)$ to $B \times (i-1)+B-1$, the representative value may be an average or minimum or maximum reliability value for that range. $d_1[i]$ may be the index of the sub-block which has i-th representative value.

Some $d_1[i']$ and $d_1[i''](i' \neq i'')$ in the derived $d_1[i]$ may be exchanged, e.g., to improve the property of Hamming distance and error performance for shortening and puncturing. A common total puncturing vector for puncturing and/or shortening may be used and a determination of shortening or puncturing may be based on specific criteria. Such a criterion may be a code rate, as described herein.

A common total puncturing vector may be divided into a puncturing part and a shortening part, where such a common puncturing vector may be shared between puncturing and shortening. In an example, shortening may be used for P(i), $i<p_0$, and puncturing may be used for P(i), $i \geq p_0$. $p_0$ may be fixed or may be dependent on a code rate (or mother code rate) or p. p may be a total number of puncturing and shortening, and $p_0 \leq p$. When shortening may be used, corresponding input bit positions $I_s(i)$ may be set to 0, where $P(i)=BR(I_s(i), n)$ in case the BR operation is applied on the polar encoder, or where $P(i)=I_s(i)$ in case the BR operation is not applied on the polar encoder. Here, BR(x, n) may be the bit reversal of the integer x, in terms of n bits; Depending on the indices of these zero valued input bits, the unfrozen bits in polar encoder may be rearranged; these zero valued input bits may be excluded in the selection of unfrozen bits.

Figure 20:
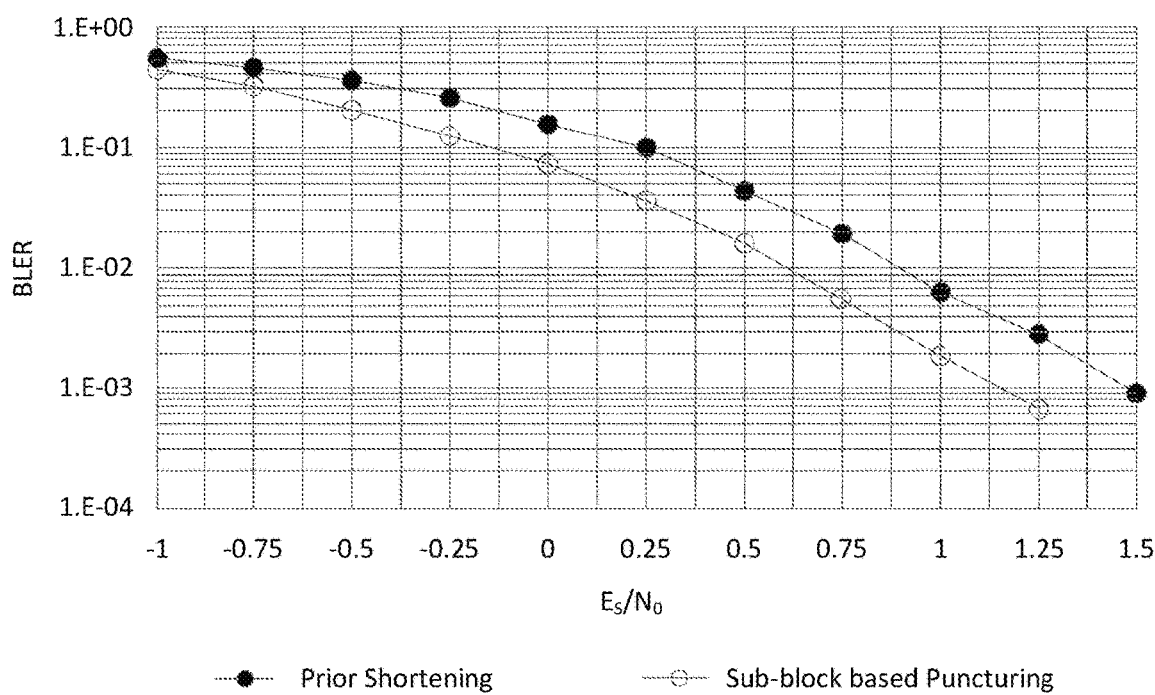
FIG. 20 illustrates an exemplary block error ratio (BLER) comparison between sub-block based puncturing and a prior shortening scheme.

FIG. 20 illustrates an exemplary BLER comparison between the proposed sub-block based puncturing and the shortening scheme. In the shortening example of N=512, K=126, P=182, CA-SCL decoding, with a list size of 8, and a CRC length of 16 is applied. The example is a case of the second pattern or b=16. From the results, the exemplary scheme may have a coding gain of ~0.35 dB at a BLER of $10^{-3}$.

When R(i) is a position of i-th repeated bits, $R(i)=P(N-1-(i \%N)$. i may be larger than N-1 for repetition. i may be less than N-1 for puncturing and/or shortening. Based on a common puncturing vector that may be used for puncturing and shortening, a repetition pattern may be configured. An interleaver, such as an interleaver as described herein, may be configured based on R(i) or P(i), and an i-th bit position (index) after interleaving may be an R(i)-th bit position (index) before interleaving (e.g., where an index starts from zero).

An interleaver pattern $d_1(\ )$ or $d'_1(\ )$ may be determined as indicated in expressions 1 or 2 and may be used for sub-block level interleaving. Referring to expressions 1 or 2, $$B \times d_1\left(\frac{i}{B}\right) + d_2(\mathrm{mod}(i, B))$$

may be an index of a bit before applying sub-block based interleaving that corresponds to the i-th bit after the sub-block wise interleaving is applied. In this expression, i may be an index of a bit after interleaving. The number of bits in a sub-block or the size of a sub-block, B may be determined by $$B = \frac{N}{b},$$

where N is a number of polar encoded bits (e.g., mother code length), and b is the number of sub-blocks.

$$\left\lfloor \frac{i}{B} \right\rfloor$$

may be index of an interleaved sub-block including i-th bit after interleaving.

$$d_1\left(\frac{i}{B}\right)$$

may be index of a sub-block before interleaving. mod(i, B) may be index of a i-th bit within an interleaved sub-block. $d_2(\ )$ may be interleaver pattern within a sub-block. In an example, an expression $d_2(x)=x$ may represent that no interleaving is applied within a sub-block. $d_2(\mathrm{mod}(i, B))$ may be an index of a bit within a sub-block before interleaving that corresponds to the i-th bit within a sub-block after applying the sub-block level interleaving.

Figure 21:
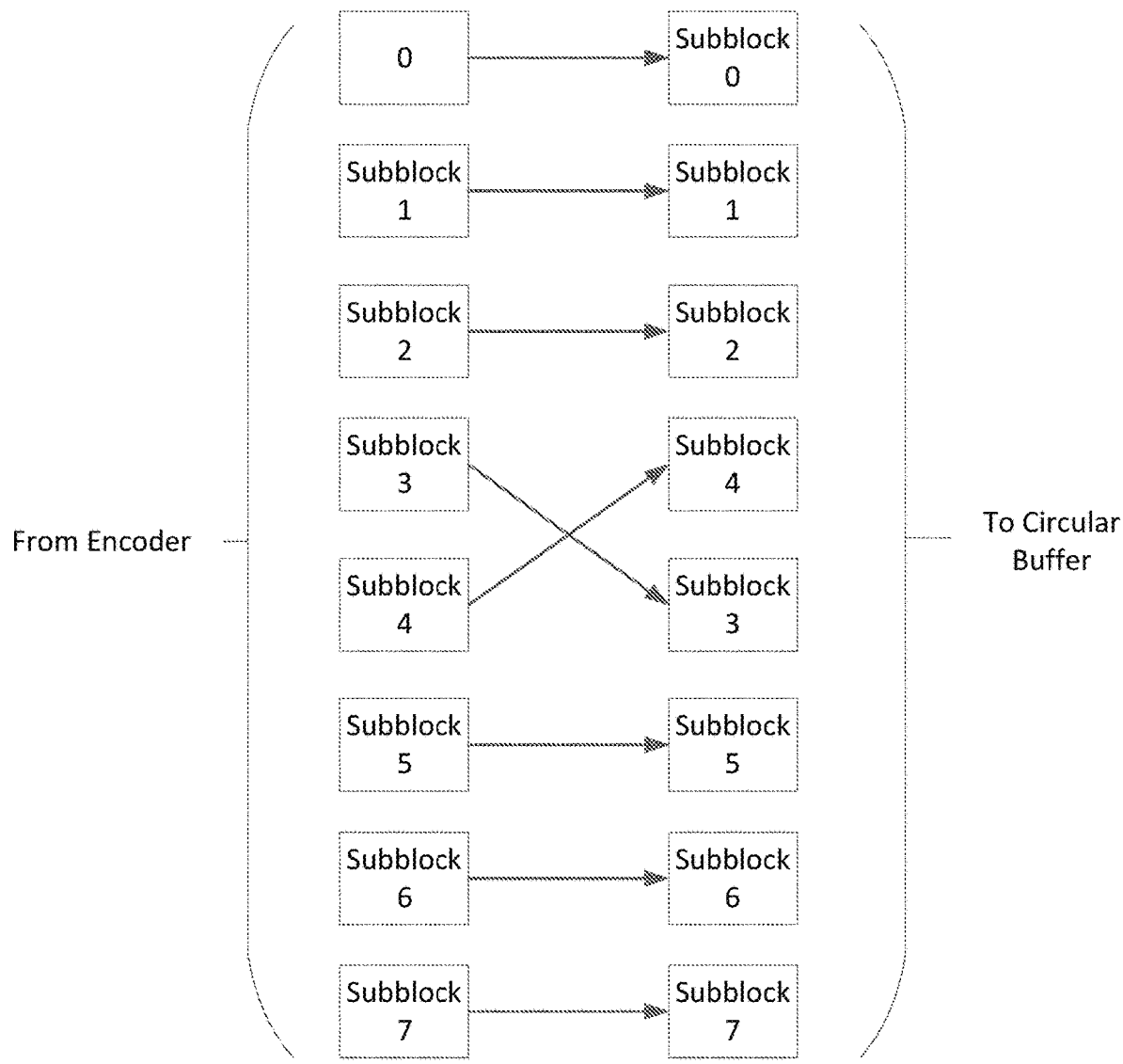
FIG. 21 illustrates an exemplary sub-block wise interleaver for polar code rate matching with 8 sub-blocks.

FIG. 21 illustrates an example of a sub-block interleaver with 8 sub-blocks using $$B \times d_1\left(\frac{i}{B}\right) + d_2(\mathrm{mod}(i, B))$$

index. In this example, the polar coded bits may be partitioned (e.g., evenly and sequentially partitioned) to 8 sub-blocks (Subblock 0 to Subblock 7). These 8 sub-blocks may be interleaved based on an interleaver pattern Pattern 1. Based on Pattern 1, these sub-blocks may be re-arranged arranged in the order of [0, 1, 2, 4, 3, 5, 6, 7]. The re-arranged sub-blocks may be saved to circular buffer.

Figure 22:
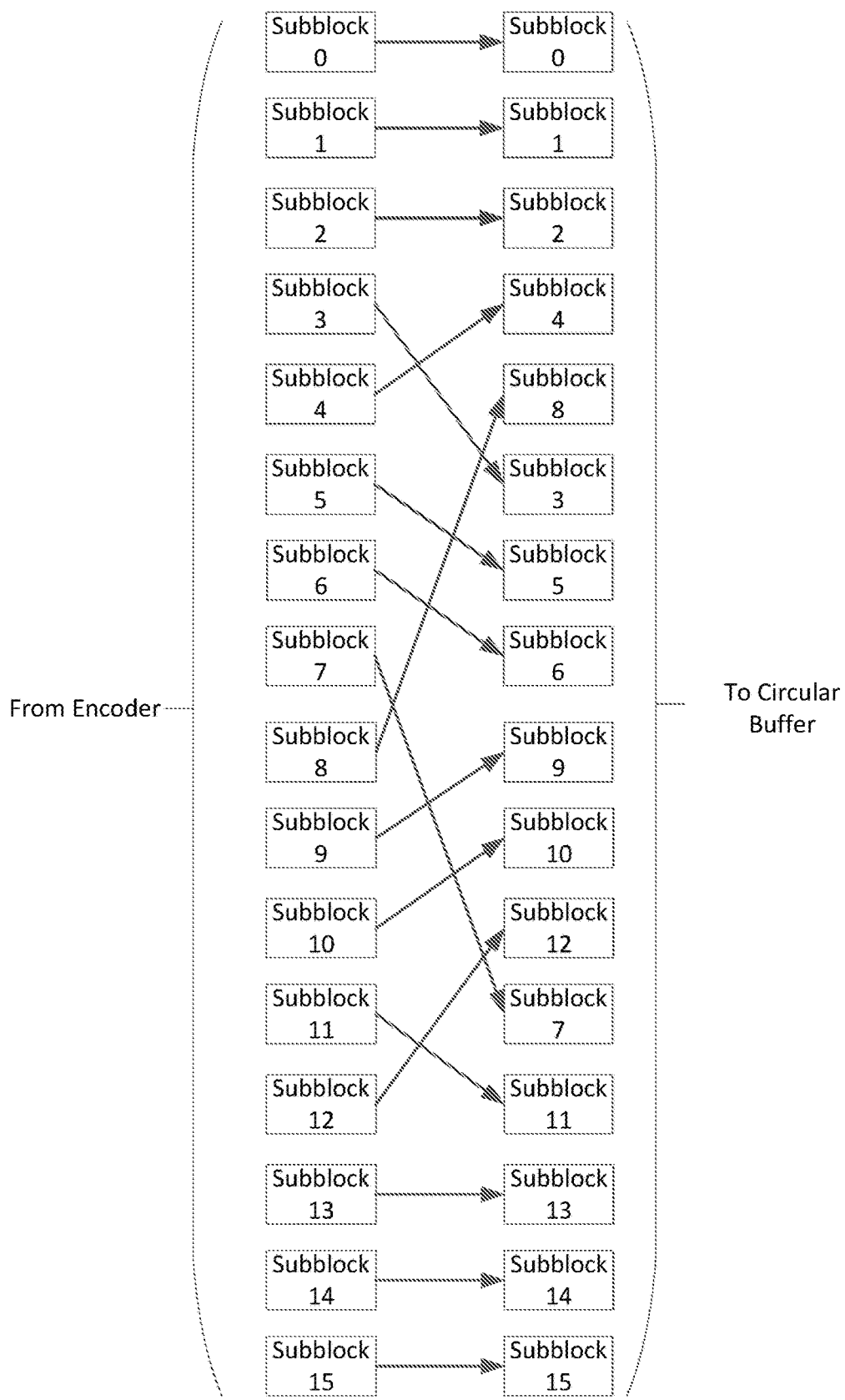
FIG. 22 illustrates an exemplary sub-block wise interleaver for polar code rate matching with 16 sub-blocks.

FIG. 22 illustrates an example of a sub-block interleaver with 16 sub-blocks using $$B \times d_1\left(\frac{i}{B}\right) + d_2(\mathrm{mod}(i, B))$$

index. The polar coded bits may be partitioned (e.g., evenly partitioned) to 16 sub-blocks. These 16 sub-blocks may be interleaved based on the interleaver pattern, Pattern 2, as described herein. Based on Pattern 2, these sub-blocks may be re-arranged in the order of [0, 1, 2, 4, 8, 3, 5, 6, 9, 10, 12, 7, 11, 13, 14, 15].

The interleaver pattern Pattern 1 may be extended to 16 sub-blocks, by doubling each sub-block to two sub-blocks. For example, the middle 8 sub-blocks may be interleaved or interlaced while the top 4 sub-blocks and the bottom 4 sub-blocks may remain unchanged. The interleaver pattern may be as follows:

$d_1[0] = 0, d_1[1] = 1, d_1[2] = 2, d_1[3] = 3, d_1[4] = 4, d_1[5] = 8,$ $d_1[6] = 5, d_1[7] = 9, d_1[8] = 6, d_1[9] = 10, d_1[10] = 7,$ $d_1[11] = 11, d_1[12] = 12, d_1[13] = 13, d_1[14] = 14, d_1[15] = 15.$

The interleaver pattern Pattern 1 as described herein could be extended to 32 sub-blocks, by four times each sub-block. For example, the middle 16 sub-blocks may be interlaced while the top 8 sub-blocks and the bottom 8 sub-blocks may remain unchanged. The interleaver pattern may be as follows:

$d_1[0] = 0, d_1[1] = 1, d_1[2] = 2, d_1[3] = 3, d_1[4] = 4, d_1[5] = 5,$ $d_1[6] = 6, d_1[7] = 7, d_1[8] = 8, d_1[9] = 16, d_1[10] = 9, d_1[11] = 17,$ $d_1[12] = 10, d_1[13] = 18, d_1[14] = 11, d_1[15] = 19, d_1[16] = 12,$ $d_1[17] = 20, d_1[18] = 13, d_1[19] = 21, d_1[20] = 14, d_1[21] = 22,$ $d_1[22] = 15, d_1[23] = 23, d_1[24] = 24, d_1[25] = 25, d_1[26] = 26,$ $d_1[27] = 27, d_1[28] = 28, d_1[29] = 29, d_1[30] = 30, d_1[31] = 31.$

Figure 23A:
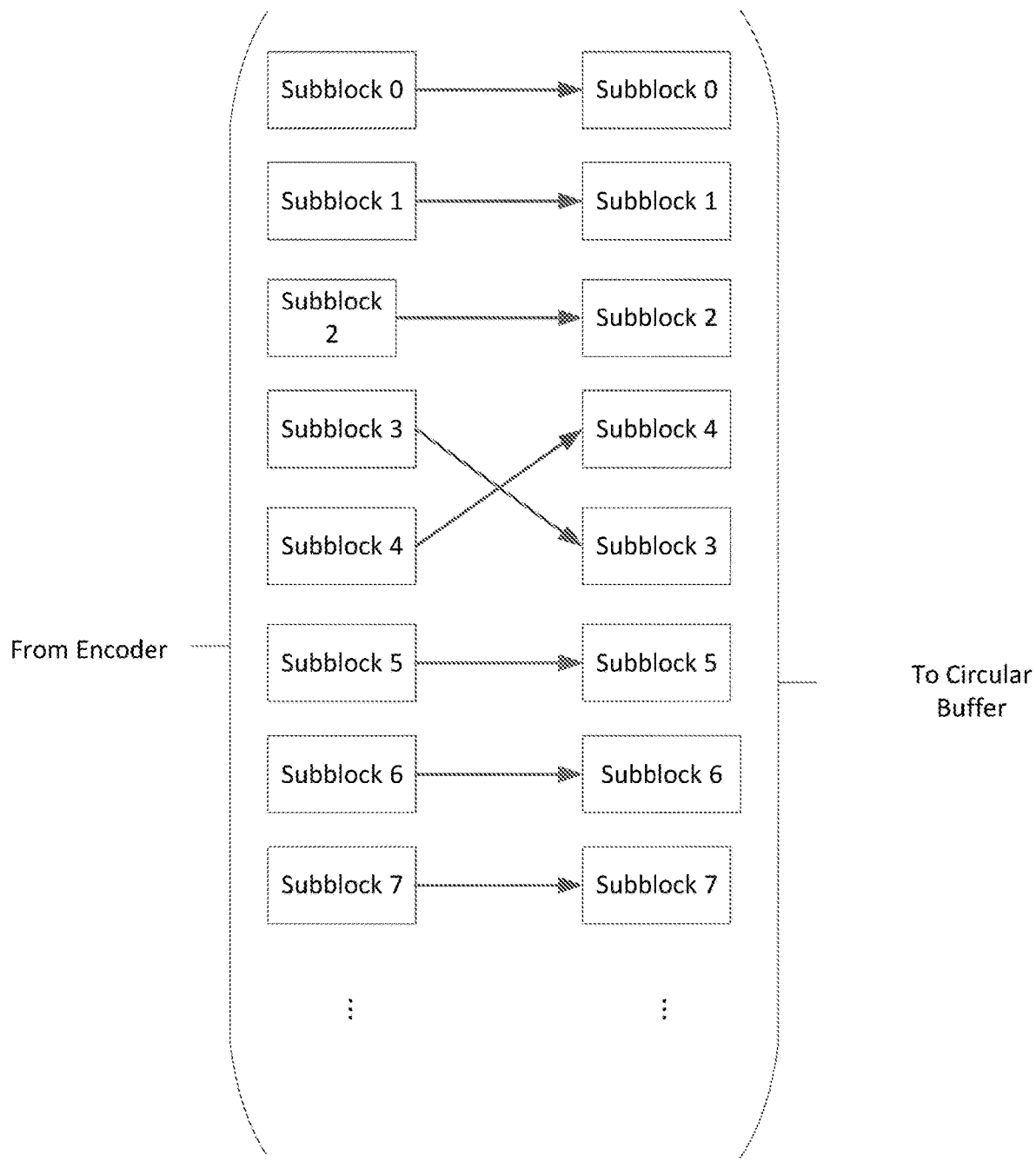
FIGS. 23A-23C illustrate an exemplary sub-block wise interleaver for polar code rate matching with 32 sub-blocks.
Figure 23B:
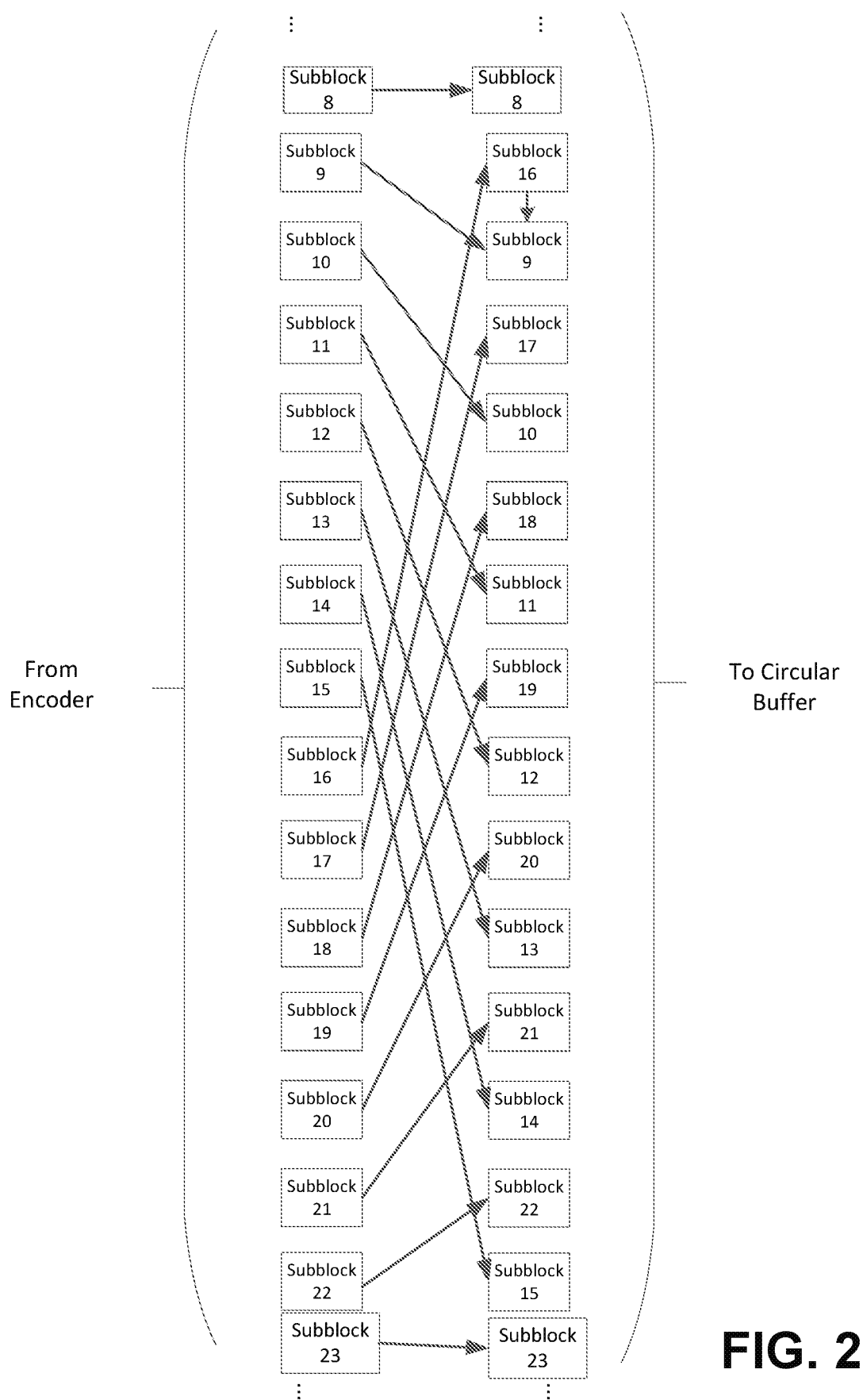
Figure 23C:
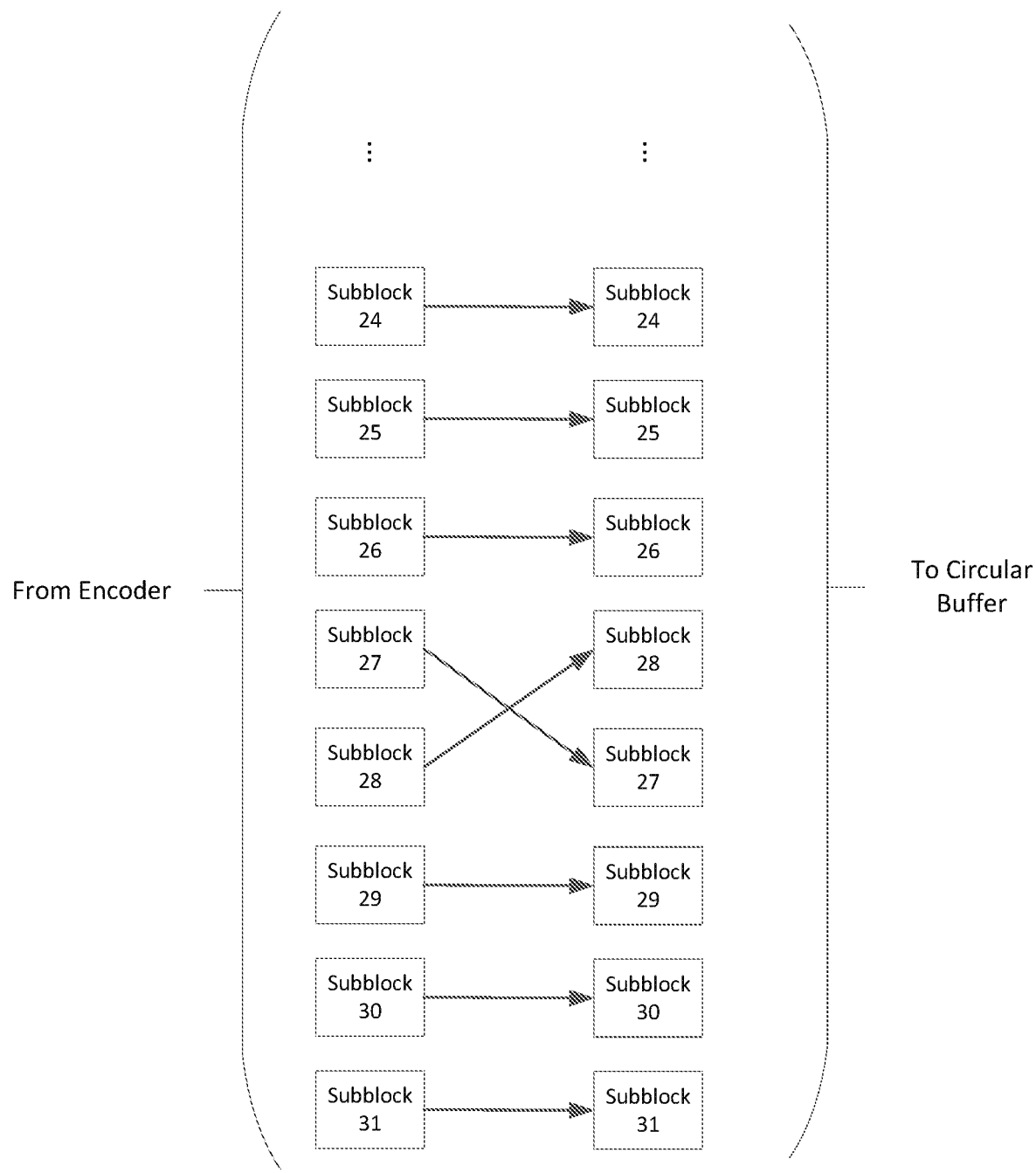

FIGS. 23A-23C illustrate an example of a sub-block interleaver with 32 sub-blocks using $$B \times d_1\left(\frac{i}{B}\right) + d_2(\mathrm{mod}(i, B))$$

index. In this example, the middle 16 sub-blocks may be interlaced while the top 8 sub-blocks and the bottom 8 sub-blocks may be directly copied from the interleaver pattern Pattern 1, as described herein. This provides the interleaver pattern, Pattern 3 as follows:

$d_1[0] = 0, d_1[1] = 1, d_1[2] = 2, d_1[3] = 4, d_1[4] = 3, d_1[5] = 5,$ (Pattern 3)

$d_1[6] = 6, d_1[7] = 7, d_1[8] = 8, d_1[9] = 16, d_1[10] = 9,$ $d_1[11] = 17, d_1[12] = 10, d_1[13] = 18, d_1[14] = 11, d_1[15] = 19,$ $d_1[16] = 12, d_1[17] = 20, d_1[18] = 13, d_1[19] = 21,$ $d_1[20] = 14, d_1[21] = 22, d_1[22] = 15, d_1[23] = 23,$ $d_1[24] = 24, d_1[25] = 25, d_1[26] = 26, d_1[27] = 28,$ $d_1[28] = 27, d_1[29] = 29, d_1[30] = 30, d_1[31] = 31.$

The Pattern 3 may be expressed in a table format as indicated in Table 5.

TABLE 5

| i | $d_1(i)$ |
|---|---|
| 0 | 0 |
| 1 | 1 |
| 2 | 2 |
| 3 | 4 |

TABLE 5-continued

| i | $d_1(i)$ |
|---|---|
| 4 | 3 |
| 5 | 5 |
| 6 | 6 |
| 7 | 7 |
| 8 | 8 |
| 9 | 16 |
| 10 | 9 |
| 11 | 17 |
| 12 | 10 |
| 13 | 18 |
| 14 | 11 |
| 15 | 19 |
| 16 | 12 |
| 17 | 20 |
| 18 | 13 |
| 19 | 21 |
| 20 | 14 |
| 21 | 22 |
| 22 | 15 |
| 23 | 23 |
| 24 | 24 |
| 25 | 25 |
| 26 | 26 |
| 27 | 28 |
| 28 | 27 |
| 29 | 29 |
| 30 | 30 |
| 31 | 31 |

Use of an interleaver after rate matching may be provided. A group base channel interleaver may be provided. Output coded bits generated by a polar encoder may be interleaved. For example, the coded bits may be interleaved after application of a rate matching function and/or before modulation. An exemplary interleaving operation may provide improved block error ratio (BLER) performance, for example, where high order modulation may be in use or fading channels may be present.

Input information bits may correspond to output coded bits. Input information bits may have an associated reliability order. Rate matched output coded bits may be ordered based on such a reliability order associated with respective corresponding input information bits.

$c(i)$ may be a value of i-th encoded and rate matched bits, where i=0, 1, . . . , N–M may indicate bit indexes of output coded bits (e.g., natural order, serial indexing from a starting point). M may be a rate matching parameter that may be a number of bits punctured or shortened. In an example, rate matching may be performed by repetition. In such examples, M may be negative. When output bits are repeated, an index order of such output bits may be associated with a same index order as that associated with the original repeated bits.

$cr(j)$ may be a value of (N–M–1–j)-th reliable output coded bits and j=0, 1, . . . , N–M may indicate a reliability index of output coded bits. The reliability order of output coded bits may follow a reliability order of corresponding input bits. When corresponding input bits may be frozen bits and/or parity bits, an associated reliability order may be a relatively low and/or a lowest reliability order. When output bits may be repeated, an associated reliability order may be a same reliability order as that associated with original repeated bits.

In an example, $Q=2^q$-ary modulation may be used. A number of input bits provided for modulation may be q. Such bits may be used to generate a modulation symbol. There may be a difference in reliability among such q bits. For example, if q=4, first two bits may be classified as more reliable than the last two bits in LTE 16 QAM. Two levels of reliability may be provided for bits that are modulated using 16 QAM.

In an example of using 64 QAM (e.g., where q=6), bits may be classified into three levels of reliability. First two bits may be classified as most reliable, the next or second two bits may be classified as having lower reliability than the first two bits, and the last two bits may be classified as having the least reliability. $2^q$-ary modulation may have q/2 levels of reliability. A number and quality of levels of reliability may be utilized.

In an example, $c(i)$, i=0, . . . , N–M bits may be divided into q/2 blocks. The M bits may be evenly divided. BL(k) may indicate a k-th block. After division, each block may be interleaved. An interleaver may be a random interleaver, a block interleaver, a bit reversal interleaver, a split natural interleaver, etc. The effect of an interleaver selected used in rate matching may be counted (see, e.g., FIG. 7 and accompanying description as provided herein). In an example utilizing a random interleaver, an interleaving pattern may be generated from a pseudo-random sequence that may include, e.g., a gold sequence as for example used in LTE technologies. In case of a block interleaver, the same or different interleaver depths may be applied to a block interleaver.

In an example, $cr(j)$, j=0, . . . , N–M bits may be divided into q/2 blocks. For example, the bits may be divided evenly. Each such block may be indicated by BL(k). Each block, e.g., after division, may be interleaved using one or more interleavers. Each BL(k) block, e.g., after interleaving, may be mapped to input bits to be provided for modulation that may be associated with a specific reliability level.

Figure 24:
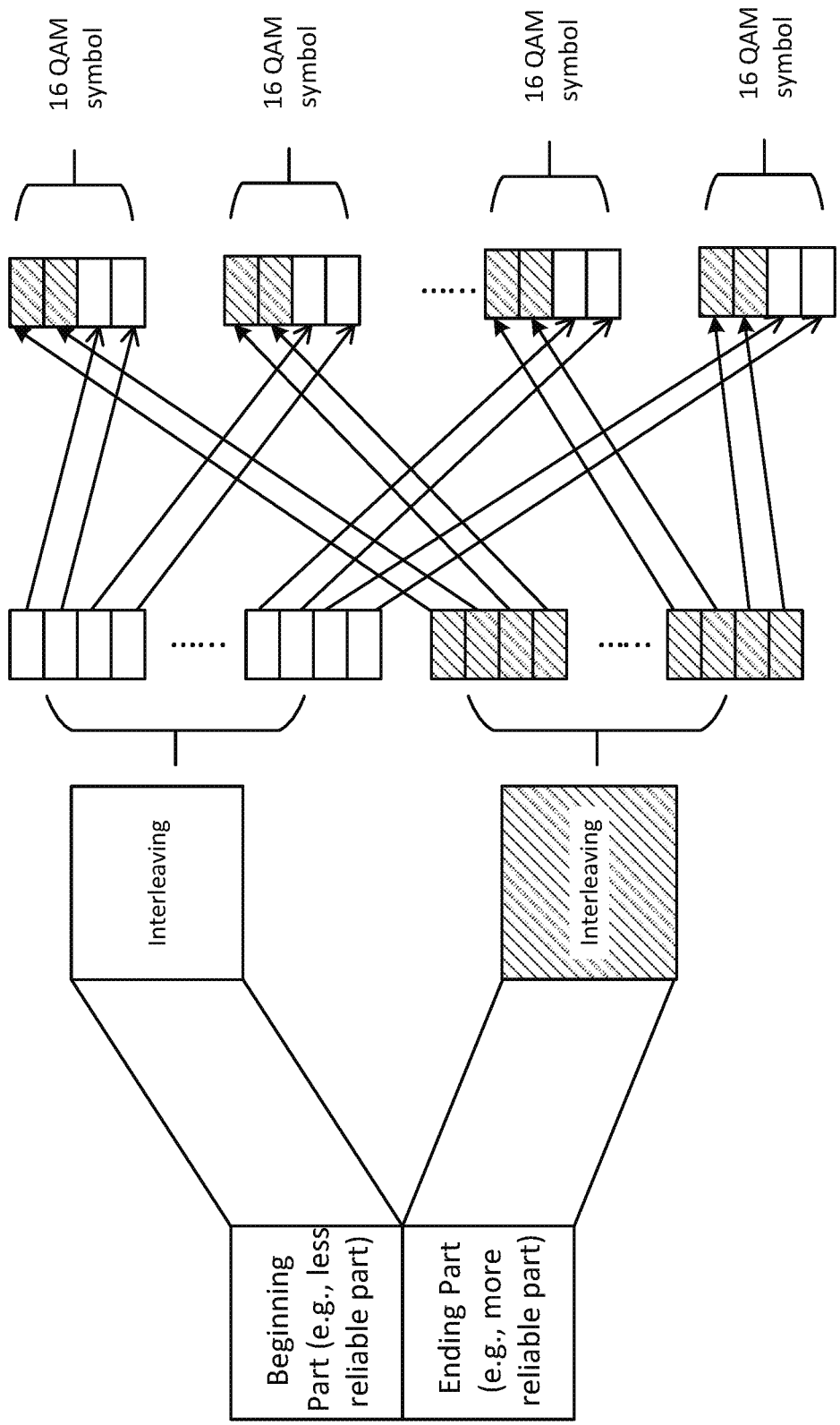
FIG. 24 illustrates an exemplary 16 quadrature amplitude modulation (QAM) modulation.

Interleaved bits, for example, from the q/2 blocks described herein, may be mapped to modulation symbols. In an example, bits with high reliability provided for modulation may be associated with rate matched coded bits with high reliability (e.g., that may correspond to the input bits with high reliability). In an example, bits with low reliability provided for modulation may be associated with rate matched coded bits with low reliability (e.g., that may correspond to the input bits with low reliability). A k-th component bit of a modulation symbol may be associated with BL(k). FIG. 24 illustrates an exemplary implementation of such an example using 16 QAM, where shaded boxes may indicate more reliable bits and unshaded boxes may indicate less reliable bits.

Figure 25:
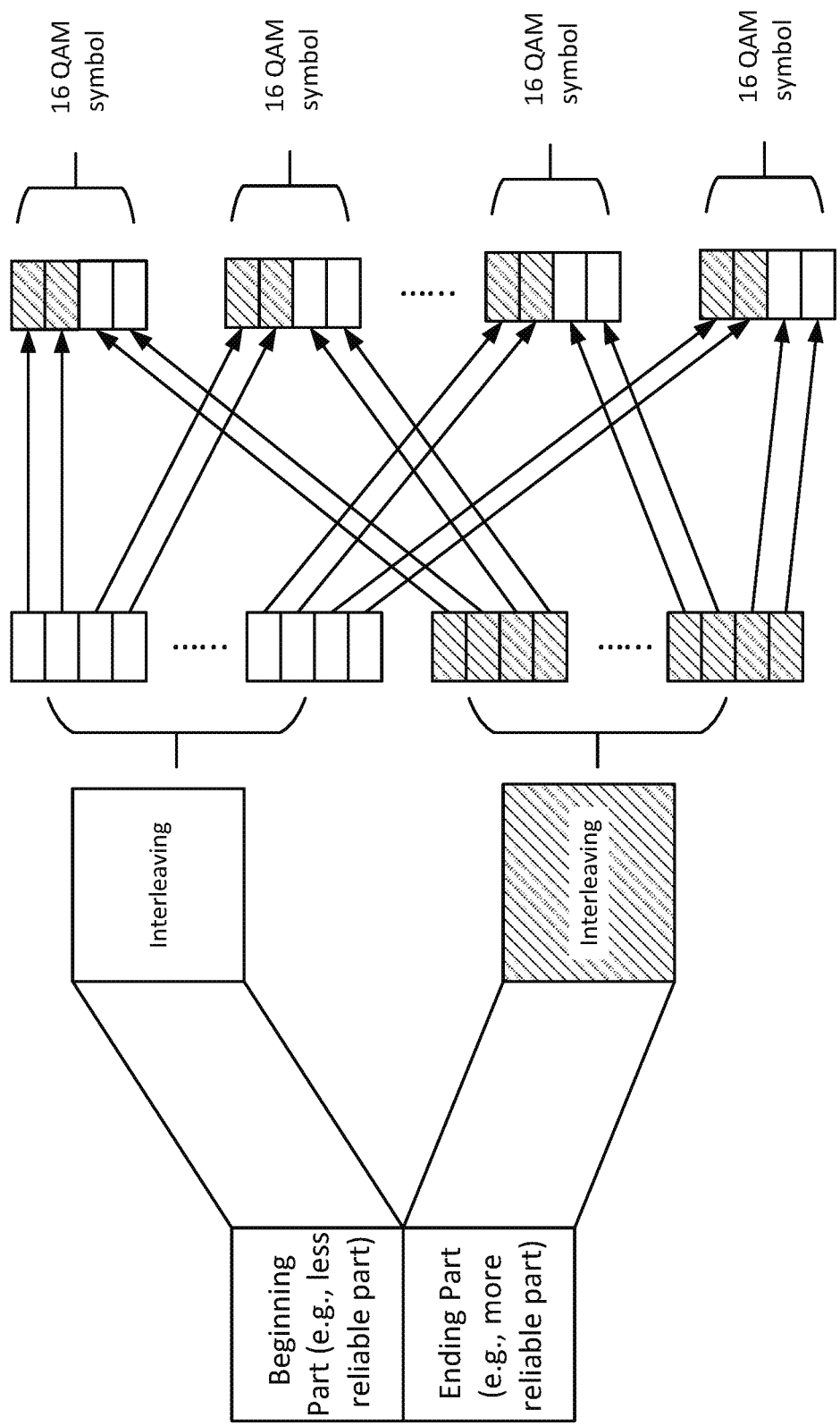
FIG. 25 illustrates an exemplary 16 QAM modulation.

In an example, relatively less reliable bits provided for modulation may be associated with relatively more reliable rate matched coded bits (e.g., the bits that may correspond to more reliable input bits). In an example, relatively more reliable bits provided for modulation may be associated with relatively less reliable input bits (e.g., the bits that may correspond to less reliable input bits). A k-th component bit of a modulation symbol may be associated with BL (q/2–k/2). FIG. 25 illustrates an exemplary implementation of such an example using 16 QAM, where shaded boxes may indicate more reliable bits and unshaded boxes may indicate less reliable bits. These representations may apply to one or more of encoded bits and component bits of a modulation symbol examples. In other examples 64 QAM modulation and/or 256 QAM modulation may be used.

Figure 26:
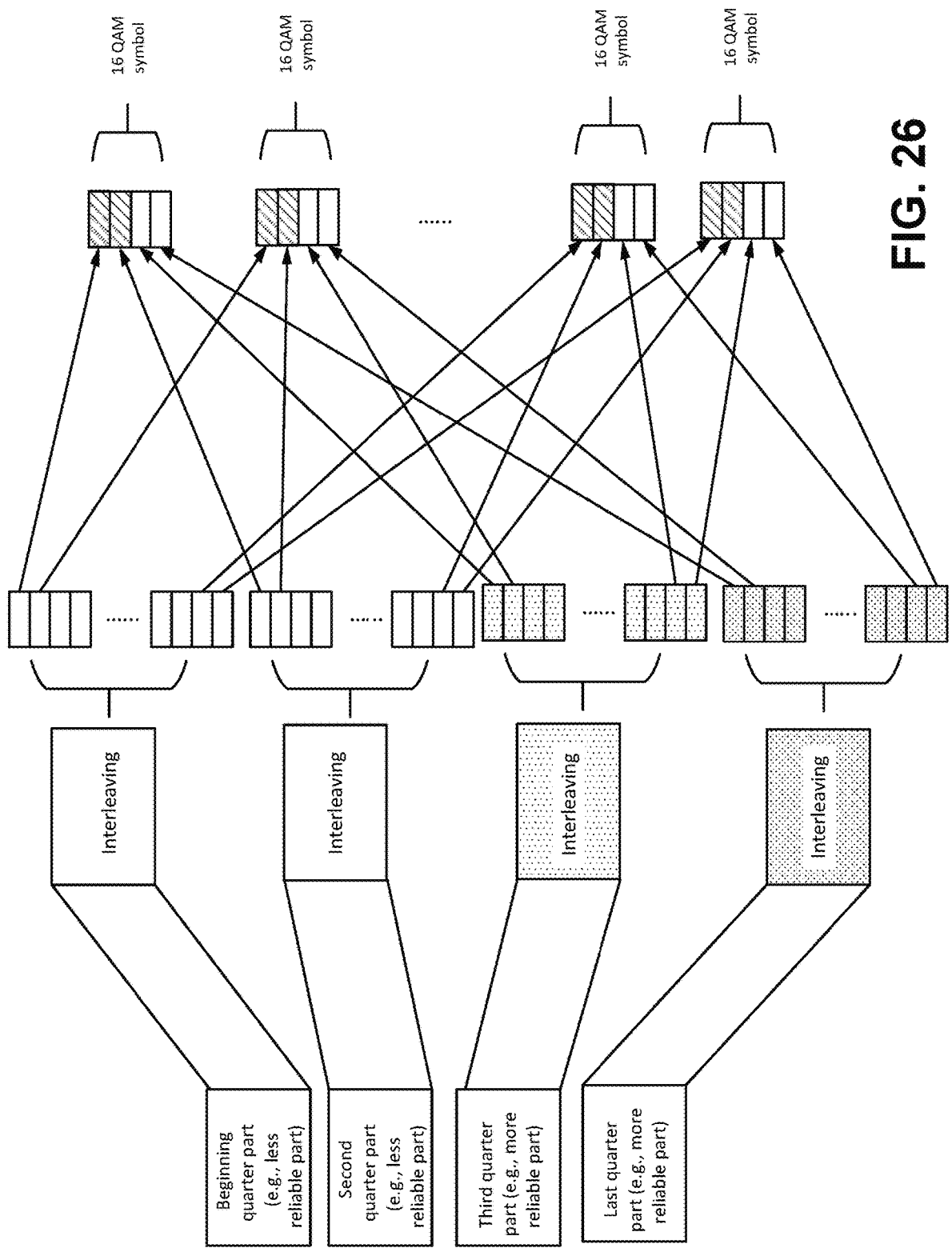
FIG. 26 illustrates an exemplary 16 QAM modulation with 4 partitions.
Figure 27:
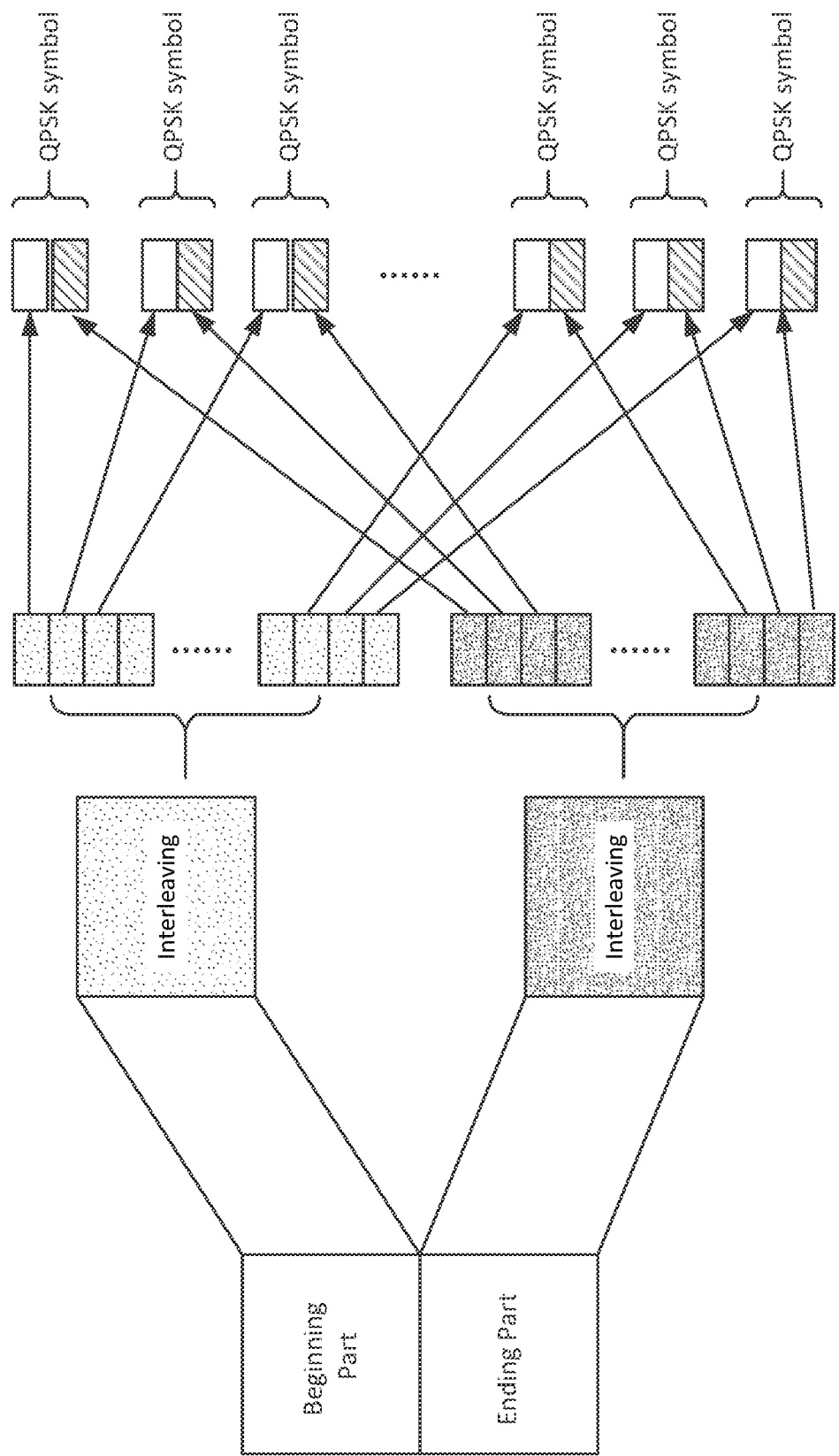
FIG. 27 illustrates an exemplary quadrature phase shift keying (QPSK) modulation with 2 partitions.
Figure 28:
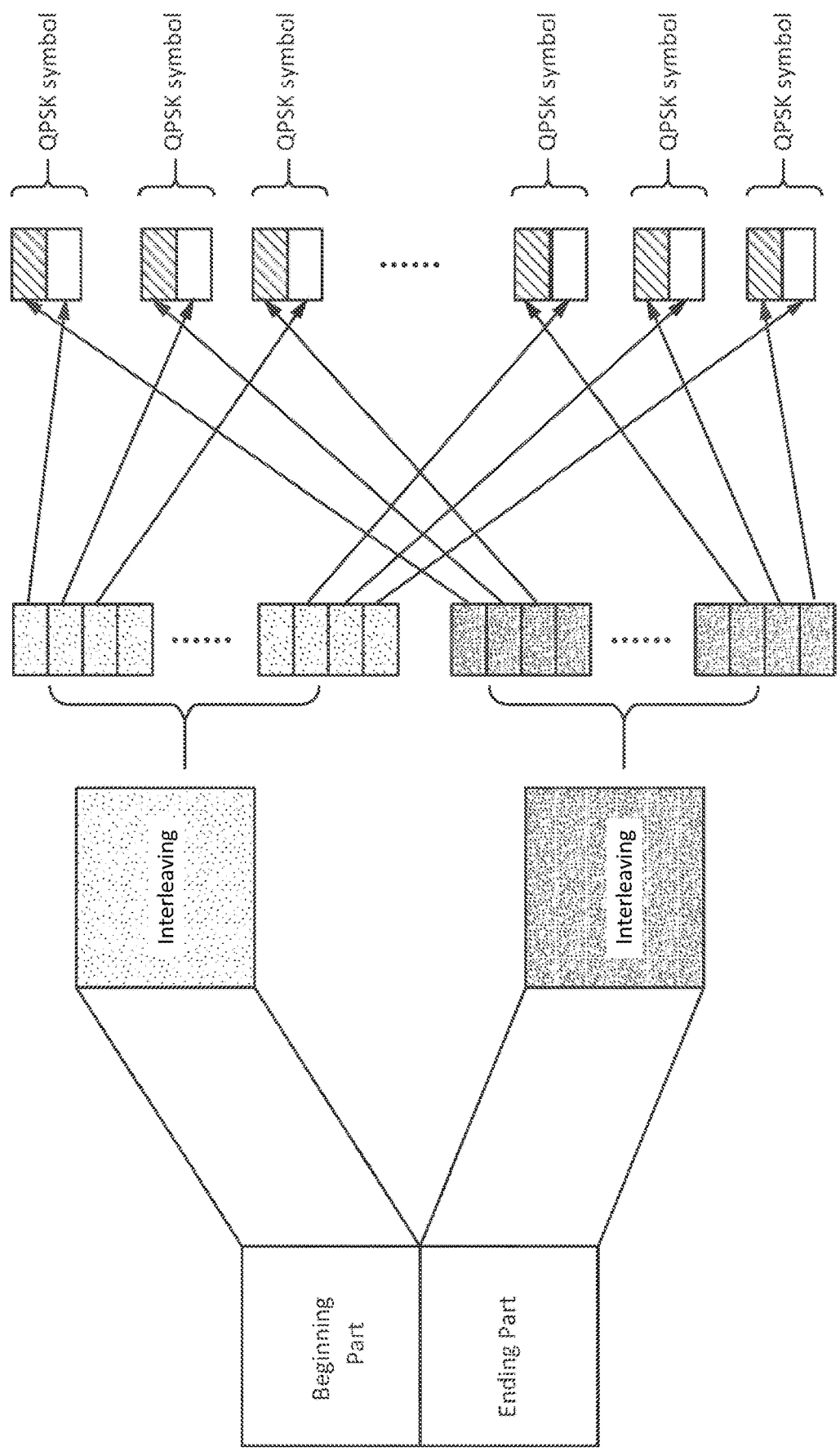
FIG. 28 illustrates an exemplary QPSK modulation with 2 partitions.
Figure 29:
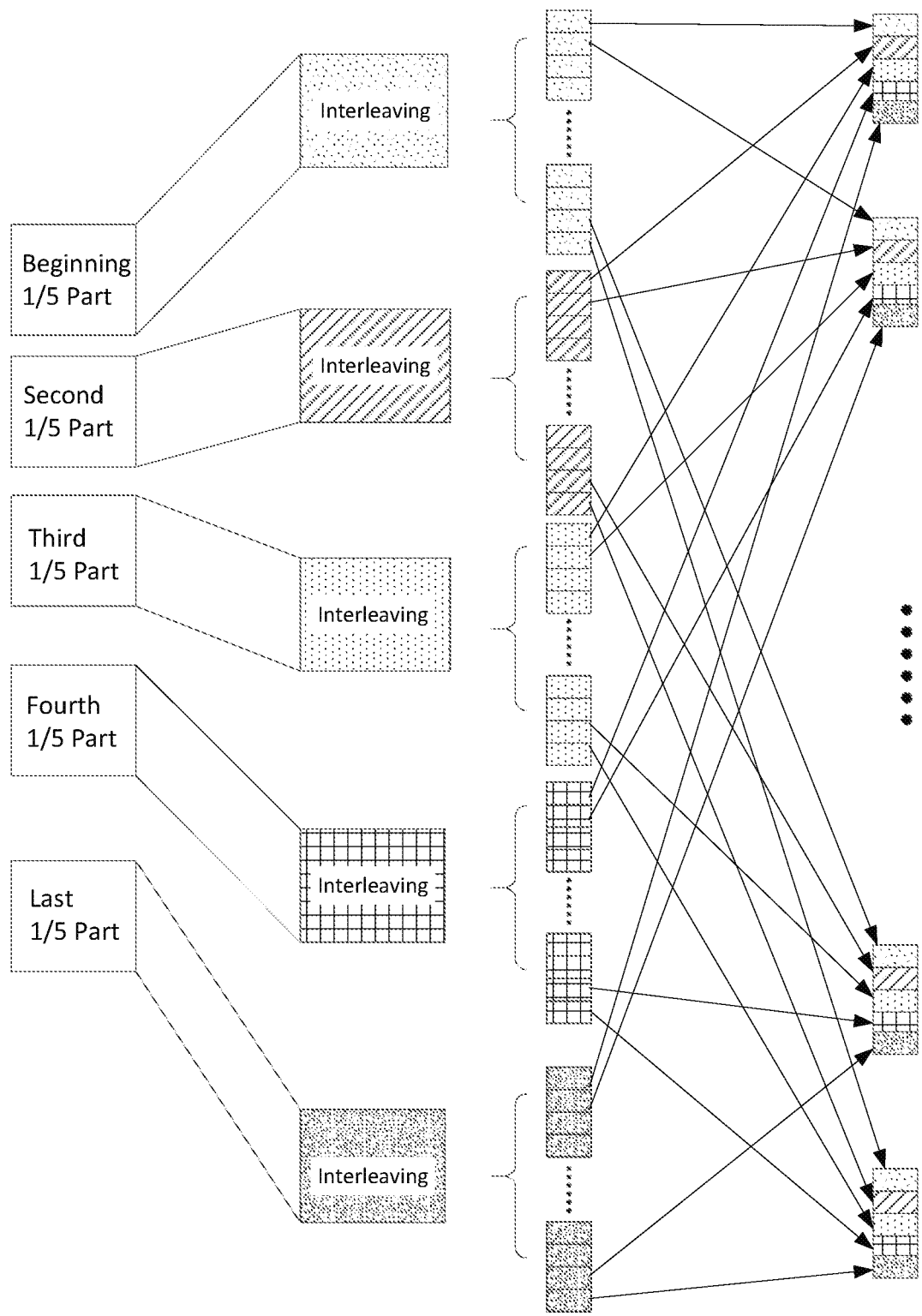
FIG. 29 illustrates an exemplary QPSK modulation with 5 partitions.

In an example, coded and rate matched bits may be partitioned into q/2 blocks. In an example, coded and rate matched bits may be partitioned into q blocks. FIG. 26 illustrates an implementation of such an example using 16 QAM modulation and four partitions. As illustrated in FIG. 26, the shaded boxes may indicate more reliable bits and unshaded boxes may indicate less reliable bits. FIG. 27 illustrates an example QPSK modulation with two partitions. FIG. 28 illustrates an example QPSK modulation with two partitions. A number of partitions for $2^q$-ary modulation may comprise a number of partitions, e.g., (q−1) partitions, or prime number of partitions, etc. FIG. 29 illustrates an example QPSK modulation with five partitions. The coded and rate matched bits may or may not be partitioned evenly. For example, the blocks may have different numbers of bits.

Figure 30:
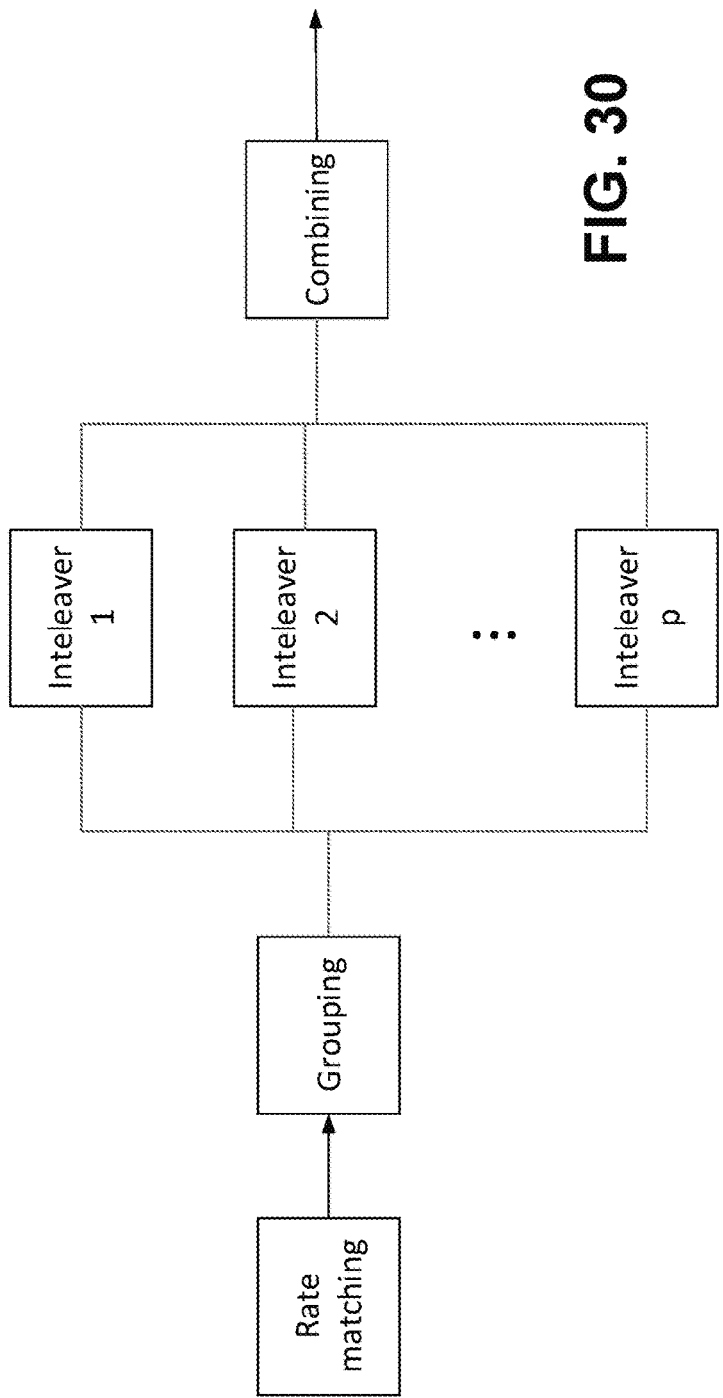
FIG. 30 illustrates an exemplary channel interleaver.

FIG. 30 illustrates an exemplary channel interleaver for physical channels. Using this parallel block interleaver operations may be applied to uplink and/or downlink. Suppose the output of the rate matching may include M bits $u_1, \ldots, u_M$. These bits may be partitioned to several groups. The number of groups may be denoted by p. For simplicity, M may be dividable by p. If M is not dividable by p, NULL bits or dummy bits may be inserted into the output of the rate matching such that the total number of bits is dividable by p.

The bits may be grouped based on sequential order. The first group may include $u_1, u_2, \ldots, u_{M/p}$, the second group may include $$u_{\frac{M}{p}+1}, u_{\frac{M}{2}+2}, \ldots, u_{\frac{2M}{p}}, \ldots,$$

and the p-th group may include $$u_{M-\frac{M}{p}+1}, \ldots, u_M.$$

The bits may be grouped based on interlacing order. The first group may include $u_1, u_{p+1}, \ldots, u_{M-p+1}$, the second group may include $u_2, u_{p+2}, \ldots, u_{M-p+2}, \ldots$, and the p-th group may include $u_p, u_{2p}, \ldots, u_M$. The bits may be grouped based on subgroup-wise operation. The subgroups $v_1, \ldots, v_q$ may be generated, where a subgroup may include several bits from $u_1, \ldots, u_M$. Subgroups $v_1, \ldots, v_q$ may be treated as the bits $u_1, \ldots, u_M$ in the operations described herein.

The grouped bits may be passed to its corresponding interleaver. The interleavers may be block interleavers the same depth, or could be block interleavers with different depths, or could be any interleaver. In an example of a block interleaver, assuming $d_1, d_2, \ldots, d_p$ to be the depth of these p block interleavers, some or all of $d_i$ may have different values. The depth value $d_i$ may be a prime number. Other values of $d_i$ may be possible.

The interleaved bits from p groups may be combined into a joint output. The grouped interleaved bits may be combined in a group sequential order. For example, the first group interleaved bits may be generated first, the second group interleaved bits may be generated second, etc. The grouped interleaved bits may be combined in group order with a certain pattern. For example, the second group interleaved bits may be generated first, the 5-th group interleaved bits may be generated second, etc. The grouped interleaved bits may be combined in interlacing order. For example, the order may be: the first bit from the first group, the first bit from the second group, . . . , the first bit from the last group, the second bit from the first group, the second bit from the second group, . . . , the second bit from the last group, the third bit from the first group, . . . . The grouped interleaved bits may be combined in interlacing order jointly, for example, using a group order.

Figure 31:
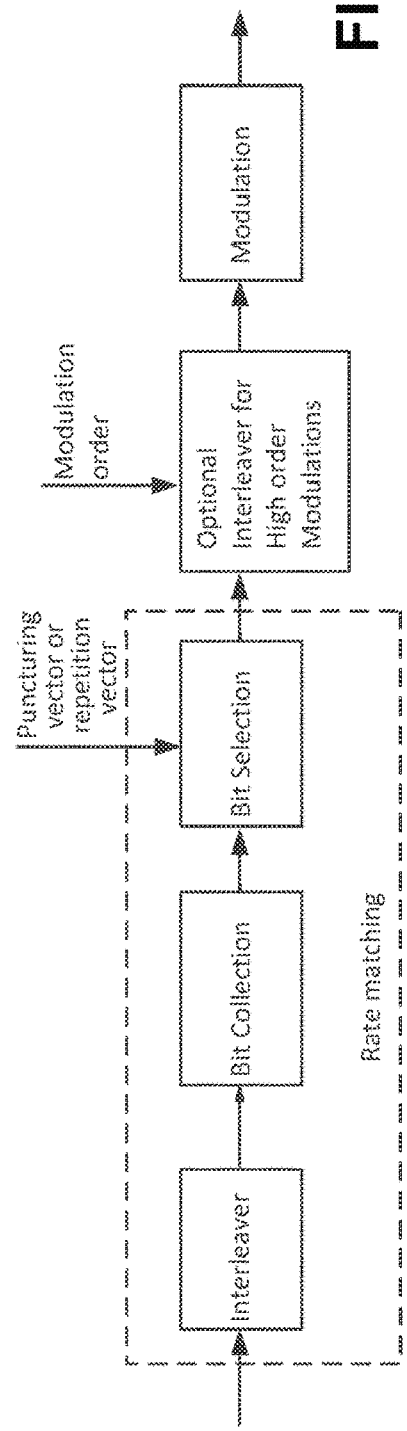
FIG. 31 illustrates an example of interleaving.

FIG. 31 illustrates an exemplary interleaving that may be performed between rate matching and modulation. In an example, interleaving may be first be performed within a rate matching block. Interleaving performed after a rate matching block may take into account interleaving performed as part of a rate matching block or function.

An example interleaver design may depend on a modulation order. A row-column or block interleaver performing interleaving after a rate matching block or function for high order modulation and performance in a fading channel may be such that a number of rows may be equal to a modulation order or equal to a modulation order minus one.

Figure 32:
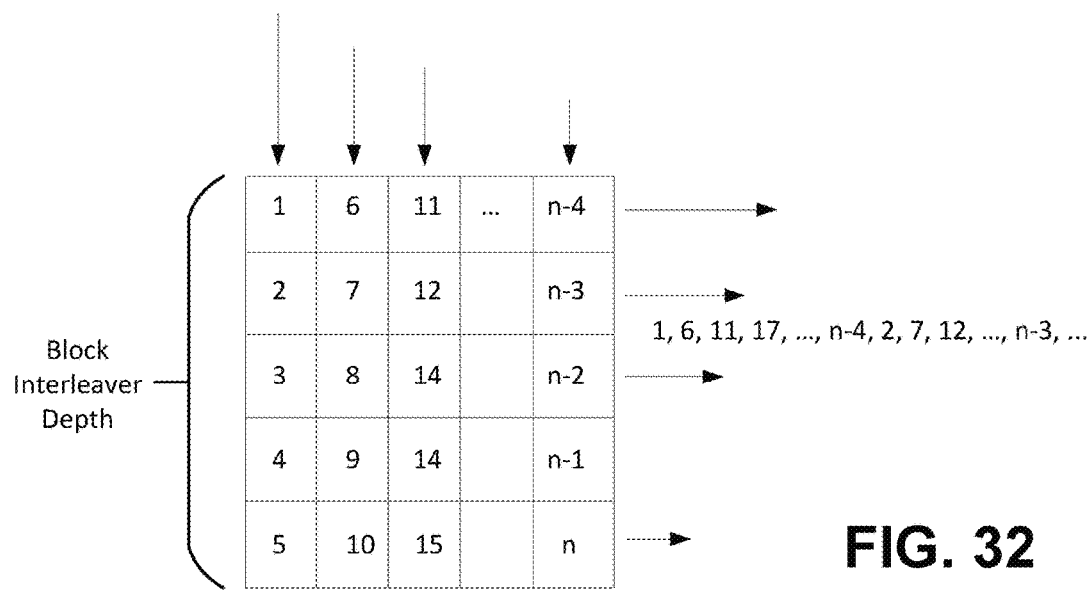
FIG. 32 illustrates an exemplary block interleaver with depth 5.

The block interleaver after the rate matching block may be described by the depth of the rate matching block. FIG. 32 illustrates an example of a block interleaver with a depth of 5 (e.g., the number of rows of the block interleaver). The depth of the block interleaver may depend on the modulation order. For example, for a 64 QAM modulation, a block interleaver with a depth 7 may not be adequate (e.g., may not render a desired performance). For a 16 QAM modulation, a block interleaver with a depth of 7 may be adequate (e.g., may render a desired performance).

Figure 33:
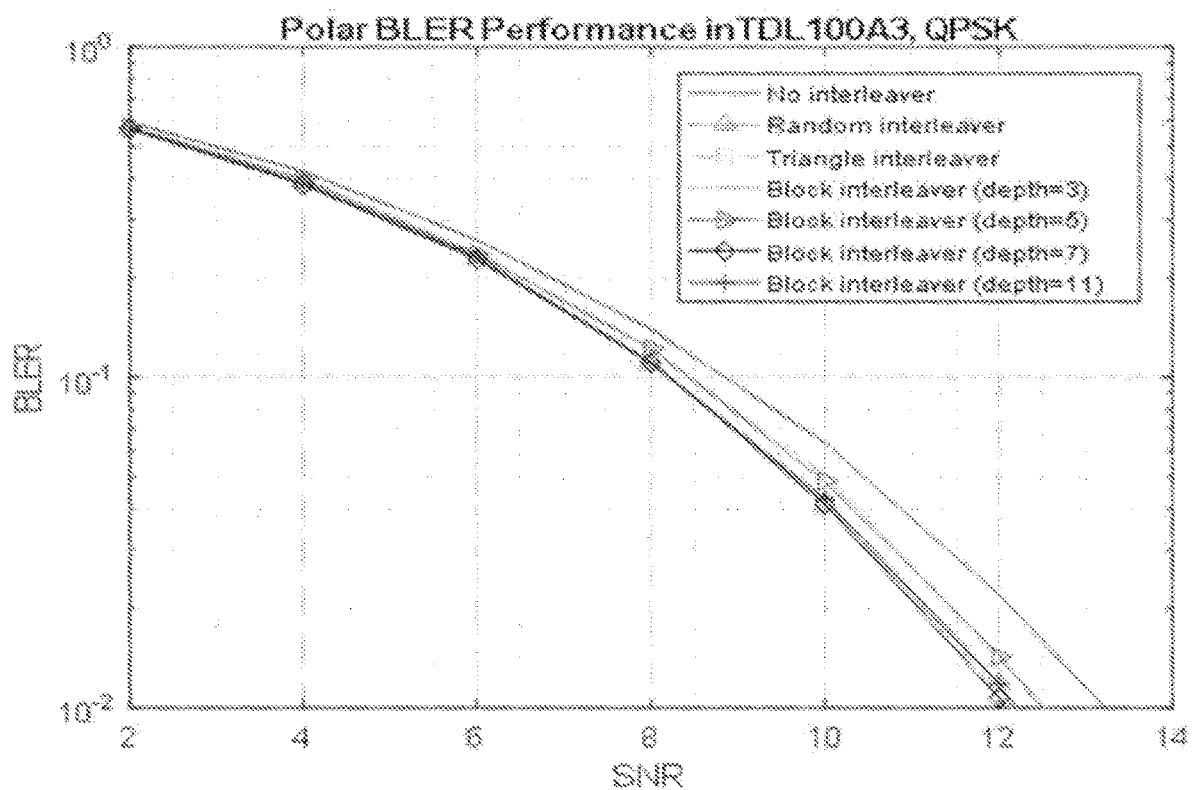
FIG. 33 illustrates an exemplary performance comparison of different interleavers at tapped delay line (TDL)-A channel model with delay spread 100 ns, ½ code rate, and QPSK modulation.
Figure 34:
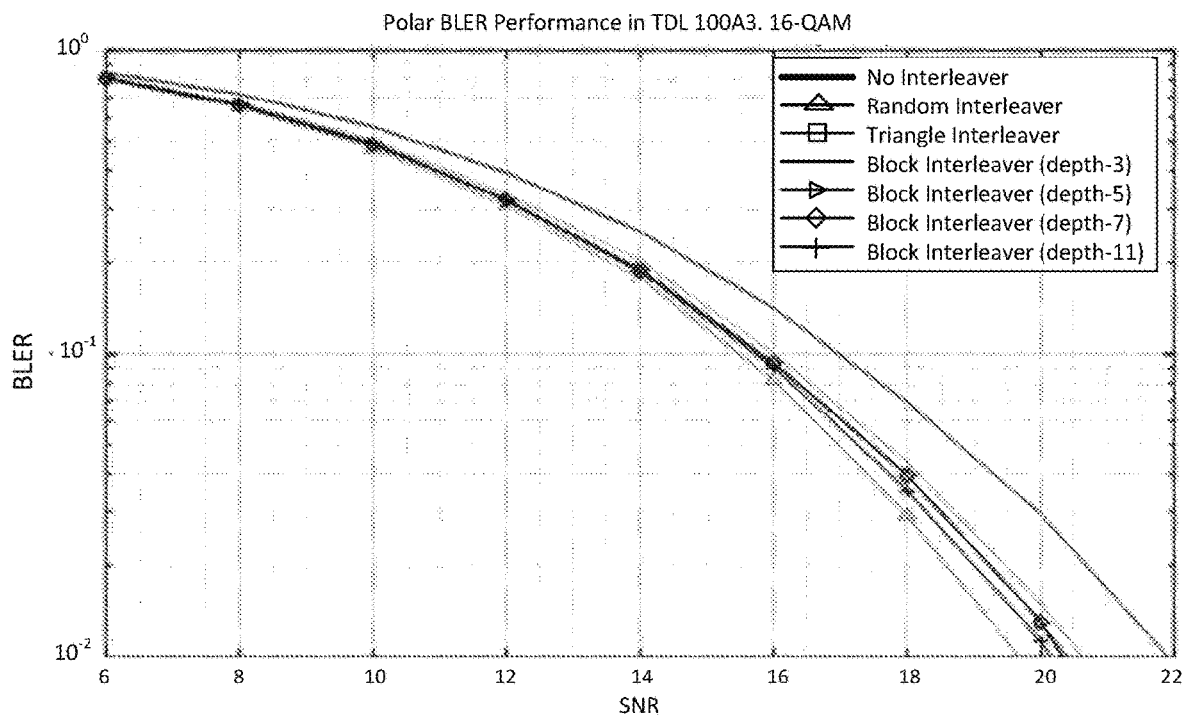
FIG. 34 illustrates an exemplary performance comparison of different interleavers at TDL-A channel model with delay spread 100 ns, ½ code rate, and 16 QAM modulation.
Figure 35:
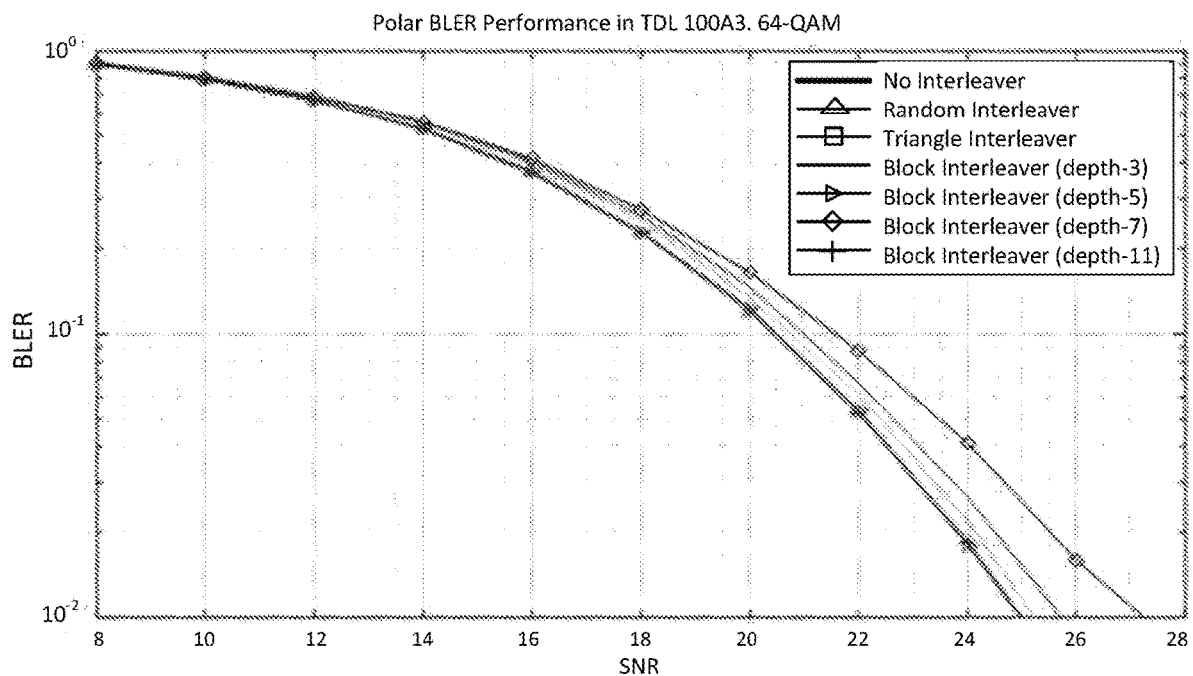
FIG. 35 illustrates an exemplary performance comparison of different interleavers at TDL-A channel model with delay spread 100 ns, ½ code rate, and 64 QAM modulation.

As is illustrated in FIG. 33. FIG. 34, and FIG. 35, a block interleaver with a depth of 11 may be adequate in a QPSK, 16 QAM, and/or 64 QAM modulation orders, and in an AWGN channel and/or fading channel. A depth of 11 block interleaver may follow FIG. 32 with the number of rows equal to 11. A unified block interleaver with a fixed depth may be used for each of the supported modulation orders. For example, a unified block interleaver with a fixed depth may be used for each of the supported modulation orders for simplicity. Each of the supported modulations and/or modulation orders may include modulations and/or modulation orders where a gain may be achieved by using the block interleaver. The block interleaver used may include a block interleaver with a depth of 11 as the bit channel interleaver after the rate matching block for modulations, such as QPSK, 16 QAM, 64 QAM, 16 QAM, and/or 64 QAM. An example may use a block interleaver with a depth of 11 as the bit channel interleaver after the rate matching block for each of the supported modulation orders, for example, for modulations that may be higher than 64 QAM. A triangle interleaver may be used after the rate matching block, for example, to achieve a performance like that achieved by a block interleaver. A random interleaver may be used after the rate matching block to achieve a performance like that achieved by a block interleaver and/or a triangle interleaver.

A block interleaver with different depths may be used. For example, different depths based on a modulation order may be used. For example, a block interleaver with a depth of 5, a depth of 7, and/or a depth of 11 may be applied to a QPSK modulation, and/or a block interleaver with a depth of 7 and/or a depth of 11 may be applied to a 16 QAM modulation. A block interleaver with a depth of 5 and/or a depth of 11 may be applied to a 64 QAM modulation. A block interleaver with a depth of 11 may be applied to a 16 QAM modulation, and/or a block interleaver with a depth of 5 may be applied to a 64 QAM modulation.

A depth of a block interleaver may be selected and/or specified based on a code rate. For example, at a high code rate, a smaller depth may be used. At a low code rate, a larger depth may be used. In an example of ½ code rate one or more depths may be used to achieve similar block error rate performance. In an example, a depth of 3 may be used for modulation orders (e.g., all modulation orders). In an example, with a code rate of ⅙, a large depth (e.g., 11) may be used for better block error rate performance than a shorter depth (e.g., 3 or 5). In an example, a depth of a block interleaver may be selected and/or specified based on a modulation order and/or a code rate, as described herein.

If a split-natural shortening or puncturing scheme is used as a rate matching scheme, an interleaver in a rate matching block or function may be designed such that coded bits may be equally portioned to four groups. A second and third groups of the four groups may be interlaced.

Figure 36:
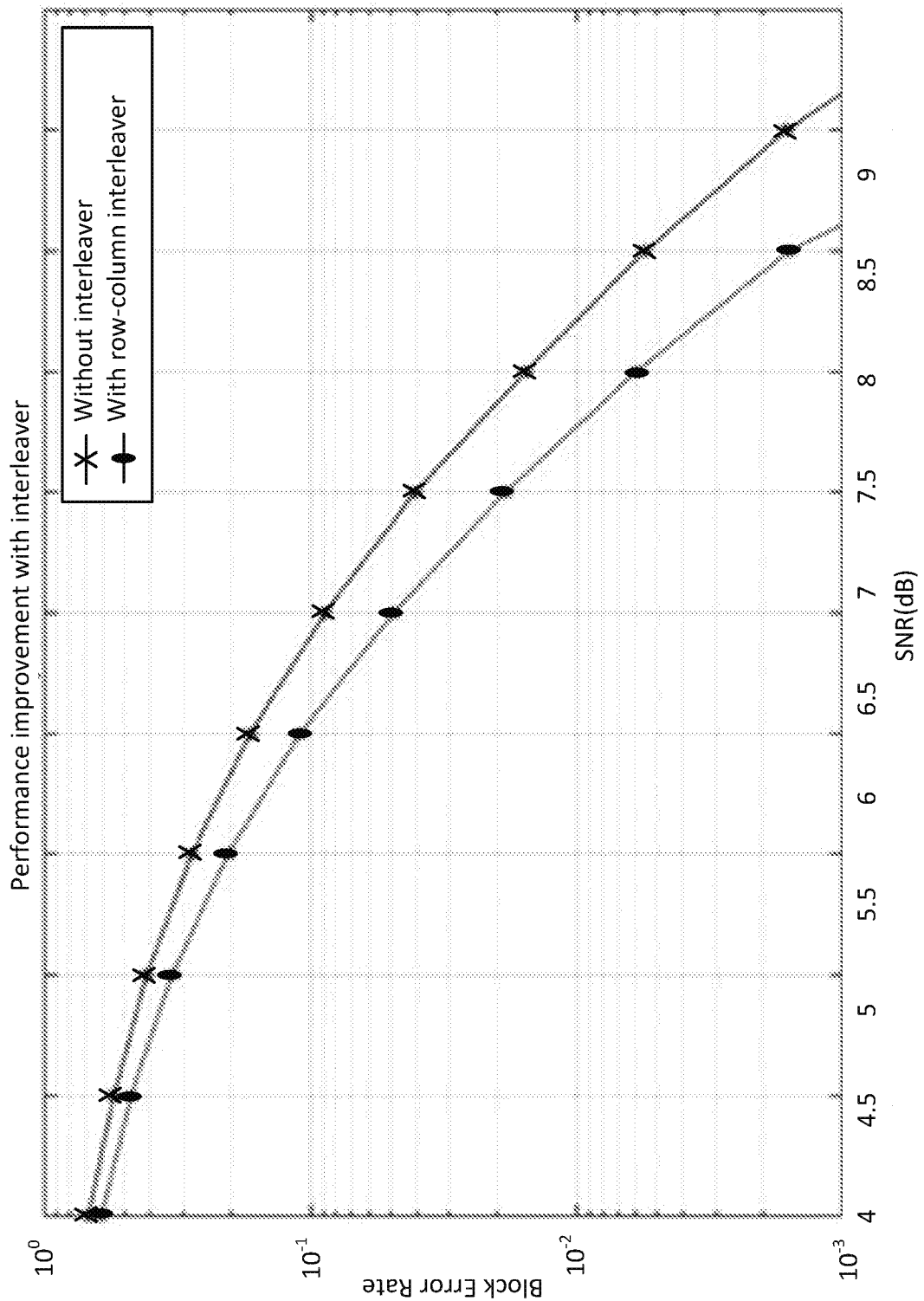
FIG. 36 illustrates an example of a performance improvement that may be seen using a row-column interleaver.
Figure 37:
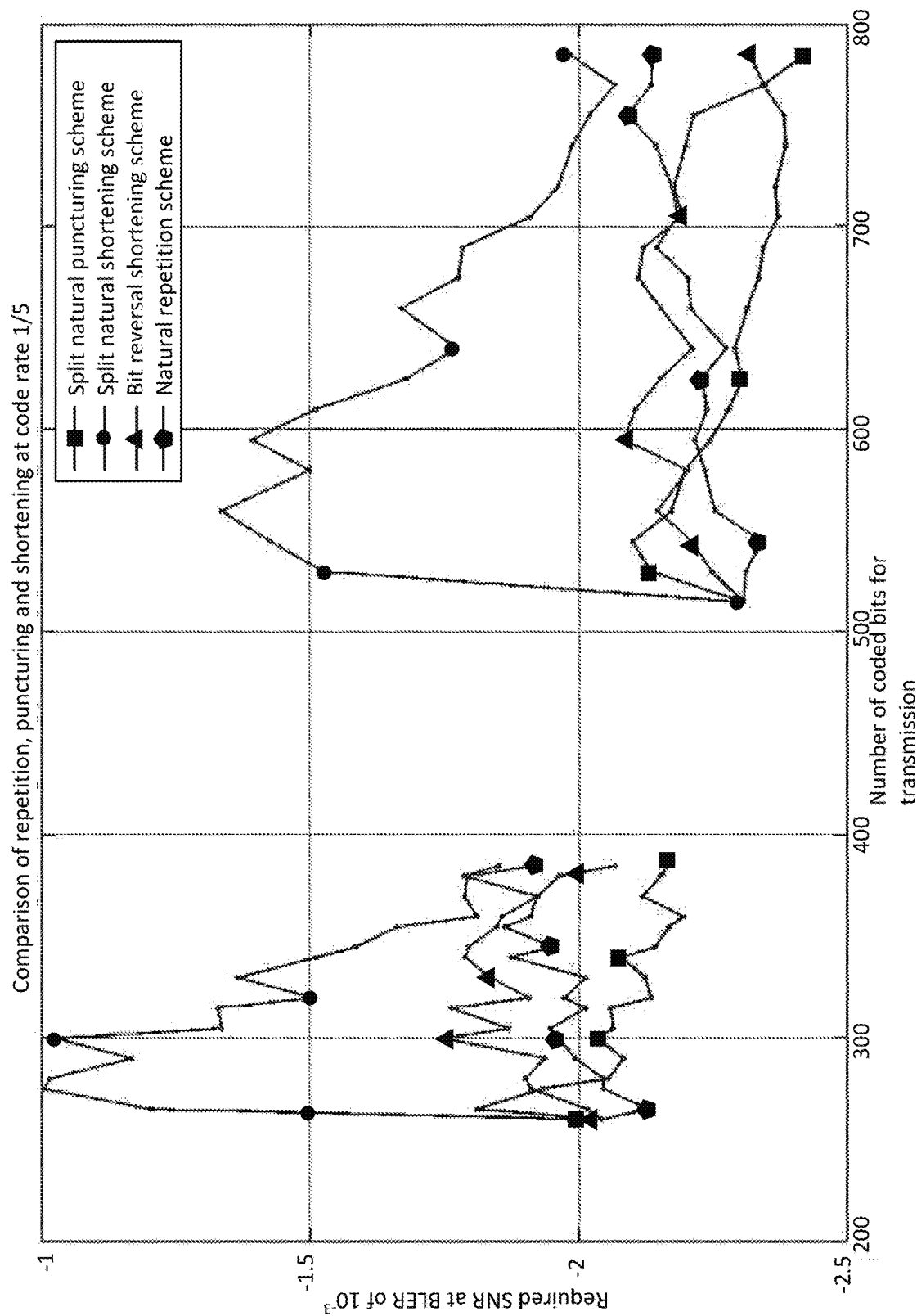
FIGS. 37-48 illustrate exemplary performance comparisons of various exemplary methods and schemes disclosed herein.
Figure 38:
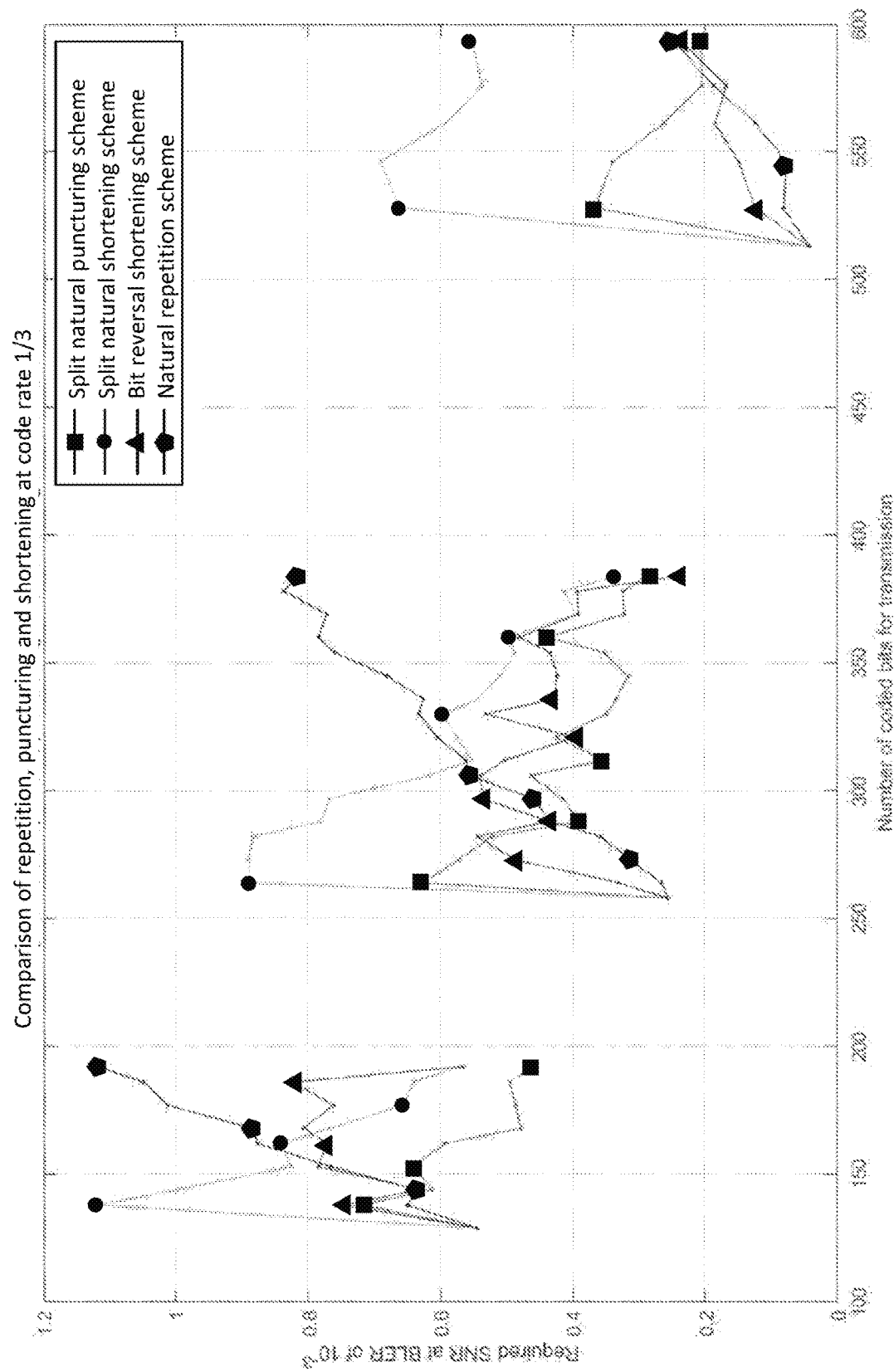
Figure 39:
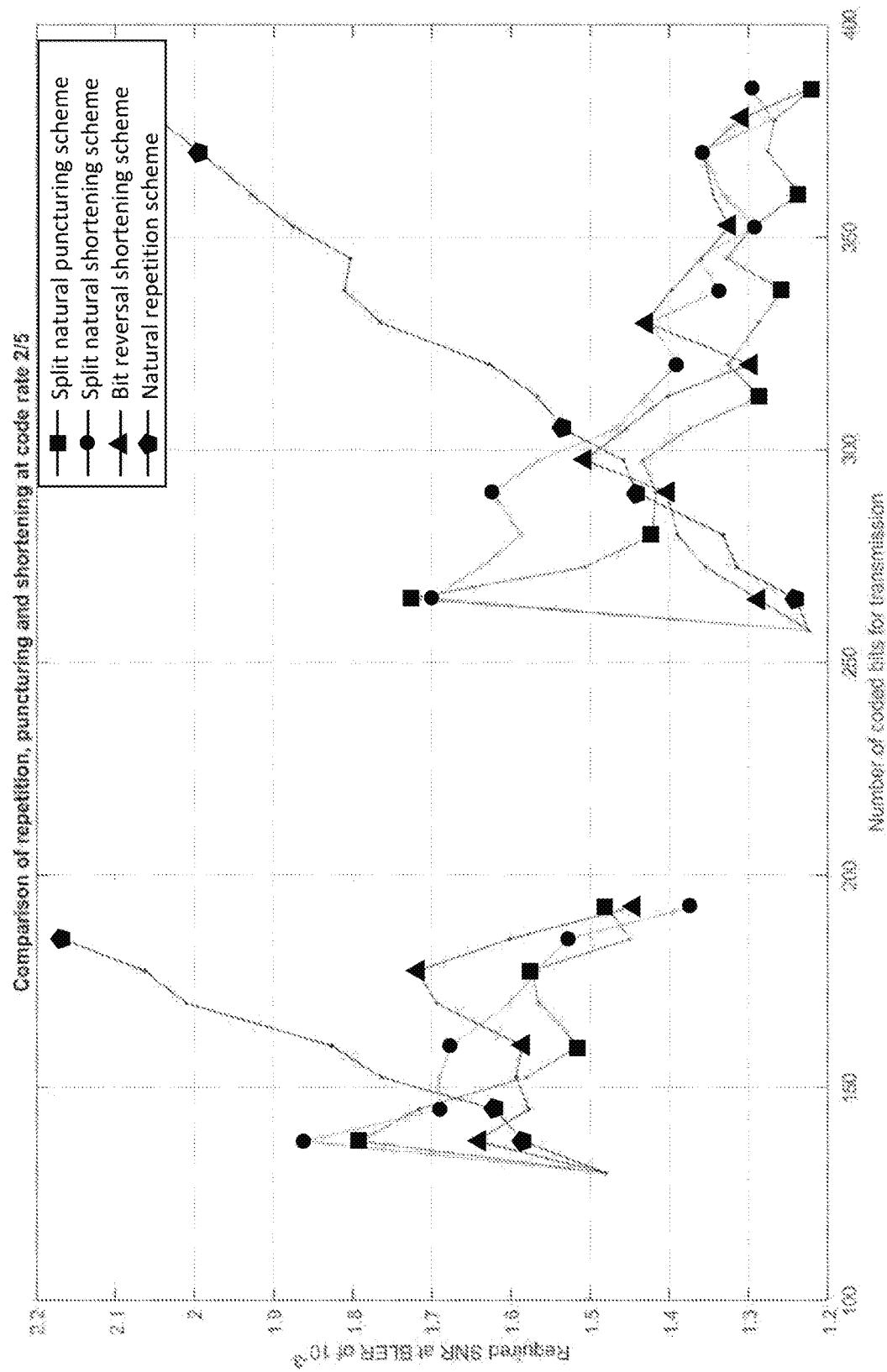
Figure 40:
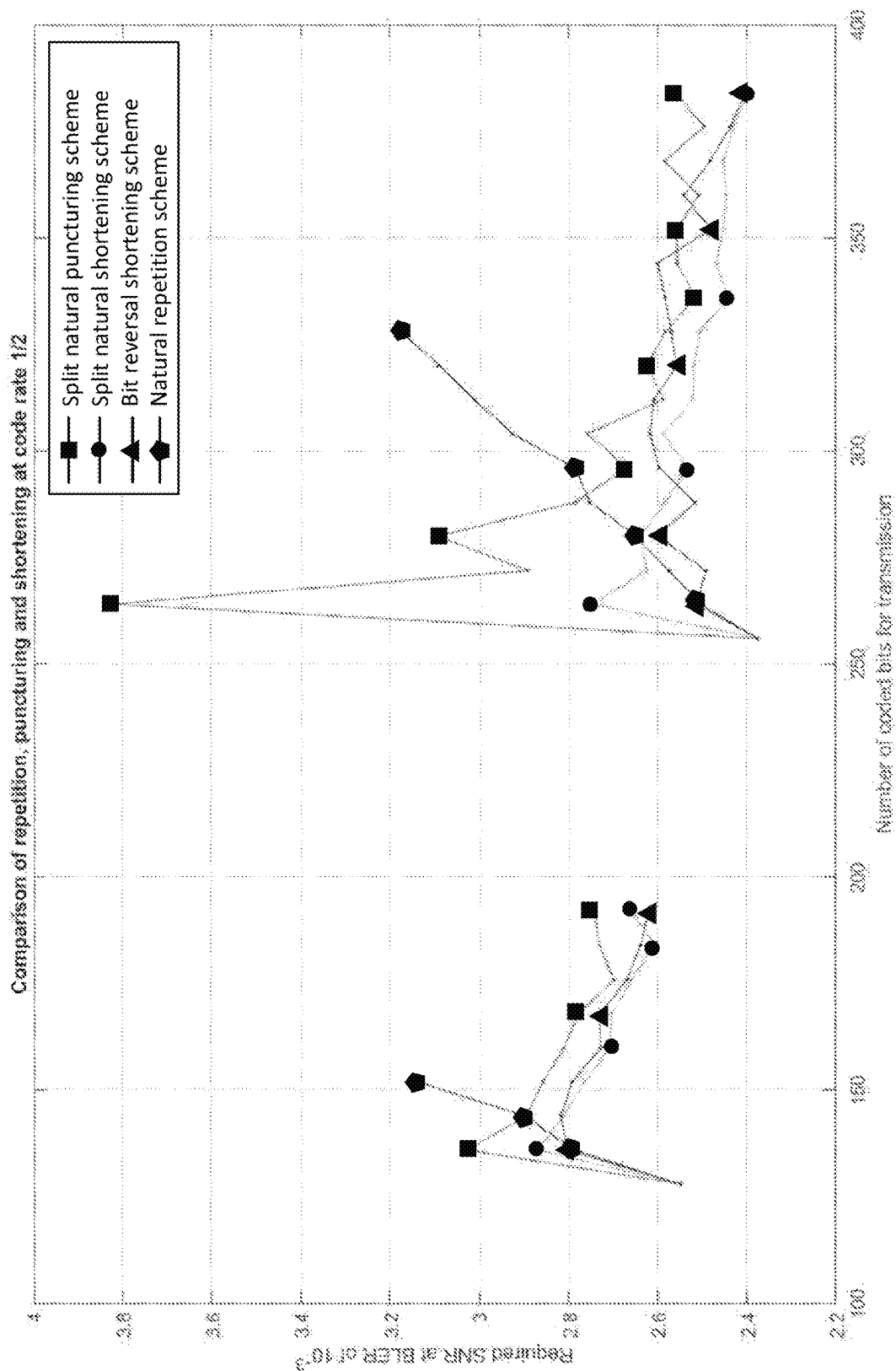

FIG. 36 illustrates exemplary performance gain that may result from use of a row-column interleaver after a rate matching block for 16 QAM modulation. Performance simulations of a split-natural puncturing example, a split-natural shortening example, a bit-reversal shortening example, and a natural repetition example may provide results as described herein. In such simulations, QPSK modulation and AWGN channel may be assumed. In such simulations, a polar code with PW sequence and a CA-SCL (L=8) decoding algorithm may be used. A 19-bit CRC may be appended to source data. Such CRC bits may be considered as part of the information bits.

Triangular channel interleaver may be used in an uplink (UL) transmission. Parallel rectangular interleaver may be used in a downlink (DL) transmission. A triangular channel interleaver may be provided.

In an example, let $u_1, \ldots, u_M$ be the M output bits of the rate matcher that may be transmitted. A minimum integer P may be determined such that $$\frac{P(P+1)}{2} \geq M.$$

Assuming $$Q = \frac{P(P+1)}{2},$$

and $y_1, \ldots, y_Q$ be $y_i=u_i$, $1 \leq i \leq M$, and $y_i=$NULL, $M+1 \leq i \leq Q$, a bit sequence $y_1, \ldots, y_Q$ may be written to isosceles right triangle row-by-row starting from the left upper corner of the array, as illustrated in FIG. 49. The output of the triangular interleaver may be a bit sequence read out column by column starting from the first column, e.g., $y_1, y_{P+1}, y_{2P}, \ldots$. In the process, the NULL bits may be skipped.

Various variations of the triangular interleaver may be provided. In an example, NULL bits may be inserted the beginning of the bit sequence from the rate matching block. A minimum integer P may be determined such that $$\frac{P(P+1)}{2} \geq M.$$

Assuming $$Q = \frac{P(P+1)}{2},$$

and $y_1, \ldots, y_Q$ be $y_i=$NULL, $1 \leq i \leq Q-M$, and $y_i=u_{i-(Q-M)}$, $Q-M+1 \leq i \leq Q$, the bit sequence $y_1, \ldots, y_Q$ may be written to isosceles right triangle row-by-row starting from the left upper corner of the array. Column-wise permutation may be applied, for example. The output of the triangular interleaver may be the bit sequence read out column by column starting from the first column, e.g., $y_1, y_{P+1}, y_{2P}, \ldots$. In the process, the NULL bits may be skipped. Inserting the NULL bits at the beginning of bit sequence $u_1, \ldots, u_M$ may be avoided in order the first output bit to be $u_1$.

In an example, the right bottom corner of the array may be applied, as illustrated in FIG. 50. The NULL bits may be inserted at the end of bit sequence $u_1, \ldots, u_M$. A minimum integer P may be determined such that $$\frac{P(P+1)}{2} \geq M.$$

Assuming $$Q = \frac{P(P+1)}{2},$$

and $y_1, \ldots, y_Q$ be $y_i=u_i$, $1 \leq i \leq M$, and determined such that Assuming let $y_i=$NULL, $M+1 \leq i \leq Q$, the bit sequence $y_1, \ldots, y_Q$ may be written to isosceles right triangle row-by-row starting from the right bottom corner of the array, as shown in in FIG. 50. Column-wise permutation may be applied, for example. The output of the triangular interleaver may be the bit sequence read out column by column starting from the first column, e.g., $y_{Q-P+1}, y_{Q-P+2}, y_{Q-2P+2}, \ldots$. In the process, the NULL bits may be skipped.

In an example, the right bottom corner of the array and the NULL bits may be inserted at the beginning of bit sequence $u_1, \ldots, u_M$. A minimum integer P may be determined such that $$\frac{P(P+1)}{2} \geq M.$$

Assuming $$Q = \frac{P(P+1)}{2},$$

and $y_1, \ldots, y_Q$ be $y_i=$NULL, $1 \leq i \leq Q-M$, and let $y_i=u_{i-(Q-M)}$, $Q-M+1 \leq i \leq Q$, the bit sequence $y_1, \ldots, y_Q$ may be written to isosceles right triangle row-by-row starting from the right bottom corner of the array, as shown in in FIG. 50. Column-wise permutation may be applied, for example. The output of the triangular interleaver may be the bit sequence read out column by column starting from the first column, e.g., $y_{Q-P+1}, y_{Q-P+2}, y_{Q-2P+2}, \ldots$. In the process, the NULL bits may be skipped. Column wise permutation may be applied, for example to further randomize the output of the triangular interleaver.

Parallel triangular interleaver may be applied as described herein. For example, M number of output bits from a rate matcher may be divided into B groups. Each group may or may not have the same number of bits. Dummy/NULL bit(s) may be added to make each group have the same number of bits. The number of groups may depend on modulation order. Different ways of partition of the M output bits of the rate matcher may be utilized. The triangular interleaver may be applied on the groups. The output of the triangular interleaver for each group may be combined, for example, via concatenation or interlacing operations. For example, let $v_{i,1}, \ldots, v_{i,Q}$ be the output bits from the i-th group.

Assuming that there are 4 groups, the final output of the channel interleaver may be given by $v_{1,1}, v_{2,1}, v_{3,1}, v_{4,1}, v_{1,2}, v_{2,2}, v_{3,2}, v_{4,2}, v_{1,3}, \ldots, v_{1,Q}, v_{2,Q}, v_{3,Q}, v_{4,Q}$, if the interlacing operation is applied. The example as illustrated in FIG. 30 may be applied to triangular interleaver.

Figure 51:
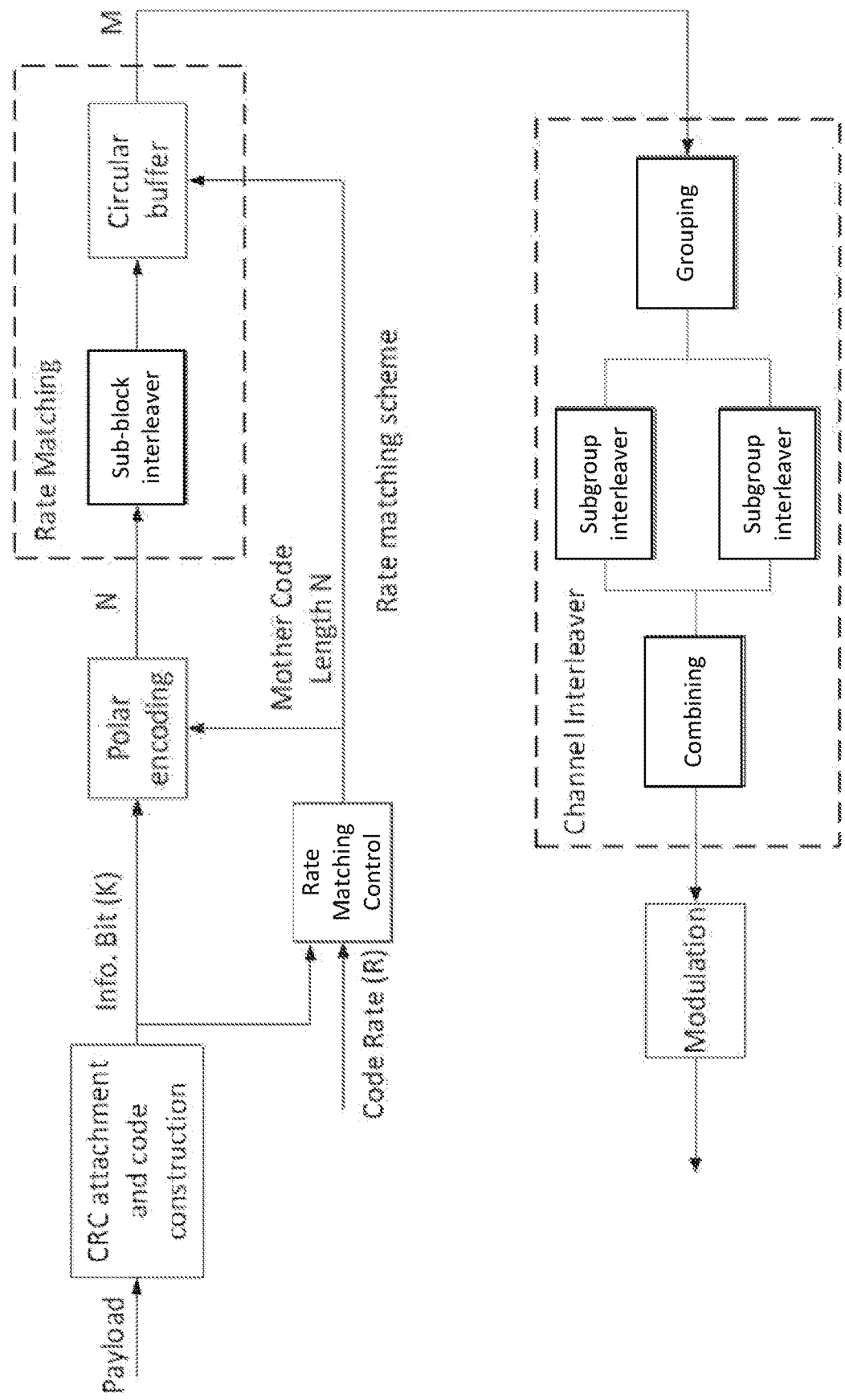
FIG. 51 illustrates an exemplary polar encoding system.

FIG. 51 illustrates an example of a polar encoding system. As illustrated in FIG. 51 an exemplary polar encoding system may include one or more of a CRC attachment and code construction block, a rate matching control block, a polar encoding block, a rate matching block, a channel interleaving block, or a modulation block. The channel interleaving block may be referred as a channel interleaver or a bit interleaver. In an example, the channel interleaving block may be part of the rate matching block. As illustrated in FIG. 51, polar encoded bits N coming out of the polar encoding block may be rate matched based on a rate matching scheme generated by the rate matching control block, as described herein. The rate matched bits M may be passed through the channel interleaving block for interleaving M bits, as described herein. The bits after the channel interleaving block may be sent to the modulation block to generate modulation symbols, as described herein.

Although features and elements of the present disclosure may be described in particular combinations, features or elements may be used alone without other features and elements of the description or in various combinations with or without other features and elements. Although the features described herein may consider New Radio (NR), 3G, 4G, 5G, LTE, LTE-A, and/or other examples, it is understood that the features described herein are not restricted to these technologies and may be applicable to other wireless systems as well.

The processes described above may be implemented in a computer program, software, and/or firmware incorporated in a computer-readable medium for execution by a computer and/or processor. Examples of computer-readable media include, but are not limited to, electronic signals (transmitted over wired and/or wireless connections) and/or computer-readable storage media. Examples of computer-readable storage media include, but are not limited to, a read only memory (ROM), a random-access memory (RAM), a register, cache memory, semiconductor memory devices, magnetic media such as, but not limited to, internal hard disks and removable disks, magneto-optical media, and/or optical media such as CD-ROM disks, and/or digital versatile disks (DVDs). A processor in association with software may be used to implement a radio frequency transceiver for use in a WTRU, terminal, base station, RNC, and/or any host computer.

What is claimed is:

1. A method implemented by a wireless transmit/receive unit (WTRU), the method comprising:
generating a first plurality of uplink control information (UCI) bits to be transmitted in a first codeword;
applying a first polar code to the first UCI bits, wherein a first mother code length associated with the first polar code is determined based on a first codeword length for transmission of the first UCI bits, and wherein the first mother code length is less than the first codeword length;
performing rate matching on the first polar coded UCI bits using a repetition scheme;
transmitting the first rate matched, polar coded UCI bits;
generating a second plurality of uplink control information (UCI) bits to be transmitted in a second codeword;
applying a second polar code to the second UCI bits, wherein a second mother code length associated with the second polar code is determined based on a second codeword length for transmission of the second UCI bits, and wherein the second mother code length is greater than the second codeword length;
performing rate matching on the second polar coded UCI bits using a puncturing scheme based on a code rate for the second codeword being less than a threshold;
transmitting the second rate matched, polar coded UCI bits;
generating a third plurality of uplink control information (UCI) bits to be transmitted in a third codeword;
applying a third polar code to the third UCI bits, wherein a third mother code length associated with the third polar code is determined based on a third codeword length for transmission of the third UCI bits, and wherein the third mother code length is greater than the third codeword length;
performing rate matching on the third polar coded UCI bits using a shortening scheme based on a code rate for the third codeword is greater than the threshold; and
transmitting the third rate matched, polar coded UCI bits.

2. The method of claim 1, wherein the second mother code length is determined based on the code rate for the second codeword and the third mother code length is determined based on the code rate for the third codeword.

3. The method of claim 1, wherein the first codeword comprises a first plurality of cyclic redundancy check (CRC) bits, the second codeword comprises a second plurality of CRC bits, and the third codeword comprises a third plurality of CRC bits.

4. The method of claim 1, wherein the code rate for the second codeword corresponds to a first number of UCI bits and a first number of cyclic redundancy check (CRC) bits in the second codeword divided by a first number of coded bits in the second codeword; and
wherein the code rate for the third codeword corresponds to a second number of UCI bits and a second number of CRC bits in the third codeword divided by a second number of coded bits in the third codeword.

5. The method of claim 1, wherein the first polar code comprises a first concatenated polar code, the second polar code comprises a second concatenated polar code, and the third polar code comprises a third concatenated polar code.

6. The method of claim 5, further comprising performing the rate matching on the first concatenated polar code, the second concatenated polar code, and the third concatenated polar code.

7. A wireless transmit/receive unit (WTRU), comprising a processor and a memory, the processor and the memory configured to:
generate a first plurality of uplink control information (UCI) bits to be transmitted in a first codeword;
apply a first polar code to the first UCI bits, wherein a first mother code length associated with the first polar code is determined based on a first codeword length for transmission of the first UCI bits, and wherein the first mother code length is less than the first codeword length;
perform rate matching on the first polar coded UCI bits using a repetition scheme;
transmit the first rate matched, polar coded UCI bits;
generate a second plurality of uplink control information (UCI) bits to be transmitted in a second codeword;
apply a second polar code to the second UCI bits, wherein a second mother code length associated with the second polar code is determined based on a second codeword length for transmission of the second UCI bits, and wherein the second mother code length is greater than the second codeword length;

perform rate matching on the second polar coded UCI bits using a puncturing scheme based on a code rate for the second codeword being less than a threshold;

transmit the second rate matched, polar coded UCI bits;

generate a third plurality of uplink control information (UCI) bits to be transmitted in a third codeword;

apply a third polar code to the third UCI bits, wherein a third mother code length associated with the third polar code is determined based on a third codeword length for transmission of the third UCI bits, and wherein the third mother code length is greater than the third codeword length;

perform rate matching on the third polar coded UCI bits using a shortening scheme based on a code rate for the third codeword is greater than the threshold; and transmit the third rate matched, polar coded UCI bits.

8. The WTRU of claim 7, wherein the second mother code length is determined based on the code rate for the second codeword and the third mother code length is determined based on the code rate for the third codeword.

9. The WTRU of claim 7, wherein the first codeword comprises a first plurality of cyclic redundancy check (CRC) bits, the second codeword comprises a second plurality of CRC bits, and the third codeword comprises a third plurality of CRC bits.

10. The WTRU of claim 7, wherein the code rate for the second codeword corresponds to a first number of UCI bits and a first number of cyclic redundancy check (CRC) bits in the second codeword divided by a first number of coded bits in the second codeword; and wherein the code rate for the third codeword corresponds to a second number of UCI bits and a second number of CRC bits in the third codeword divided by a second number of coded bits in the third codeword.

11. The WTRU of claim 7, wherein the first polar code comprises a first concatenated polar code, the second polar code comprises a second concatenated polar code, and the third polar code comprises a third concatenated polar code.

12. The WTRU of claim 11, wherein the processor and the memory are further configured to:

perform the rate matching on the first concatenated polar code, the second concatenated polar code, and the third concatenated polar code.

13. At least one computer-readable medium having stored thereon instructions that, when executed by a processor, are configured to cause the processor to:

generate a first plurality of uplink control information (UCI) bits to be transmitted in a first codeword;

apply a first polar code to the first UCI bits, wherein a first mother code length associated with the first polar code is determined based on a first codeword length for transmission of the first UCI bits, and wherein the first mother code length is less than the first codeword length;

perform rate matching on the first polar coded UCI bits using a repetition scheme;

transmit the first rate matched, polar coded UCI bits;

generate a second plurality of uplink control information (UCI) bits to be transmitted in a second codeword;

apply a second polar code to the second UCI bits, wherein a second mother code length associated with the second polar code is determined based on a second codeword length for transmission of the second UCI bits, and wherein the second mother code length is greater than the second codeword length;

perform rate matching on the second polar coded UCI bits using a puncturing scheme based on a code rate for the second codeword being less than a threshold;

transmit the second rate matched, polar coded UCI bits;

generate a third plurality of uplink control information (UCI) bits to be transmitted in a third codeword;

apply a third polar code to the third UCI bits, wherein a third mother code length associated with the third polar code is determined based on a third codeword length for transmission of the third UCI bits, and wherein the third mother code length is greater than the third codeword length;

perform rate matching on the third polar coded UCI bits using a shortening scheme based on a code rate for the third codeword is greater than the threshold; and transmit the third rate matched, polar coded UCI bits.

14. The at least one computer-readable medium of claim 13, wherein the instructions, when executed, are further configured to cause the processor to:

determine the second mother code length based on the code rate for the second codeword; and determine the third mother code length based on the code rate for the third codeword.

15. The at least one computer-readable medium of claim 13, wherein the instructions, when executed, are further configured to cause the processor to:

apply a first polar code to the first UCI bits, wherein the first mother code length associated with the first polar code is determined based on a first codeword length, wherein the first codeword comprises a first plurality of cyclic redundancy check (CRC) bits;

apply a second polar code to the second UCI bits, wherein the second mother code length associated with the second polar code is determined based on the second codeword length, wherein the second codeword comprises a second plurality of CRC bits; and apply a third polar code to the third UCI bits, wherein the third mother code length associated with the third polar code is determined based on the third codeword length, wherein the third codeword comprises a third plurality of CRC bits.

16. The at least one computer-readable medium of claim 13, wherein the instructions, when executed, are further configured to cause the processor to:

perform rate matching on the second polar coded UCI bits, wherein the code rate for the second codeword corresponds to a first number of UCI bits and a first number of cyclic redundancy check (CRC) bits in the second codeword divided by a first number of coded bits in the second codeword; and perform rate matching on the third polar coded UCI bits, wherein the code rate for the third codeword corresponds to a second number of UCI bits and a second number of CRC bits in the third codeword divided by a second number of coded bits in the third codeword.

17. The at least one computer-readable medium of claim 13, wherein the instructions, when executed, are further configured to cause the processor to:

apply a first polar code to the first UCI bits, wherein the first polar code comprises a first concatenated polar code apply a second polar code to the second UCI bits, wherein the second polar code comprises a second concatenated polar code; and apply a third polar code to the third UCI bits, wherein the third polar code comprises a third concatenated polar code.

18. The at least one computer-readable medium of claim 17, wherein the instructions, when executed, are further configured to cause the processor to:
  perform the rate matching on the first concatenated polar code, the second concatenated polar code, and the third concatenated polar code.

* * * * *